US012717431B2

(12) United States Patent
Yoshizumi et al.

(10) Patent No.: US 12,717,431 B2
(45) Date of Patent: Aug. 25, 2026

(54) DISPLAY DEVICE HAVING TRANSISTORS AND LIGHT-EMITTING ELEMENT

(71) Applicant: Semiconductor Energy Laboratory Co., Ltd., Kanagawa-ken (JP)

(72) Inventors: Kensuke Yoshizumi, Isehara (JP); Yoshiaki Oikawa, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 444 days.

(21) Appl. No.: 18/217,798

(22) Filed: Jul. 3, 2023

(65) Prior Publication Data

US 2023/0359151 A1 Nov. 9, 2023

Related U.S. Application Data

(63) Continuation of application No. 16/800,210, filed on Feb. 25, 2020, now abandoned, which is a
(Continued)

(30) Foreign Application Priority Data

Jul. 8, 2016 (JP) ................................ 2016-135870

(51) Int. Cl.
*H10K 59/50* (2023.01)
*G06F 3/041* (2006.01)
(Continued)

(52) U.S. Cl.
CPC ............ *G06F 3/041* (2013.01); *G02F 1/1333* (2013.01); *G02F 1/133305* (2013.01);
(Continued)

(58) Field of Classification Search
CPC .. H10D 86/471; H10D 30/6734; H10D 86/40; H10K 59/1213; H10K 59/123; H10K 59/124
See application file for complete search history.

(56) References Cited

U.S. PATENT DOCUMENTS 6,714,268 B2 3/2004 Wang et al.
7,038,641 B2 5/2006 Hirota et al.
(Continued)

FOREIGN PATENT DOCUMENTS

CN 001949530 A 4/2007
CN 101673020 A 3/2010
(Continued)

OTHER PUBLICATIONS

Shieh.H, "Transflective display by Hybrid OLED and LCD", LEOS 2005 (IEEE Lasers and Electro-Optics Society Annual Meeting), Oct. 22, 2005, pp. 650-651, IEEE.
(Continued)

*Primary Examiner* — Davienne N Monbleau
*Assistant Examiner* — Emily Farmer
(74) *Attorney, Agent, or Firm* — Husch Blackwell LLP

(57) ABSTRACT

A convenient electronic device is provided. An electronic device from which a user can easily read the displayed data is provided. The user can read data with a small motion. A housing of the electronic device includes a first portion positioned on a front surface of the housing, a second portion positioned on a side surface of the housing, a first band attachment portion, and a second band attachment portion. The second portion is configured to display an image. The first band attachment portion is positioned on the side surface on the top side when seen from the front surface side of the housing. The second portion and the second band attachment portion are positioned on the side surface on the bottom side when seen from the front surface side of the housing. The first portion is configured to display an image or includes at least one of an hour hand, a minute hand, and a second hand.

14 Claims, 24 Drawing Sheets

Related U.S. Application Data continuation of application No. 15/642,573, filed on Jul. 6, 2017, now abandoned.

(51) Int. Cl.

| | |
|---|---|
| ***H10K 59/121*** | (2023.01) |
| ***H10K 59/128*** | (2023.01) |
| ***H10K 59/35*** | (2023.01) |
| *G02F 1/1333* | (2006.01) |
| *G04B 47/00* | (2006.01) |

(52) U.S. Cl.

CPC ....... *H10K 59/1213* (2023.02); *H10K 59/128* (2023.02); *H10K 59/351* (2023.02); *H10K 59/50* (2023.02)

(56) References Cited

U.S. PATENT DOCUMENTS

| | | | | |
|---|---|---|---|---|
| 7,084,936 | B2 | 8/2006 | Kato | |
| 7,102,704 | B2 | 9/2006 | Mitsui et al. | |
| 7,176,991 | B2 | 2/2007 | Mitsui et al. | |
| 7,239,361 | B2 | 7/2007 | Kato | |
| 7,248,235 | B2 | 7/2007 | Fujii et al. | |
| 7,385,654 | B2 | 6/2008 | Mitsui et al. | |
| 7,825,406 | B2 | 11/2010 | Yoshida et al. | |
| 8,455,876 | B2 | 6/2013 | Choi et al. | |
| 8,492,764 | B2 | 7/2013 | Yamazaki et al. | |
| 8,502,220 | B2 | 8/2013 | Yamazaki et al. | |
| 8,575,620 | B2 | 11/2013 | Yamasaki et al. | |
| 8,576,209 | B2 | 11/2013 | Miyaguchi | |
| 8,654,272 | B2 | 2/2014 | Yamazaki et al. | |
| 8,723,824 | B2 | 5/2014 | Myers et al. | |
| 8,736,162 | B2 | 5/2014 | Jin et al. | |
| 8,885,115 | B2 | 11/2014 | Yamazaki et al. | |
| 8,976,141 | B2 | 3/2015 | Myers et al. | |
| 8,994,827 | B2 | 3/2015 | Mistry et al. | |
| 9,030,446 | B2 | 5/2015 | Mistry et al. | |
| 9,088,006 | B2 | 7/2015 | Yamazaki et al. | |
| 9,111,841 | B2 | 8/2015 | Yamazaki et al. | |
| 9,153,602 | B2 | 10/2015 | Yamazaki et al. | |
| 9,171,960 | B2 | 10/2015 | Hong et al. | |
| D763,288 | S | 8/2016 | Mistry et al. | |
| D763,289 | S | 8/2016 | Mistry et al. | |
| 9,411,451 | B2 | 8/2016 | Myers et al. | |
| 9,443,880 | B2 | 9/2016 | Saito et al. | |
| 9,448,592 | B2 | 9/2016 | Jin et al. | |
| 9,466,756 | B2 | 10/2016 | Yamazaki et al. | |
| 9,472,682 | B2 | 10/2016 | Yamazaki et al. | |
| 9,477,313 | B2 | 10/2016 | Mistry et al. | |
| 9,543,370 | B2 | 1/2017 | Tsai et al. | |
| 9,543,533 | B2 | 1/2017 | Yamazaki et al. | |
| 9,583,509 | B2 | 2/2017 | Yamazaki et al. | |
| 9,594,402 | B2 | 3/2017 | Hiroki et al. | |
| 9,608,122 | B2 | 3/2017 | Yamazaki | |
| 9,627,648 | B2 | 4/2017 | Yamazaki et al. | |
| 9,698,172 | B2 | 7/2017 | Zhang et al. | |
| 9,704,887 | B2 | 7/2017 | Zhang et al. | |
| 9,713,271 | B2 | 7/2017 | Hiroki et al. | |
| 9,728,560 | B2 | 8/2017 | Zhang et al. | |
| 9,786,691 | B2 | 10/2017 | Zhang et al. | |
| 9,786,695 | B2 | 10/2017 | Zhang et al. | |
| 9,791,949 | B2 | 10/2017 | Myers et al. | |
| 9,814,284 | B2 | 11/2017 | Tamaki et al. | |
| 9,837,442 | B2 | 12/2017 | Yamazaki et al. | |
| 10,032,841 | B2 | 7/2018 | Tsai et al. | |
| 10,054,988 | B2 | 8/2018 | Jin et al. | |
| 10,055,039 | B2 | 8/2018 | Myers et al. | |
| 10,073,571 | B2 | 9/2018 | Watanabe et al. | |
| 10,096,669 | B2 | 10/2018 | Yamazaki et al. | |
| 10,185,416 | B2 | 1/2019 | Mistry et al. | |
| 10,194,060 | B2 | 1/2019 | Mistry et al. | |
| 10,210,785 | B2 | 2/2019 | Sagardoyburu | |
| 10,243,005 | B2 | 3/2019 | Yamazaki et al. | |
| 10,263,063 | B2 | 4/2019 | Yamazaki et al. | |
| 10,278,458 | B2 | 5/2019 | Tamaki et al. | |
| 10,318,029 | B2 | 6/2019 | Myers et al. | |
| 10,423,214 | B2 | 9/2019 | Mistry et al. | |
| 10,521,034 | B2 | 12/2019 | Myers et al. | |
| 10,528,084 | B2 | 1/2020 | Jin et al. | |
| 10,551,928 | B2 | 2/2020 | Mistry et al. | |
| 10,680,020 | B2 | 6/2020 | Yamazaki et al. | |
| 10,680,055 | B2 | 6/2020 | Yamazaki et al. | |
| 10,811,521 | B2 | 10/2020 | Yamazaki et al. | |
| 10,936,136 | B2 | 3/2021 | Myers et al. | |
| 10,983,564 | B2 | 4/2021 | Jin et al. | |
| 11,157,436 | B2 | 10/2021 | Mistry et al. | |
| 11,237,685 | B2 | 2/2022 | Myers et al. | |
| 11,237,719 | B2 | 2/2022 | Mistry et al. | |
| 11,240,408 | B2 | 2/2022 | Mistry et al. | |
| 11,271,070 | B2 | 3/2022 | Yamazaki et al. | |
| 11,296,132 | B2 | 4/2022 | Yamazaki et al. | |
| 11,372,536 | B2 | 6/2022 | Mistry et al. | |
| 11,393,918 | B2 | 7/2022 | Yamazaki et al. | |
| 11,507,239 | B2 | 11/2022 | Myers et al. | |
| 11,662,869 | B2 | 5/2023 | Myers et al. | |
| 11,678,538 | B2 | 6/2023 | Yamazaki et al. | |
| 11,791,350 | B2 | 10/2023 | Yamazaki et al. | |
| 11,822,389 | B2 | 11/2023 | Jin et al. | |
| 11,928,301 | B2 | 3/2024 | Myers et al. | |
| 12,067,228 | B2 | 8/2024 | Mistry et al. | |
| 12,443,338 | B2 | 10/2025 | Mistry. et al. | |
| 2003/0201960 | A1 | 10/2003 | Fujieda | |
| 2006/0072047 | A1 | 4/2006 | Sekiguchi | |
| 2008/0180618 | A1 | 7/2008 | Fujieda | |
| 2010/0061195 | A1 | 3/2010 | Kanbayashi | |
| 2010/0171905 | A1 | 7/2010 | Huang et al. | |
| 2010/0182223 | A1 | 7/2010 | Choi et al. | |
| 2011/0012105 | A1* | 1/2011 | Yamazaki | H10D 86/471 257/E29.296 |
| 2011/0084267 | A1* | 4/2011 | Yamazaki | H10D 86/423 257/43 |
| 2012/0032171 | A1 | 2/2012 | Saito et al. | |
| 2012/0228607 | A1* | 9/2012 | Miyairi | H10D 30/6704 257/43 |
| 2013/0002133 | A1 | 1/2013 | Jin et al. | |
| 2013/0038818 | A1 | 2/2013 | Toda et al. | |
| 2013/0076612 | A1 | 3/2013 | Myers | |
| 2013/0076649 | A1 | 3/2013 | Myers et al. | |
| 2013/0224562 | A1 | 8/2013 | Momo | |
| 2014/0139422 | A1 | 5/2014 | Mistry et al. | |
| 2014/0143737 | A1 | 5/2014 | Mistry et al. | |
| 2014/0143784 | A1 | 5/2014 | Mistry et al. | |
| 2014/0254111 | A1 | 9/2014 | Yamazaki et al. | |
| 2014/0267091 | A1 | 9/2014 | Kim | |
| 2014/0306260 | A1 | 10/2014 | Yamazaki et al. | |
| 2014/0320435 | A1 | 10/2014 | Modarres et al. | |
| 2015/0077438 | A1 | 3/2015 | Tamaki et al. | |
| 2015/0103023 | A1 | 4/2015 | Iwaki | |
| 2015/0243724 | A1 | 8/2015 | Cho et al. | |
| 2015/0332031 | A1 | 11/2015 | Mistry et al. | |
| 2015/0378662 | A1 | 12/2015 | Wan et al. | |
| 2016/0026155 | A1 | 1/2016 | Guo et al. | |
| 2016/0064421 | A1 | 3/2016 | Oh et al. | |
| 2016/0073519 | A1 | 3/2016 | Hiroki | |
| 2016/0087022 | A1 | 3/2016 | Tsai et al. | |
| 2016/0109852 | A1 | 4/2016 | Kuwabara et al. | |
| 2016/0116941 | A1 | 4/2016 | Kuwabara et al. | |
| 2016/0157372 | A1 | 6/2016 | Hiroki | |
| 2016/0231974 | A1 | 8/2016 | Lee | |
| 2016/0269515 | A1 | 9/2016 | Yamazaki et al. | |
| 2016/0328023 | A1 | 11/2016 | Mistry et al. | |
| 2017/0082982 | A1 | 3/2017 | Cho et al. | |
| 2017/0125452 | A1 | 5/2017 | Ide et al. | |
| 2017/0177025 | A1 | 6/2017 | Hiroki et al. | |
| 2017/0279081 | A1 | 9/2017 | Yamazaki et al. | |
| 2018/0011447 | A1 | 1/2018 | Yoshizumi et al. | |
| 2018/0329367 | A1 | 11/2018 | Kuwabara et al. | |
| 2019/0166285 | A1 | 5/2019 | Mistry et al. | |
| 2019/0216184 | A1 | 7/2019 | Tamaki et al. | |
| 2020/0292998 | A1 | 9/2020 | Yoshizumi et al. | |
| 2021/0020868 | A1 | 1/2021 | Ikeda et al. | |

(56) References Cited

U.S. PATENT DOCUMENTS

| | | | |
|---|---|---|---|
| 2023/0276669 | A1 | 8/2023 | Yamazaki et al. |
| 2024/0168594 | A1 | 5/2024 | Myers et al. |
| 2026/0003495 | A1 | 1/2026 | Mistry et al. |

FOREIGN PATENT DOCUMENTS

| | | | |
|---|---|---|---|
| CN | 101996989 | A | 3/2011 |
| CN | 102929037 | A | 2/2013 |
| CN | 104332485 | A | 2/2015 |
| CN | 104538401 | A | 4/2015 |
| CN | 104570480 | A | 4/2015 |
| CN | 104617103 | A | 5/2015 |
| CN | 104919393 | A | 9/2015 |
| CN | 104934447 | A | 9/2015 |
| CN | 105474290 | A | 4/2016 |
| EP | 2163945 | A | 3/2010 |
| EP | 2284891 | A | 2/2011 |
| EP | 2571058 | A | 3/2013 |
| EP | 2733578 | A | 5/2014 |
| EP | 2733579 | A | 5/2014 |
| EP | 2733580 | A | 5/2014 |
| EP | 2733581 | A | 5/2014 |
| EP | 2733597 | A | 5/2014 |
| EP | 2733598 | A | 5/2014 |
| EP | 2733608 | A | 5/2014 |
| EP | 2733609 | A | 5/2014 |
| EP | 3101529 | A | 12/2016 |
| EP | 3 125 508 | A1 | 2/2017 |
| EP | 3125508 | A | 2/2017 |
| EP | 3531283 | A | 8/2019 |
| EP | 3 860 099 | A1 | 8/2021 |
| EP | 3860099 | A | 8/2021 |
| EP | 4 191 375 | A1 | 6/2023 |
| EP | 4 191 376 | A1 | 6/2023 |
| EP | 4191375 | A | 6/2023 |
| EP | 4191376 | A | 6/2023 |
| JP | 63-023688 | A | 2/1988 |
| JP | 2001-066593 | A | 3/2001 |
| JP | 2001-349968 | A | 12/2001 |
| JP | 2002-196702 | A | 7/2002 |
| JP | 2002-328630 | A | 11/2002 |
| JP | 2003-076302 | A | 3/2003 |
| JP | 2003-157026 | A | 5/2003 |
| JP | 2003-157029 | A | 5/2003 |
| JP | 2003-316295 | A | 11/2003 |
| JP | 2003-322850 | A | 11/2003 |
| JP | 2004-296162 | A | 10/2004 |
| JP | 2006-066491 | A | 3/2006 |
| JP | 2007-232882 | A | 9/2007 |
| JP | 2008-090154 | A | 4/2008 |
| JP | 4161574 | | 10/2008 |
| JP | 2009-540623 | | 11/2009 |
| JP | 2011-048339 | A | 3/2011 |
| JP | 2012-256817 | A | 12/2012 |
| JP | 2013-015835 | A | 1/2013 |
| JP | 2013-221965 | A | 10/2013 |
| JP | 2014-030000 | A | 2/2014 |
| JP | 2014-197522 | A | 10/2014 |
| JP | 2014-209601 | A | 11/2014 |
| JP | 2014-535086 | | 12/2014 |
| JP | 2016-511936 | | 4/2016 |
| JP | 2016-081052 | A | 5/2016 |
| JP | 2016-081059 | A | 5/2016 |
| JP | 5940707 | | 6/2016 |
| JP | 2023-025073 | A | 2/2023 |
| KR | 2014-0064687 | A | 5/2014 |
| KR | 2015-0126297 | A | 11/2015 |
| KR | 2021-0007988 | A | 1/2021 |
| KR | 2021-0154941 | A | 12/2021 |
| TW | 201514769 | | 4/2015 |
| WO | WO-2004/053819 | | 6/2004 |
| WO | WO-2008/145999 | | 12/2008 |
| WO | WO-2011/142147 | | 11/2011 |
| WO | WO-2013/048881 | | 4/2013 |
| WO | WO 2013/048881 | A1 | 4/2013 |
| WO | WO-2014/081175 | | 5/2014 |
| WO | WO-2014/081176 | | 5/2014 |
| WO | WO-2014/081179 | | 5/2014 |
| WO | WO-2014/081180 | | 5/2014 |
| WO | WO-2014/081181 | | 5/2014 |
| WO | WO-2014/081184 | | 5/2014 |
| WO | WO-2014/081185 | | 5/2014 |
| WO | WO-2014/081191 | | 5/2014 |
| WO | WO 2014/116500 | A1 | 7/2014 |
| WO | WO-2014/136856 | | 9/2014 |
| WO | WO-2015/194417 | | 12/2015 |
| WO | WO 2016/048385 | A1 | 3/2016 |
| WO | WO-2016/059514 | | 4/2016 |

OTHER PUBLICATIONS

Lee.J et al., “High ambient-contrast-ratio display using tandem reflective liquid crystal display and organic light-emitting device”, Optics Express, Nov. 14, 2005, vol. 13, No. 23, pp. 9431-9438.

Kusunoki.K et al., “Transmissive OLED and Reflective LC Hybrid (TR-Hybrid) Display”, SID Digest ’16 : SID International Symposium Digest of Technical Papers, May 22, 2016, vol. 47, pp. 57-60.

Sakuishi.T et al., “Transmissive OLED and Reflective LC Hybrid (TR-Hybrid) Display with High Visibility and Low Power Consumption”, SID Digest ’16 : SID International Symposium Digest of Technical Papers, May 22, 2016, vol. 47, pp. 735-738.

Ohide.T et al., “Application of Transfer Technology to Manufacturing of Transmissive OLED and Reflective LC Hybrid (TR-Hybrid) Display”, SID Digest ’16 : SID International Symposium Digest of Technical Papers, May 22, 2016, vol. 47, pp. 1002-1004.

Chinese Office Action (Application No. 201710565509.4) dated Jul. 29, 2020.

Chinese Office Action (Application No. 201710565509.4) dated Nov. 30, 2021.

* cited by examiner 41
11
52
51
54
53
21
42
12
3
6
9
A2
56
55
57
A1
07/07/2016
21:32

22
From : Taro Yamada
42
32

FIG. 6A1
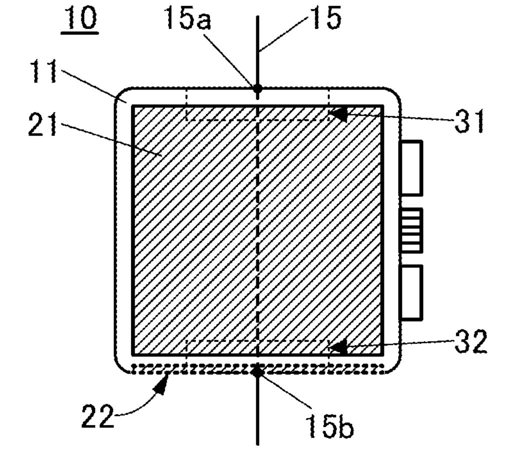
FIG. 6A2
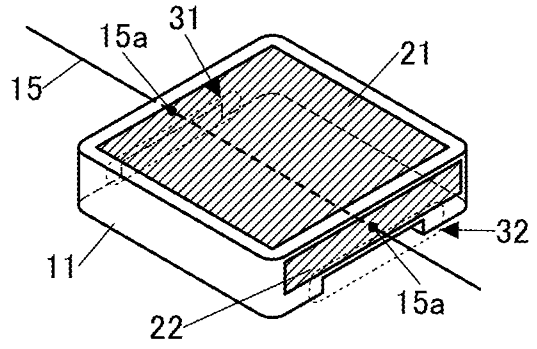
FIG. 6B
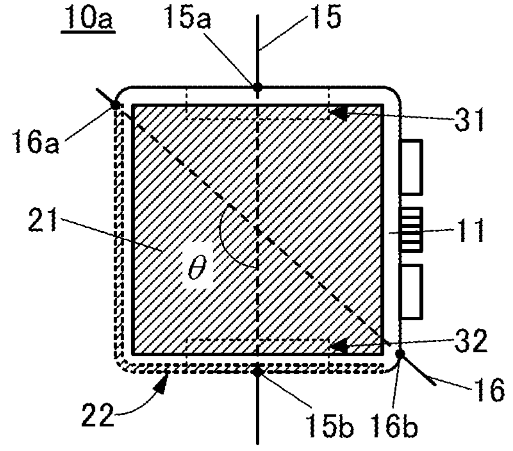
FIG. 6C
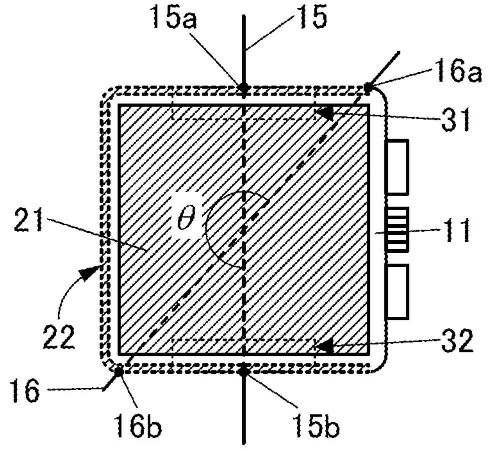
FIG. 6D
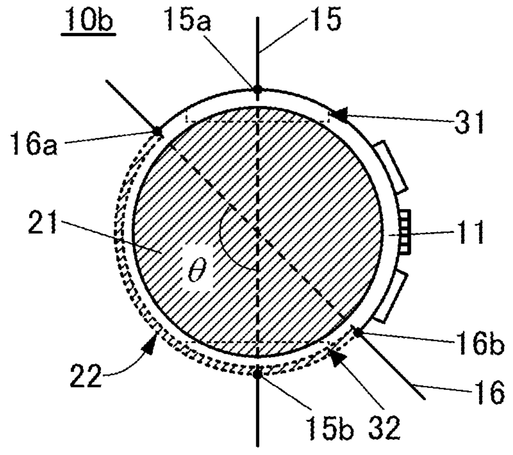
FIG. 6E
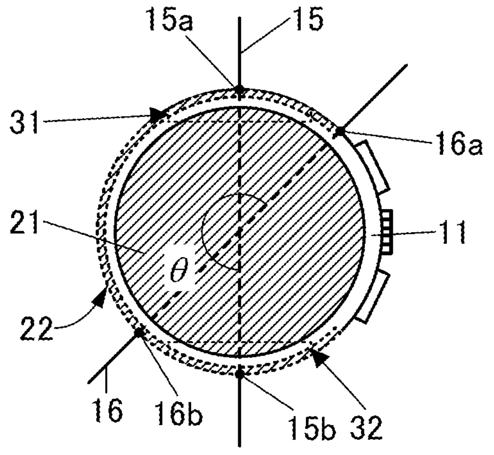

DISPLAY DEVICE HAVING TRANSISTORS AND LIGHT-EMITTING ELEMENT

This application is a continuation of copending U.S. application Ser. No. 16/800,210, filed on Feb. 25, 2020 which is a continuation of U.S. application Ser. No. 15/642,573, filed on Jul. 6, 2017 (now abandoned), which are all incorporated herein by reference.

BACKGROUND OF THE INVENTION

1. Field of the Invention

One embodiment of the present invention relates to an electronic device including a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

2. Description of the Related Art

Portable information terminals typified by smartphones and tablet terminals have been actively developed. These portable information terminals are required to be lightweight and small, for example.

In particular, development of a wearable electronic device (also referred to as a wearable device) has been actively carried out recently. Examples of the wearable device include a watch-type device worn on an arm, a glasses-like device worn on a head, and a necklace-type device worn on a neck. For example, a watch-type device includes a small-sized display instead of a conventional watch dial to provide the user with various information in addition to the time. Such wearable devices have attracted attention to the medical use, the use for self-health management, or the like and have been increasingly put into practical use.

Examples of the display device include, typically, a light-emitting device including a light-emitting element such as an organic electroluminescent (EL) element or a light-emitting diode (LED), a liquid crystal display device, and an electronic paper performing display by an electrophoretic method or the like.

Patent Document 1 discloses a flexible light-emitting device including an organic EL element.

REFERENCE

Patent Document

[Patent Document 1] Japanese Published Patent Application No. 2014-197522

SUMMARY OF THE INVENTION

An object of one embodiment of the present invention is to provide a convenient electronic device. Another object of one embodiment of the present invention is to provide an electronic device from which a user can easily read the displayed data. Another object of one embodiment of the present invention is to enable the user to read data with a small motion.

Another object of one embodiment of the present invention is to provide an electronic device having high visibility regardless of the brightness of external light. Another object of one embodiment of the present invention is to provide an electronic device with low power consumption. Another object of one embodiment of the present invention is to provide an electronic device which can display both a smooth moving image and an eye-friendly still image. Another object of one embodiment of the present invention is to provide a novel electronic device.

One embodiment of the present invention is an electronic device including a housing. The housing includes a first portion, a second portion, a first band attachment portion, and a second band attachment portion. The first portion is positioned on a front surface of the housing. The second portion is configured to display an image. The second portion, the first band attachment portion, and the second band attachment portion are positioned on a side surface of the housing. The first band attachment portion is positioned on the side surface on the top side when seen from the front surface side of the housing, and the second portion and the second band attachment portion are positioned on the side surface on the bottom side when seen from the front surface side of the housing.

Another embodiment of the present invention is an electronic device including a housing. The housing includes a first portion, a second portion, a first band attachment portion; and a second band attachment portion. The first portion is positioned on a front surface of the housing. The second portion is configured to display an image. The second portion, the first band attachment portion, and the second band attachment portion are positioned on a side surface of the housing. The first band attachment portion and the second band attachment portion are positioned to face each other on a first straight line penetrating the side surface of the housing. The second portion overlaps with a first point on the second band attachment portion side of intersection points where the first straight line and the side surface of the housing intersect each other.

In the above-described electronic device, the second portion preferably overlaps with a second point which is one of two intersection points of the side surface of the housing and a second straight line penetrating the side surface and intersecting the first straight line when seen from the front surface side. In this case, an angle formed by the first point, an intersection point of the first straight line and the second straight line, and the second point is preferably more than or equal to 45 degrees and less than or equal to 270 degrees.

The first portion preferably includes at least one of an hour hand, a minute hand, and a second hand.

The first portion is preferably configured to display an image.

Furthermore, it is preferable to include a display panel overlapping with the first portion and a display panel overlapping with the second portion in the housing.

The first portion and the second portion may be each configured to display an image and may be configured to be connected seamlessly. In this case, a display panel overlapping with the first portion and the second portion and being partly curved is preferably included.

A display panel provided over the first portion, the second portion or both the first portion and second portion preferably includes one or more elements selected from a liquid crystal element, an organic EL element, an inorganic EL element, an LED element, a microcapsule, an electrophoretic element, an electrowetting element, an electrofluidic element, an electrochromic element, and a MEMS element.

Alternatively, the display panel provided over the first portion, the second portion or both the first portion and second portion preferably includes a first substrate, a second substrate, a first liquid crystal element, a first light-emitting element, and a first insulating layer. The first liquid crystal element is preferably positioned between the second substrate and the first insulating layer. The first light-emitting element is preferably positioned between the first substrate and the first insulating layer. The first liquid crystal element is preferably configured to reflect light to the second substrate side. The first light-emitting element is preferably configured to emit light to the second substrate side.

With one embodiment of the present invention, a convenient electronic device can be provided. Furthermore, an electronic device from which a user can easily read the displayed data can be provided. Furthermore, the user can read data with a small motion.

Moreover, with one embodiment of the present invention, an electronic device having high visibility regardless of the brightness of external light can be provided. Furthermore, an electronic device with low power consumption can be provided. Furthermore, an electronic device which can display both a smooth moving image and an eye-friendly still image can be provided. Furthermore, a novel electronic device can be provided.

BRIEF DESCRIPTION OF THE DRAWINGS

In the accompanying drawings:

FIGS. 6A1, 6A2, 6B, 6C, 6D, and 6E each illustrate an electronic device;

FIGS. 13A, 13B1, 13B2, 13B3, and 13B4 illustrate an example of a display device and examples of pixels;

DETAILED DESCRIPTION OF THE INVENTION

Figure 1A:
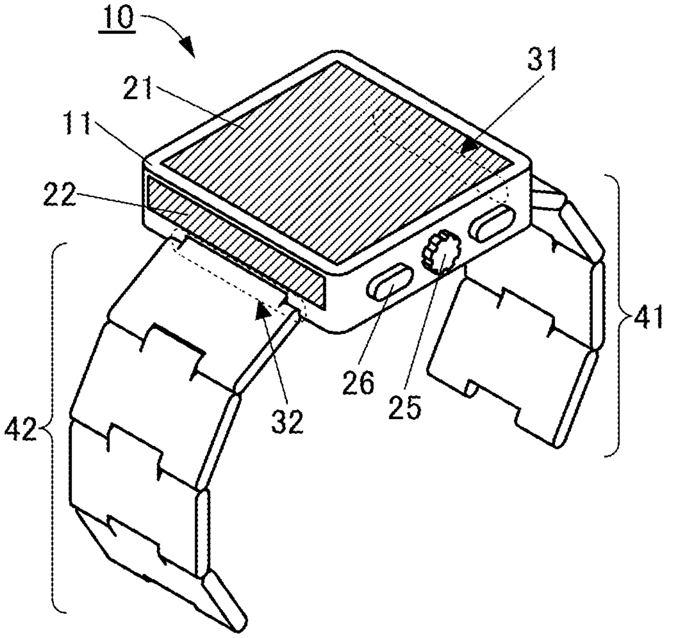
FIGS. 1A and 1B illustrate an electronic device.

Embodiments will be described in detail with reference to drawings. Note that the present invention is not limited to the following description, and it is easily understood by those skilled in the art that various changes and modifications can be made without departing from the spirit and scope of the present invention. Accordingly, the present invention should not be interpreted as being limited to the description of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not denoted by reference numerals in some cases.

Note that in each drawing described in this specification, the size, the layer thickness, or the region of each component is exaggerated for clarity in some cases. Therefore, embodiments of the present invention are not limited to such scales.

Note that in this specification and the like, ordinal numbers such as "first", "second", and the like are used in order to avoid confusion among components and do not limit the number.

Embodiment 1

In this embodiment, an electronic device of one embodiment of the present invention will be described.

One embodiment of the present invention is an electronic device including a housing and a display portion located on a side surface of the housing. The housing is provided with a pair of band attachment portions to which bands (belt or strap) for a user to wear the electronic device is attached. One embodiment of the present invention can be used as a wearable device, preferably as a watch-type information terminal device that can be worn on a user's arm.

A dial of the watch or a display portion (also referred to as a first display portion) that can display an image is provided on a front surface of the housing. In the case where a display portion is provided on the front surface of the housing, the display portion preferably functions as a touch panel.

One embodiment of the present invention further includes a display portion (also referred to as a second display portion), which displays an image, along a side surface of the housing. The display portion provided on the side surface of the housing can display various types of data, whereby the convenience of the user can be increased.

The second display portion preferably functions as a touch panel. Thus, the side surface of the housing can be used as an input device. A user can operate the electronic device by touching the side surface of the housing.

For example, in the watch-type device intended to be worn on the arm, the two band attachment portions are positioned on the top and bottom sides when seen from the front surface side. Specifically, the two band attachment portions are arranged to face each other on the straight line that penetrates the side surface of the housing. The band (first band) attached to the band attachment portion positioned on the top side (first band attachment portion) is positioned on the little finger side when worn on the arm, and the band (second band) attached to the band attachment portion (second band attachment portion) positioned on the bottom side is positioned on the thumb side (on the side near the user) when worn on the arm.

In particular, the second display portion preferably includes a portion located on the second band attachment portion side in the side surface of the housing. This portion in the housing easily comes into user's sight without a motion of intentionally looking at the electronic device. For example, it is a portion coming within sight of a user when he or she turns his or her eyes to the arm in walking or when he or she looks down in doing desk work (the state in which the user put his or her arm on the desk). In the case where the second display portion is located in this portion, the user can naturally obtain data displayed on the second display portion of the electronic device only by turning his or her eyes upon the electronic device without turning his or her wrist and looking at the front surface of the housing.

Furthermore, the second display portion is preferably provided from the bottom side surface of the housing to the left side surface or the right side surface. The second display portion may be provided from the bottom side surface of the housing through the left side surface or the right side surface to the top side surface. Thus, the display area of the second display portion can be increased, and more data can be provided to the user.

For example, in the case where the electronic device is designed to be worn on the left arm (preferably, the left wrist), the second display portion is preferably provided from the bottom side surface to the left side surface of the housing when seen from the front surface side. In the case where the electronic device is worn on the left arm, part of the left side surface of the housing is also a portion that easily comes into the user's sight without a motion of intentionally looking at the electronic device.

While in the case where the electronic device is designed to be worn on the right arm, the second display portion is preferably provided from the bottom side surface to the right side surface of the housing when seen from the front surface side.

Moreover, the second display portion may be provided from the right side surface through the bottom side surface to the left side surface of the housing. Thus, universal design for use on both the right and left arms can be achieved.

A button, an operation switch, a winding crown, or the like may be provided on a portion that is not provided with the second display portion in the left side surface or the right side surface of the electronic device. For example, they may be provided on the right side surface of the housing in the case where the electronic device is designed to be worn on the left arm, and provided on the left side surface of the housing in the case where the electronic device is designed to be worn on the right arm.

Providing a button, an operation switch, a winding crown, or the like on the top side surface of the housing enables universal design for use on both the right and left arms.

The first display portion and the second display portion preferably include one or more elements selected from a liquid crystal element, an organic EL element, an LED element, a microcapsule, an electrophoretic element, an electrowetting element, an electrofluidic element, an electrochromic element, and a MEMS element. As the liquid crystal element, a transmissive liquid crystal element, a reflective liquid crystal element, a transflective liquid crystal element, or the like can be used. In particular, a reflective liquid crystal element can reduce power consumption because it does not need a light source. When an element that uses a memory liquid crystal material, such as a nematic liquid crystal element, a cholesteric liquid crystal element, or a ferroelectric liquid crystal element, is used as the liquid crystal element, the rewriting frequency can be reduced in displaying a still image, so that power consumption can be reduced.

It is particularly preferable to employ a display device in which a reflective element and a light-emitting element are both included, in the first display portion. In this case, image display can be performed by the reflective element with low power consumption in bright external light, while image display can be performed vividly by the light-emitting element in poor external light. The combination display of the reflective element and the light-emitting element can reduce power consumption and allows an image to be displayed vividly.

Furthermore, it is also preferable to employ the above-described display device in which a reflective element and a light-emitting element are both included, in the second display portion.

By using the above-described display device in which a reflective element and a light-emitting element are both included in at least one of the first display portion and the second display portion, an electronic device which displays an image that can be easily viewed by the user regardless of the brightness of external light can be provided.

Here, the display devices included in the first display portion and the second display portion may have the same structure or different structures.

For example, when a display device in which a reflective element and a light-emitting element are both included is used in each of the first display portion positioned on the front surface of the housing and the second display portion positioned on the side surface of the housing, the electronic device can have low power consumption and high visibility.

For example, the first display portion positioned on the front surface of the housing may use a display device in which a reflective element and a light-emitting element are both included for low power consumption, and the second display portion may use a display device including a light-emitting element for vivid display of images. In this case, if the second display portion positioned on the side surface of the housing is used as a sub display which is smaller than the first display portion, the display area can be reduced, and thereby power consumption can be reduced.

Furthermore, the housing may include a windshield, a bezel, a winding crown, a push button, a lug, or the like.

More specific examples of the electronic device of one embodiment of the present invention are described below with reference to the drawings.

Structure Example 1

Figure 1B:
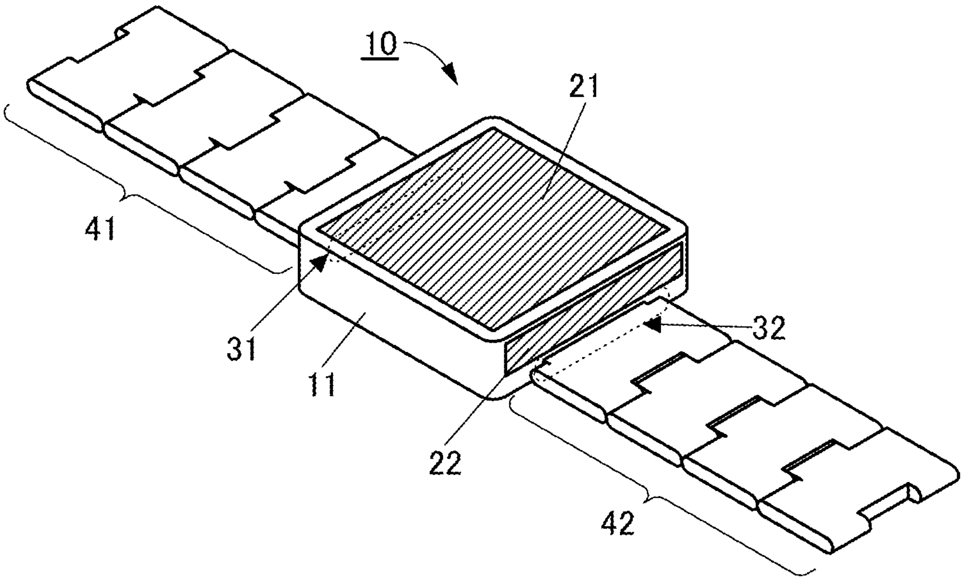

FIGS. 1A and 1B are perspective views of an electronic device 10 described below. FIG. 1A illustrates a front surface (main surface), a right side surface, and a bottom surface (bottom side surface) of the electronic device 10, and FIG. 1B illustrates the front surface, a left side surface, and the bottom side surface of the electronic device 10.

The electronic device 10 includes a housing 11. The housing 11 includes a display portion 21, a display portion 22, a band attachment portion 31, a band attachment portion 32, a winding crown 25, buttons 26, and the like. In the example illustrated in FIGS. 1A and 1B, the electronic device 10 is provided with a band 41 and a band 42.

The display portion 21 is positioned on the front surface side of the housing 11 and has a function of showing data such as the time to the user. For example, a dial of a watch or a display device capable of displaying a moving image or a still image may be used in the display portion 21.

In the case where a display device is used in the display portion 21, a segment display device may be used. In this way, the electronic device 10 can function as a digital watch.

In particular, an active matrix display device or a passive matrix display device is preferably used in the display portion 21. In particular, in the case where a display device is used in the display portion 21, a display device functioning as a touch panel is preferably used.

In the case where a dial of an analog watch is provided in the display portion 21 positioned on the front surface side of the housing 11, at least one of the hour hand, the minute hand, and the second hand is included. Furthermore, the watch is preferably a quartz watch but may be a mechanical watch. When a quartz watch is employed, a battery can be shared between the display portion 21 and electronic components (e.g., display panel) inside the housing. Furthermore, when a mechanical watch is employed, electric power is not necessary for operation of the watch; accordingly, even when the electronic device is in short of remaining battery, it can function as a watch. Note that the watch may be a hybrid watch of a quartz watch and a mechanical watch, capable of employing two dynamic sources. The quartz watch operates with a battery, and a mechanical watch operates with restoring force of a spring.

The display portion 22 is provided on part of a side surface of the housing 11 and has a function of displaying an image. The display portion 22 may be provided with a segment display device but is preferably provided with an active matrix display device or a passive matrix display device. In particular, the display portion 22 is preferably provided with a display device functioning as a touch panel.

The band attachment portion 31 is positioned on the side surface on the top side of the housing 11 and the band attachment portion 32 is positioned on the side surface on the bottom side (bottom surface) of the housing 11. The band attachment portion 31 and the band attachment portion 32 are provided to face each other with the display portion 21 sandwiched therebetween. Although the band attachment portion 31 and the band attachment portion 32 each being a hollow provided in the housing 11 are illustrated in FIGS. 1A and 1B, the present invention is not limited to this embodiment as long as a mechanism for fixing the band 41 or the band 42 is included. For example, when the band 41 and the band 42 are connected to the housing 11 with spring bars, the band attachment portion 31 and the band attachment portion 32 can each have at least a pair of bearings to which the spring bar is attached.

Note that the housing 11 and the band 41 may be configured to be undetachable from each other, and the housing 11 and the band 42 may be configured to be undetachable from each other. Furthermore, the band 41, the band 42, and the housing 11 may be united with unclear boundary therebetween. In such a case, at least a bendable portion serves as the band 41 or the band 42.

In this specification and the like, when the electronic device 10 is seen from the front surface side (the display portion 21 side), the direction on the band 41 side is the top side and the direction on the band 42 side is the bottom side.

Note that the direction of the image, the dial, or the like displayed on the display portion 21 is not limited to the top or bottom direction and may be inclined. For example, in the case where a display device is used in the display portion 21 and the electronic device 10 has a function of measuring the attitude, such as the inclination, of the housing 11, the direction of the displayed image may be changed depending on the attitude of the housing 11.

The winding crown 25 and the buttons 26 each function as one user interface. For example, the user can push, pull, turn, or slide up and down or back and forth the winding crown 25 or the buttons 26. In response to such operation, a power-on/off operation, an application startup operation, an application switching operation, or other operations can be performed in the electronic device 10. Although the housing 11 is provided with one winding crown 25 and two buttons 26 in the example shown here, a switch or the like may be included as well.

When the band 41 and the band 42 are worn on the user's arm, the band 41 is positioned on the little finger side, and the band 42 is positioned on the thumb side (on the side near the user).

The display portion 22 is positioned on the band 42 side (i.e., the band attachment portion 32 side) on the side surface of the housing 11. Thus, the user can view the display portion 22 only by turning his or her eyes upon the electronic device 10 without a motion of, for example, turning the wrist for looking at the front surface (e.g., the display portion 21) of the electronic device 10. Thus, an extremely convenient electronic device can be achieved.

Figure 2A:
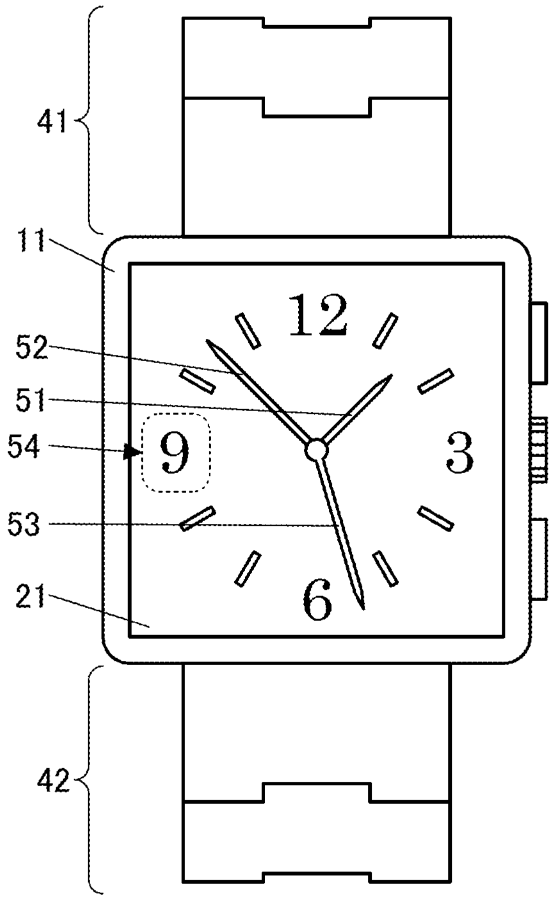
FIGS. 2A to 2C each illustrate an electronic device.

FIG. 2A is a schematic view of the electronic device 10 seen from the front surface side. In the display portion 21 in FIG. 2A, a dial of an analog watch is used.

The display portion 21 includes an hour hand 51, a minute hand 52, a second hand 53, and an index 54. Note that at least one of the hour hand 51, the minute hand 52, and the second hand 53 is included. Furthermore, the index 54 is not limited to the example illustrated in FIG. 2A and may be selected from a variety of designs. Moreover, the display portion 21 may have a date indicator (calendar), a moon age indicator (moon phase), a power reserve indicator, or the like.

Figure 2B:
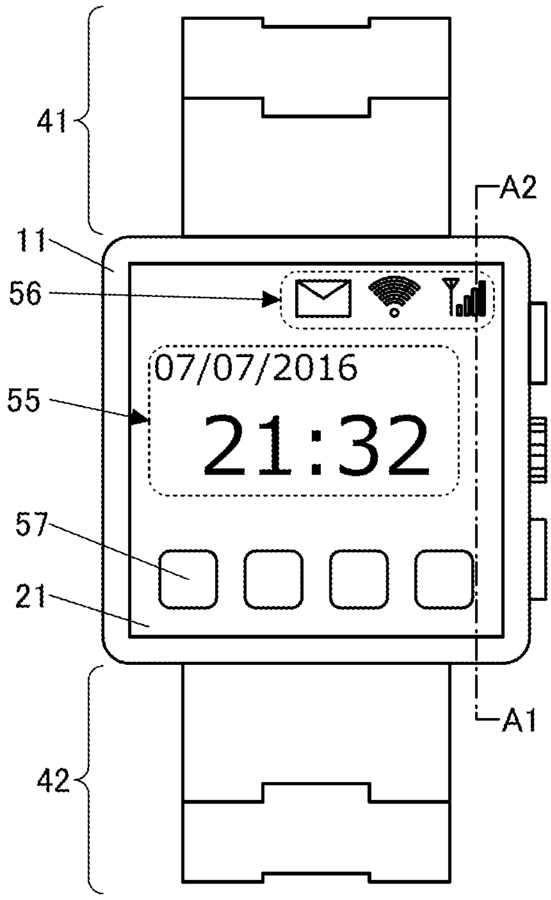

FIG. 2B illustrates an example of an image that can be displayed in the case where a display device is used in the display portion 21.

FIG. 2B illustrates an example of displaying date and time data 55, notification data 56, and a plurality of icons 57 on the display portion 21. As the notification data 56, an image notifying the reception of a message, an image notifying the reception status of data communication electric waves, and an image notifying the reception status of telephone communication electric waves are illustrated from the left as an example. Note that the data displayed on the display portion 21 is not limited to the example illustrated here, and various data can be displayed.

Figure 2C:
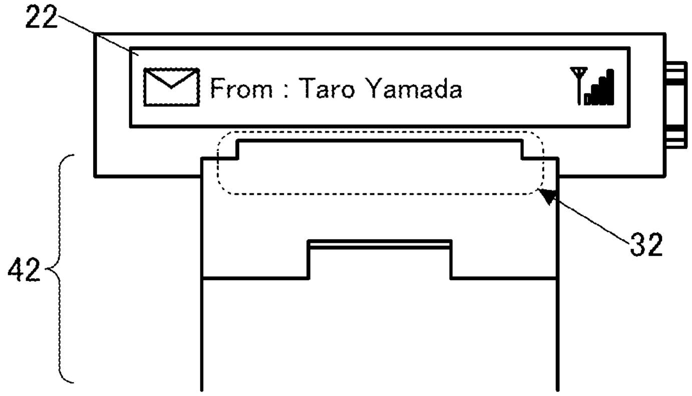

FIG. 2C is a schematic view of the electronic device 10 seen from the display portion 22 side.

In the example illustrated in FIG. 2C, data notifying the reception of a message and the sender of the message and data notifying the reception status of electric waves are displayed on the display portion 22. Note that the data displayed on the display portion 22 is not limited to the example illustrated here, and various data can be displayed.

In the case where a still image is mainly displayed on the display portion 21 and the display portion 22, a display device including a memory display element is preferably used in each of the display portion 21 and the display portion 22; in this way, power consumption can be reduced.

Here, a memory display element is a display element which can retain a displayed still image without rewriting. Examples of the memory display element include a display element which retains a displayed still image after the stop of power supply, a display element which retains a displayed still image under the supply of a constant voltage, and a display element which retains a displayed still image without a refresh operation.

The period the memory display element can retain an image without a refresh or rewriting operation is preferably as long as possible. For example, the retention period is one second or more, preferably one minute or more, further preferably one hour or more, still further preferably one day or more, and one year or less. Here, the displayed image retention state is, for example, the state in which luminance variation is within 5%, preferably within 3%, further preferably within 1% with respect to the luminance dynamic range. Note that in the case of a reflective display element, the above-described luminance is read as reflectivity.

As the memory display element, any of display elements to which various approaches of bistable display technology are applied can be used. As a typical example of this kind of display element, electronic paper can be given. The electronic paper may be a particle-movement type element with a microcapsule method, an electrophoretic display (EPD) method, or an electronic liquid powder (registered trademark) method, for example. A display element having a bistable liquid crystal such as a nematic liquid crystal element, a cholesteric liquid crystal element, or a ferroelectric liquid crystal element can also be used.

Other than the above, an electrowetting (EW) element, an electrofluidic (EF) element, an electrochromic (EC) element, a micro electro mechanical system (MEMS) element, or the like can be used as the memory display element. As the MEMS element, a MEMS element utilizing optical interference, a MEMS shutter element, or the like can be used.

Display elements selected from those of various types can be used in the display portion 21 and the display portion 22 in accordance with uses of the electronic device 10.

Furthermore, in the case where a smooth moving image needs to be displayed on the display portion 21 and the display portion 22, the display element can be a self-luminous light-emitting element such as an organic EL (OLED; organic light-emitting diode) element, a light-emitting diode (LED) element, or a quantum-dot light-emitting diode (QLED) element, for example. Alternatively, a transmissive, reflective, or transflective liquid crystal element may be used.

Using a display panel which includes a display element utilizing reflected light and a light-emitting element is particularly preferable in the display portion 21 and the display portion 22. More specifically, a display panel which includes a reflective liquid crystal element, a transistor for driving the liquid crystal element, an organic EL element, and a transistor for driving the organic EL element between a pair of substrates is preferably used. This display panel achieves excellent visibility and low power consumption by using the reflective liquid crystal element to display an image in bright external light. Furthermore, the display panel is capable of vivid display by using the organic EL element to display an image in poor external light. Moreover, displaying an image with a combination of the reflective liquid crystal element and the organic EL element allows both low power consumption and vivid display.

Furthermore, it is preferable that the electronic device 10 can be configured so that the display portion 21 or the display portion 22 does not display an image depending on the situation. Specifically, it is preferable that the electronic device 10 can be configured so that pixels in the display portion 21 or the display portion 22 are not driven. In the case where a display device including a backlight like a transmissive liquid crystal display device is used in the display portion 21 or the display portion 22, it is preferable that the electronic device 10 can be configured so that the backlight is not driven. By making the display portion 21 or the display portion 22 in a non-displaying (non-operating) state temporarily, power consumption can be significantly reduced.

Note that the display portion 21 and the display portion 22 can display various data other than the above. Examples of the displayed data include notification of an incoming e-mail, call, social networking service (SNS) message, or the like, the subject of an e-mail, an SNS message, or the like, the sender of an e-mail, an SNS message, or the like, the message, the date, the time, information on playing music or voice, the volume, the temperature, the battery level, the communication status, the reception strength of an antenna, and the status of downloading a file or the like. The display portion 21 and the display portion 22 may display icons associated with applications, icons associated with functions, operation buttons, a slider, or the like. Examples of the icons are icons associated with a function of adjusting the volume, a fast-forward function, and a fast-backward function during the replay of voice or music. Furthermore, icons associated with a function of answering the call or placing the call on hold or a function of awaking the operation invalid state (the lock state) of the electronic device 10 may be displayed.

Note that a transistor including an oxide semiconductor in its channel formation region thereby to have an extremely low off-state current is preferably used in pixels, driver circuits, or the like of the display portion 21 and the display portion 22. A transistor including an oxide semiconductor whose band gap is larger than the band gap of silicon can hold charges stored in a capacitor that is series-connected to the transistor for a long time, owing to the low off-state current of the transistor. For example, even when a memory display element is not used, using such a transistor in a pixel enables a driver circuit to stop while keeping the grayscale level of the displayed image. As a result, an electronic device with extremely low power consumption can be obtained.

Structure Example 2

Figure 3A:
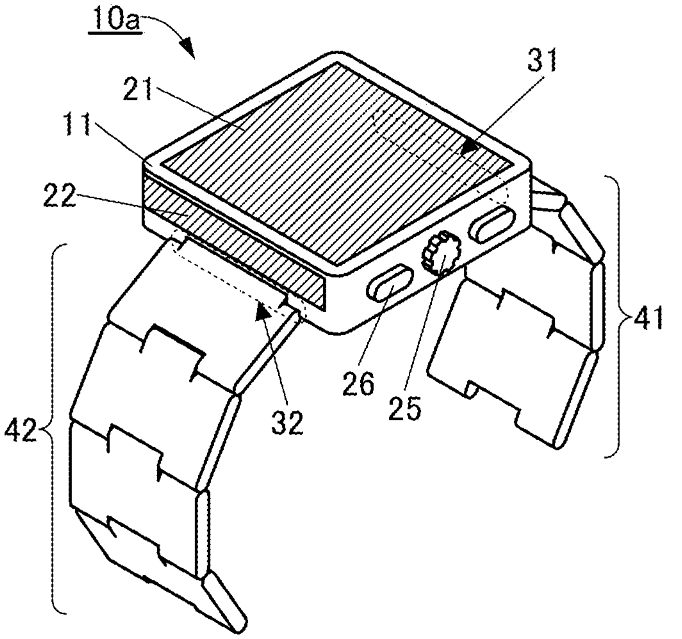
FIGS. 3A and 3B illustrate an electronic device.
Figure 3B:
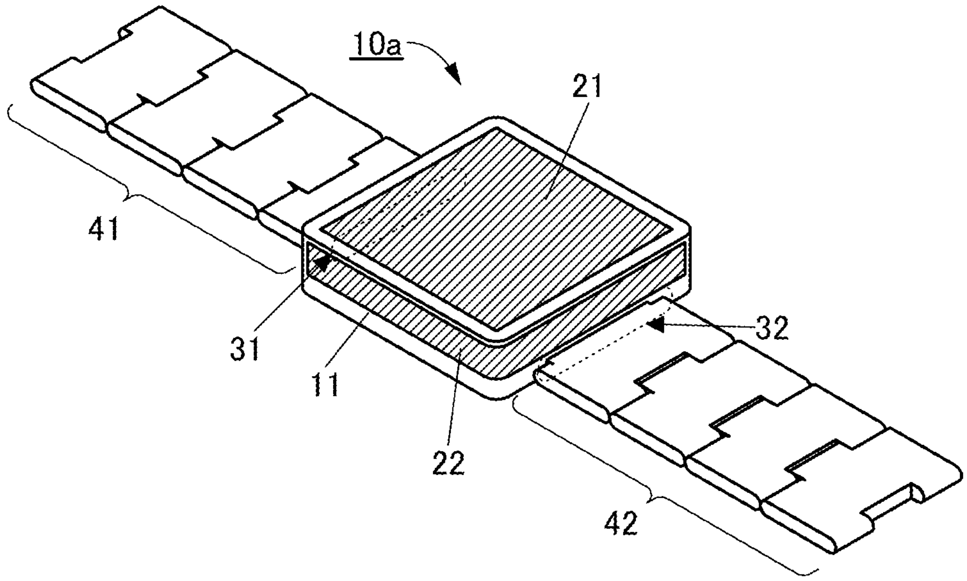

FIGS. 3A and 3B are perspective views illustrating an electronic device 10*a* described below. The electronic device 10*a* illustrated in FIGS. 3A and 3B is different from the structure illustrated in FIGS. 1A and 1B and the like in the shape of the display portion 22.

The display portion 22 is provided from the bottom side surface to the left side surface of the housing 11. The display portion 22 curves along a corner on the side surface of the housing 11. The display portion 22 can display a continuous image from the bottom side surface to the left side surface of the housing 11.

For example, in the case where the electronic device 10*a* is designed to be worn on the left arm, the left side surface of the housing 11 as well as the bottom side surface of the housing 11 is a portion that easily comes into the user's sight without a motion of intentionally looking at the electronic device 10*a*. Thus, the user can view the display portion 22 only by turning his or her eyes upon the electronic device 10*a* without a motion of, for example, turning the wrist for looking at the front surface (e.g., the display portion 21) of the electronic device 10*a*.

With this structure, the area of the display region of the display portion 22 can be increased; accordingly, more data can be displayed to the user. Thus, a more convenient electronic device can be achieved.

In the case where the electronic device 10*a* is designed to be worn on the right arm, the structure in FIGS. 3A and 3B is inverted horizontally. In other words, when seen from the front surface side, the display portion 22 is provided from the bottom side surface to the right side surface of the housing 11, and the winding crown 25, the buttons 26, and the like are provided on the left side surface of the housing 11.

Structure Example 3

Figure 4A:
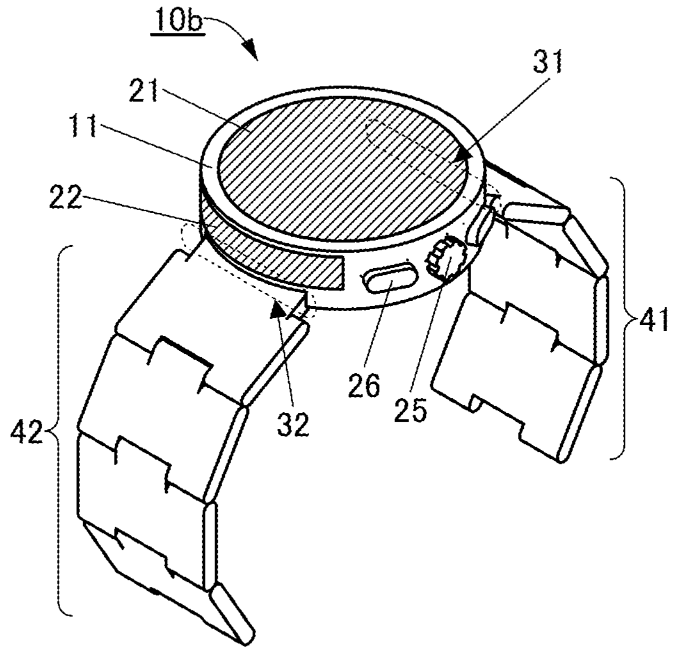
FIGS. 4A and 4B illustrate an electronic device.
Figure 4B:
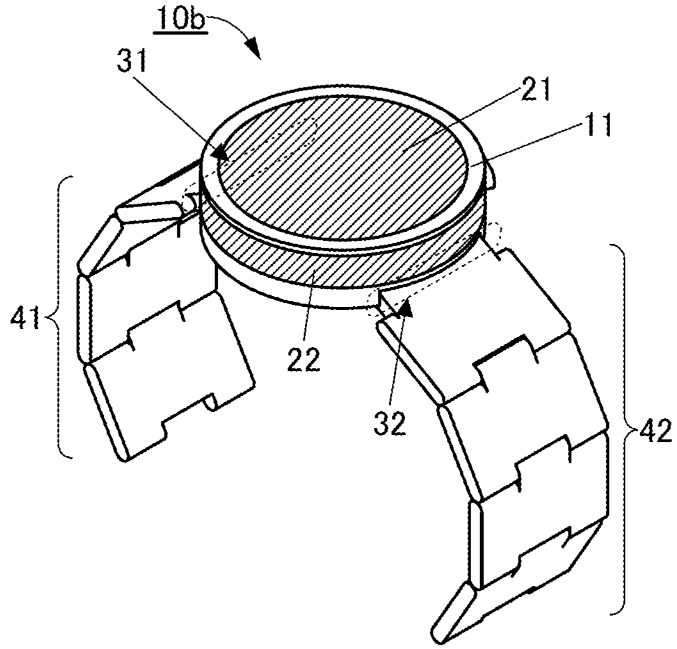

FIGS. 4A and 4B are perspective views illustrating an electronic device 10*b* described below. The electronic device 10*b* illustrated in FIGS. 4A and 4B is different from the structure illustrated in FIGS. 3A and 3B and the like in the shape of the housing 11.

The housing 11 has a circular shape when seen from the front surface side. The display portion 21 also has a circular shape.

The side surface of the housing 11 forms a cylindrical shape. The display portion 22 curves along the side surface. The display portion 22 is evenly curved from the bottom side surface to the left side surface of the housing 11. The display portion 22 can display a continuous image from the bottom side surface to the left side surface of the housing 11.

For example, in the case where the electronic device 10*b* is designed to be worn on the left arm, the region from the bottom side surface to the left side surface of the housing 11 is a portion that easily comes into the user's sight without a motion of intentionally looking at the electronic device 10*b*. Thus, the user can view the display portion 22 only by turning his or her eyes upon the electronic device 10*b* without a motion of, for example, turning the wrist for looking at the front surface (e.g., the display portion 21) of the electronic device 10*b*.

With this structure, the area of the display region of the display portion 22 can be increased; accordingly, more data can be displayed to the user. Thus, a more convenient electronic device can be achieved.

In the case where the electronic device 10*b* is designed to be worn on the right arm, the structure in FIGS. 4A and 4B is inverted horizontally. In other words, when seen from the front surface side, the display portion 22 is provided from the bottom side surface to the right side surface of the housing 11, and the winding crown 25, the buttons 26, and the like are provided on the left side surface of the housing 11.

Structure Example 4

Figure 5A:
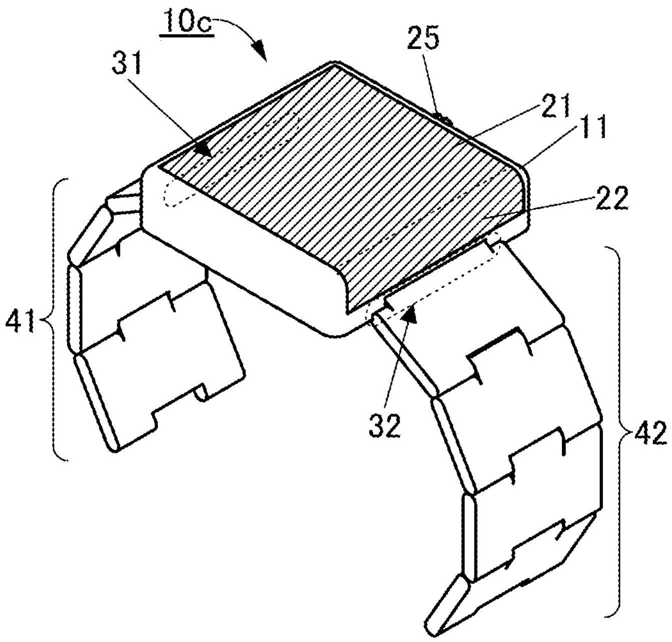
FIGS. 5A and 5B each illustrate an electronic device.

FIG. 5A is a perspective view illustrating an electronic device 10*c* described below. The electronic device 10*c* illustrated in FIG. 5A is different from the structure illustrated in FIGS. 1A and 1B and the like in that the display portion 21 and the display portion 22 are seamlessly connected.

The display portion 21 and the display portion 22 are provided from the front surface to the bottom side surface of the housing 11. The display portion 21 and the display portion 22 can display a continuous image from the front surface to the bottom side surface of the housing 11.

The display portion 21 and the display portion 22 are preferably formed by one display device. For example, a display device that partly or entirely has flexibility can be used.

In FIG. 5A, a boundary between the display portion 21 and the display portion 22 is indicated by dotted lines for convenience. For example, in the case where the housing on the front surface side is flat, of the display portion in the electronic device 10*c*, a region positioned on the front surface side and being flat can be regarded as the display portion 21 and the other region including the curved portion can be regarded as the display portion 22. Alternatively, a region which can be seen from the front surface side can be regarded as the display portion 21 and the region which cannot be seen from the front surface side can be regarded as the display portion 22.

Variation Example

Figure 5B:
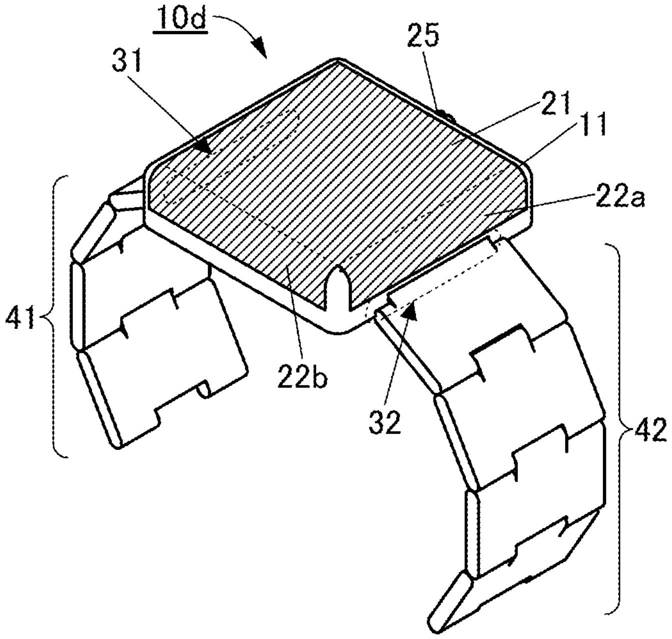

FIG. 5B illustrates an example including a display portion 22*a* positioned on the bottom side surface of the housing 11 and a display portion 22*b* positioned on the left side surface of the housing 11. The display portion 21, the display portion 22*a*, and the display portion 22*b* are connected seamlessly. The display portion 21 and the display portion 22*a* can display a continuous image, and the display portion 21 and the display portion 22*b* can display a continuous image.

[Placement of Display Portion 22]

Next, the placement of the display portion 22 is described.

FIG. 6A1 is a schematic view of the electronic device 10 illustrated in FIG. 1A and the like, seen from the front surface side. FIG. 6A2 is a perspective view of the electronic device 10 seen from the left side surface side and the bottom side surface side.

In FIG. 6A1, a region where the display portion 22 is provided is indicated by broken lines. Note that although the display portion 22 forms part of the side surface of the housing, the thickness of the display portion 22 is illustrated in FIG. 6A1 for clarity.

In FIGS. 6A1 and 6A2, a virtual straight line 15 which penetrates the side surface of the housing 11 is shown. The straight line 15 is parallel to the surface of the display portion 21. In the case where the surface of the display portion 21 is curved, the straight line 15 is a straight line which is orthogonal to a perpendicular passing through the center of gravity of the display portion 21.

Furthermore, the straight line 15 is orthogonal to a symmetry line or a symmetry plane of the band attachment portion 31 and the band attachment portion 32 which are symmetric with respect to the line or the plane. In other words, the band attachment portion 31 and the band attachment portion 32 are each provided on the straight line 15.

In the case where the band 41, the band 42, and the housing 11 are formed as one piece and the clear band attachment portions 31 and 32 do not exist, the band attachment portions 31 and 32 can be replaced by the bands 41 and 42. In other words, the straight line 15 is orthogonal to a symmetry line or a symmetry plane of the band 41 and the band 42 which are symmetric with respect to the line or the plane, and the band 41 and the band 42 are each provided along the straight line 15.

Because the straight line 15 penetrates the side surface of the housing 11, two intersection points exist between the straight line 15 and the side surface of the housing 11. Of the two intersection points, the intersection point on the top side (the band attachment portion 31 side) is referred to as an intersection point 15*a*, and the intersection point on the bottom side (the band attachment portion 32 side) is referred to as an intersection point 15*b*.

The display portion 22 is preferably provided in at least a position overlapping with the intersection point 15*b*.

Because the intersection point 15*b* is a point that easily comes into the user's sight without a motion of intentionally looking at the electronic device 10, providing the display portion 22 in such a position allows the user to view the display portion 22 only by turning his or her eyes upon the electronic device 10 without a motion of, for example, turning the wrist for looking at the front surface (e.g., the display portion 21) of the electronic device 10.

FIG. 6B illustrates the electronic device 10*a* illustrated in FIGS. 3A and 3B.

In FIG. 6B, a straight line 16 intersecting the straight line 15 is shown. The straight line 16 is a straight line penetrating the side surface of the housing 11 like the straight line 15, and two intersection points between the straight line 16 and the housing 11 are referred to as an intersection point 16*a* and an intersection point 16*b*. Here, the straight line 16 is a straight line intersecting the straight line 15 at a midpoint between the intersection point 15*a* and the intersection point 15*b*.

Of the two intersection points, the intersection point overlapping with the display portion 22 is referred to as the intersection point 16*a*. In the case where both of the two intersection points overlap with the display portion 22, the intersection point farther from the intersection point 15*b* is referred to as the intersection point 16*a*, and the intersection point closer to the intersection point 15*b* is referred to as the intersection point 16*b*.

FIGS. 6B to 6E each illustrate a case in which the display portion 22 overlaps with the intersection point 16*a* and the intersection point 16*a* is positioned at an edge of the display portion 22.

Here, an angle between the straight line 15 and the straight line 16 is referred to as angle θ. The angle θ is formed by the intersection point 15*b*, an intersection point of the straight lines 15 and 16, and the intersection point 16*a*.

The angle θ between the straight lines 15 and 16 is, for example, more than or equal to 30 degrees and less than or equal to 300 degrees, preferably more than or equal to 45 degrees and less than or equal to 270 degrees, further preferably more than or equal to 90 degrees and less than or equal to 270 degrees. The more the angle θ becomes, the area of the display region of the display portion 22 is increased.

For example, FIG. 6C illustrates a case in which the angle θ is more than 180 degrees. In this case, the display portion 22 is positioned from the bottom side surface through the left side surface to part of the top side surface of the housing 11.

FIG. 6D illustrates the electronic device 10*b* illustrated in FIGS. 4A and 4B.

In FIG. 6D, the display portion 22 is provided so as to be curved along the cylindrical side surface of the housing 11. FIG. 6D illustrates a case in which θ is less than 180 degrees. In this case, the display portion 22 is positioned from the bottom side surface to part of the left side surface of the housing 11.

Furthermore, FIG. 6E illustrates an example of a case in which the angle θ is more than 180 degrees. In this case, the display portion 22 is positioned from the bottom side surface through the left side surface to part of the top side surface of the housing 11.

Described so far is the placement of the display portion 22.

[Internal Structure Example of Electronic Device]

An example of an internal structure of an electronic device according to one embodiment of the present invention is described below.

Figure 7A:
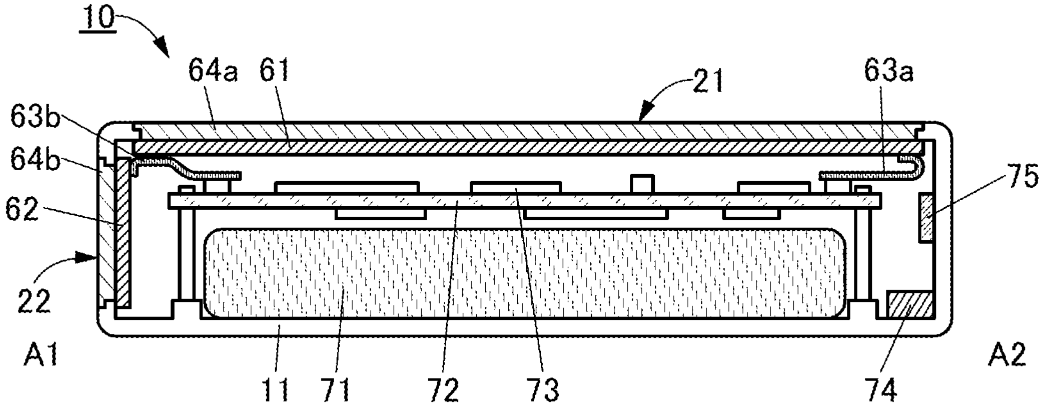
FIGS. 7A and 7B each illustrate an electronic device.

FIG. 7A is a schematic cross-sectional view of the electronic device 10. FIG. 7A corresponds to a cross section taken along line A1-A2 in FIG. 2B.

The electronic device 10 includes, inside the housing 11, a display device 61, a display device 62, a battery 71, a printed board 72, a vibration module 74, an antenna 75, and the like.

A plurality of ICs 73 are mounted on the printed board 72. The display device 61 and the printed board 72 are electrically connected to each other by an FPC 63*a*. The display device 62 and the printed board 72 are electrically connected to each other by an FPC 63*b*.

The electronic device 10 includes a light-transmitting member 64*a* in a region overlapping with the display device 61 on the front surface side of the housing 11. The user can view an image displayed on the display region of the display device 61 through the light-transmitting member 64*a*. A region where the light-transmitting member 64*a* is provided in the housing 11 corresponds to the display portion 21.

The electronic device 10 includes a light-transmitting member 64*b* in a region overlapping with the display device 62 on the side surface of the housing 11. The user can view an image displayed on the display device 62 through the light-transmitting member 64*b*. A region where the light-transmitting member 64*b* is provided in the housing 11 corresponds to the display portion 22.

As the light-transmitting member 64*a* and the light-transmitting member 64*b*, glass, crystal glass, plastic, or the like can be used, for example.

Figure 7B:
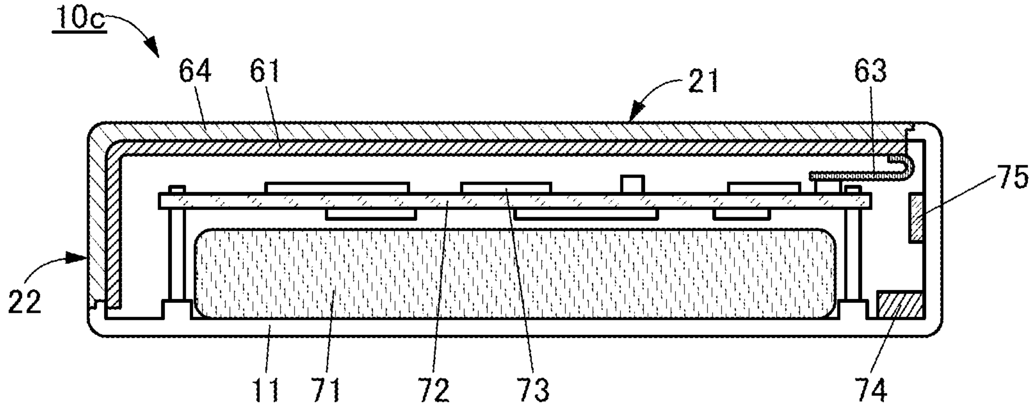

FIG. 7B illustrates a cross-sectional structure example of the electronic device 10*c* illustrated in FIG. 5A.

The electronic device 10*c* includes the display device 61. The display device 61 is provided from the front surface to the side surface of the housing 11 so as to be partly curved. The display device 61 and the printed board 72 are electrically connected to each other through an FPC 63.

Furthermore, the housing 11 includes a light-transmitting member 64. The light-transmitting member 64 is provided from the front surface to the side surface of the housing 11 so as to be partly curved.

Described so far is an example of an internal structure of an electronic device.

At least part of this embodiment can be implemented in combination with any of the other embodiments described in this specification as appropriate.

Embodiment 2

[Hardware Structure Examples of Electronic Device]

A structural example of hardware of the electronic device 10 will be described below.

Figure 8:
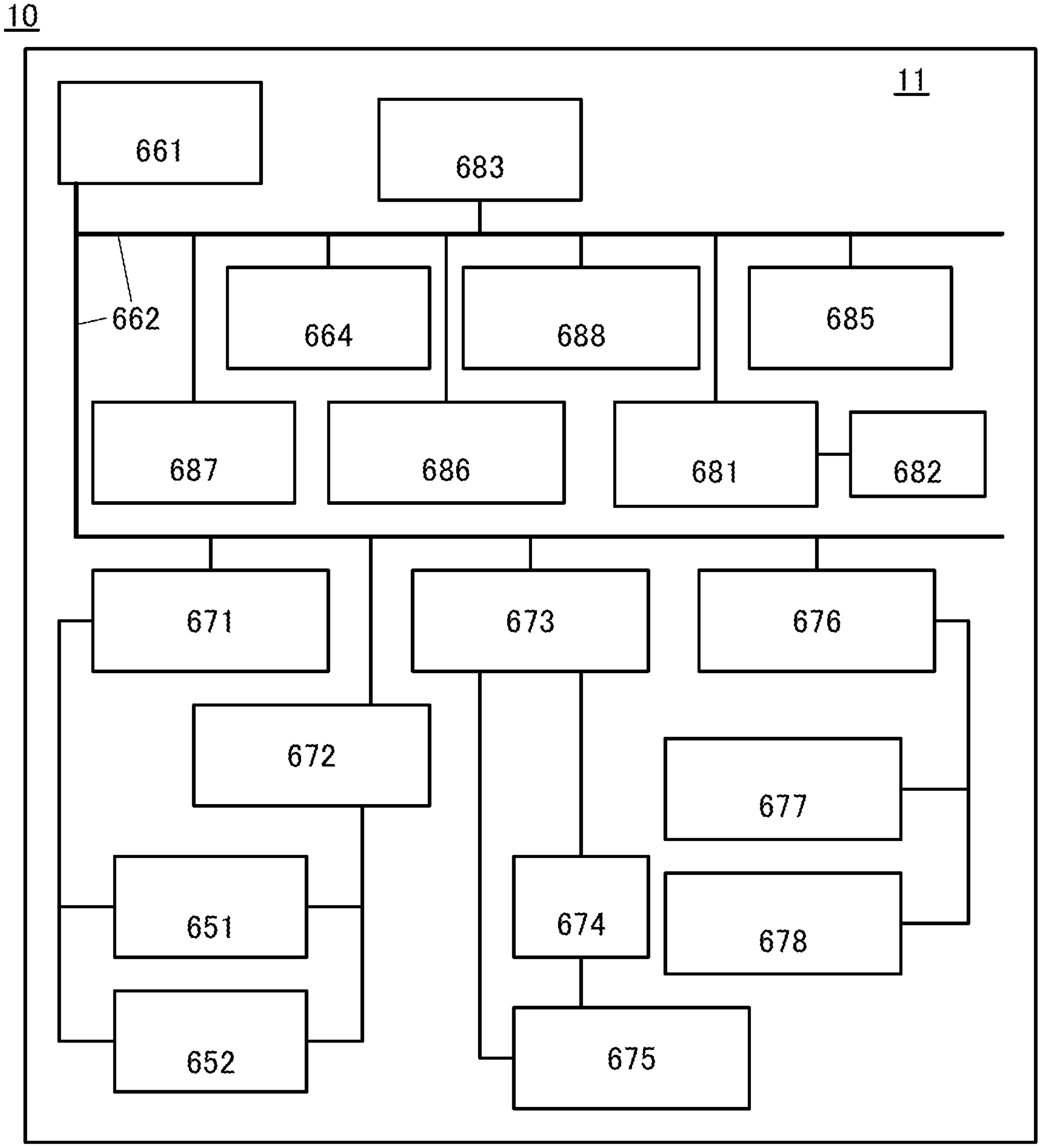
FIG. 8 is a block diagram of an electronic device.

FIG. 8 is a block diagram illustrating a structural example of the electronic device 10.

Although a block diagram attached to this specification shows elements classified according to their functions in independent blocks, it may be practically difficult to completely separate the elements according to their functions and, in some cases, one element may be involved in a plurality of functions, or a plurality of elements may be involved in one function.

Note that the structure of the electronic device 10 illustrated in FIG. 8 is an example, and the electronic device 10 does not need to include all the components. The electronic device 10 includes necessary components among the components illustrated in FIG. 8 and may include a component other than the components in FIG. 8.

The electronic device 10 includes the housing 11.

The housing 11 includes an arithmetic portion (CPU) 661, a touch panel 651, a touch panel 652, a memory device 664, a display controller 671, a touch sensor controller 672, a battery controller 673, a power receiving portion 674, a battery module 675, a sound controller 676, an audio input portion 677, an audio output portion 678, a communication module 681, an antenna 682, an attitude measurement portion 683, an external interface 685, a camera module 686, a vibration module 687, a sensor module 688, and the like.

The memory device 664, the display controller 671, the touch sensor controller 672, the battery controller 673, the sound controller 676, the communication module 681, the attitude measurement portion 683, the external interface 685, the camera module 686, the vibration module 687, the sensor module 688, and the like are connected to the arithmetic portion 661 via a bus line 662.

The touch panel 651 corresponds to the display device included in the display portion 21. The touch panel 652 corresponds to the display device included in the display portion 22.

The arithmetic portion 661 can, for example, function as a central processing unit (CPU), and has a function of controlling components such as the memory device 664, the display controller 671, the touch sensor controller 672, the battery controller 673, the sound controller 676, the communication module 681, the attitude measurement portion 683, the external interface 685, the camera module 686, the vibration module 687, and the sensor module 688.

Signals are transmitted between the arithmetic portion 661 and the components via the bus line 662. The arithmetic portion 661 has a function of processing signals input from the components which are connected to the arithmetic portion 661 via the bus line 662, a function of generating signals to be output to the components, and the like, so that the components connected to the bus line 662 can be controlled comprehensively.

Note that a transistor which includes an oxide semiconductor in a channel formation region and has an extremely low off-state current can be used in an IC included in the arithmetic portion 661 and the other components, and the like. With the use of the transistor having an extremely low off-state current as a switch for holding electric charge (data) which flows into a capacitor functioning as a memory element, a long data retention period can be ensured. By utilizing this characteristic for a register or a cache memory of the arithmetic portion 661, normally off computing is achieved where the arithmetic portion 661 operates only when needed and information on the previous processing is stored in the memory element in the rest of time; thus, power consumption of the electronic device 10 can be reduced.

The arithmetic portion 661 interprets and executes instructions from various programs with a processor to process various kinds of data and control programs. The programs executed by the processor may be stored in a memory region of the processor or in the memory device 664.

As an example of the arithmetic portion 661 other than the CPU, a microprocessor, such as a digital signal processor (DSP) or a graphics processing unit (GPU), can be used alone or in combination. Furthermore, such a microprocessor may be obtained with a programmable logic device (PLD) such as a field programmable gate array (FPGA) or a field programmable analog array (FPAA).

The arithmetic portion 661 may include a main memory. The main memory can include a volatile memory, such as a random access memory (RAM), and a nonvolatile memory, such as a read only memory (ROM).

For example, a dynamic random access memory (DRAM) is used for the RAM included in the main memory, in which case a memory space as a workspace for the arithmetic portion 661 is virtually allocated and used. An operating system, an application program, a program module, program data, and the like which are stored in the memory device 664 are loaded into the RAM and executed. The data, program, and program module which are loaded into the RAM are directly accessed and operated by the arithmetic portion 661.

In the ROM, a basic input/output system (BIOS), firmware, and the like for which rewriting is not needed can be stored. As the ROM, a mask ROM, a one-time programmable read only memory (OTPROM), an erasable programmable read only memory (EPROM), or the like can be used. As an EPROM, an ultra-violet erasable programmable read only memory (UV-EPROM) which can erase stored data by irradiation with ultraviolet rays, an electrically erasable programmable read only memory (EEPROM), a flash memory, and the like can be given.

Examples of the memory device 664 are a memory device including a nonvolatile memory element, such as a flash memory, a magnetoresistive random access memory (MRAM), a phase change RAM (PRAM), a resistive RAM (ReRAM), or a ferroelectric RAM (FeRAM), and a memory device including a volatile memory element, such as a dynamic RAM (DRAM) or a static RAM (SRAM). Alternatively, a storage media drive such as a hard disk drive (HDD) or a solid state drive (SSD) may be used, for example.

As the memory device 664, a memory device which can be connected to and disconnected from the external interface 685 with a connector, such as an HDD or an SSD, or a storage media drive, such as a flash memory, a Blu-ray disc, or a DVD can be used. Note that the memory device 664 is not necessarily incorporated in the electronic device 10, and a memory device outside the electronic device 10 may be used as the memory device 664. In this case, the memory device may be connected through the external interface 685, or data transmission and reception may be wirelessly performed using the communication module 681.

The touch panel 651 and the touch panel 652 are each connected to the display controller 671 and the touch sensor controller 672. The display controller 671 and the touch sensor controller 672 are connected to the arithmetic portion 661 via the bus line 662.

The display controller 671 controls the touch panel 651 and the touch panel 652 according to drawing instructions input from the arithmetic portion 661 via the bus line 662 so that a predetermined image is displayed on the display surface of these touch panels.

The touch sensor controller 672 controls touch sensors of the touch panels 651 and 652 according to requests from the arithmetic portion 661 via the bus line 662. In addition, the touch sensor controller 672 outputs a signal received by the touch sensors to the arithmetic portion 661 via the bus line 662. Note that the function of calculating touch position information from a signal received by the touch sensors may be given to the touch sensor controller 672 or the arithmetic portion 661.

The touch panels 651 and 652 can display an image on the basis of a signal supplied from the display controller 671. In addition, the touch panels 651 and 652 are capable of sensing the proximity or touch of an object such as a finger or a stylus on the basis of a signal supplied from the touch sensor controller 672 and outputting the positional information of the object to the touch sensor controller 672.

The touch panel 651, the touch panel 652, and the touch sensor controller 672 preferably have a function of obtaining the distance between a sensing surface and the object in the height direction, a function of obtaining the magnitude of pressure applied to the sensing surface by the object, and a function of obtaining the area where the sensing surface is in contact with the object.

In the touch panels 651 and 652, a module including a touch sensor is provided on the display surface side of the display panel so as to overlap with the display panel. At this time, at least part of the module including a touch sensor is preferably flexible to follow the bending of the display panel. The module including a touch sensor can be bonded to the display panel with an adhesive or the like. A polarizing plate or a cushion material (e.g., a separator) may be provided between the module and the display panel. The thickness of the module including a touch sensor is preferably smaller than or equal to that of the display panel.

A touch panel in which a display panel and a touch sensor are combined may be used as each of the touch panels 651 and 652. For example, the touch panels 651 and 652 are preferably on-cell touch panels or an in-cell touch panels. The on-cell or in-cell touch panel has a small thickness and therefore can be lightweight. In addition, the number of components of the on-cell or in-cell touch panel can be reduced, so that cost can be reduced.

A variety of sensors capable of sensing the proximity or touch of an object such as a finger can be used as the touch sensors included in the touch panels 651 and 652. For example, a sensor of a capacitive type, a resistive type, a surface acoustic wave type, an infrared type, an electromagnetic induction type, or an optical type can be used. In addition, an optical sensor using a photoelectric conversion element, a pressure-sensitive sensor using a pressure-sensitive element, or the like may be used. Two or more sensors of different types may be used, or two or more sensors of the same type may be used.

For example, a capacitive touch sensor includes a pair of conductive layers. The pair of conductive layers is capacitively coupled. The capacitance between the pair of conductive layers changes when an object touches, presses, or approaches the pair of conductive layers. Utilizing this effect, sensing can be conducted.

Examples of the capacitive touch sensor are a surface capacitive touch sensor and a projected capacitive touch sensor. Examples of the projected capacitive touch sensor are a self-capacitive touch sensor and a mutual capacitive touch sensor, which differ mainly in the driving method. The use of the mutual capacitive touch sensor is preferable because simultaneous sensing of multiple points can be performed easily.

Instead of the touch panel 651 and the touch panel 652, a display panel which does not have a function of a touch sensor may be used.

For example, a flexible substrate is used as a substrate that supports a display element, a circuit for driving the display element, a circuit included in a touch sensor, and the like, whereby the touch panel 651, the touch panel 652, the display panel, the touch sensor, and the like can have flexibility. Using a flexible substrate in the touch panel 651 and the touch panel 652 is preferable because the electronic device 10 can become lightweight.

A typical example of a material of a flexible substrate is an organic resin. In addition, glass, metal, alloy, a semiconductor, or the like that is thin enough to have flexibility, or a composite material or a stacked material containing two or more of an organic resin, glass, metal, alloy, a semiconductor, and the like can be used.

The battery controller 673 can manage a charge state of the battery module 675. In addition, the battery controller 673 supplies power from the battery module 675 to the components. The power receiving portion 674 has a function of receiving power supplied from the outside and charging the battery module 675. The battery controller 673 can control the operation of the power receiving portion 674 depending on the charge state of the battery module 675.

The battery module 675 includes one or more primary batteries or secondary batteries, for example. Examples of the secondary battery which can be used for the battery module 675 include a lithium ion secondary battery and a lithium ion polymer secondary battery. In addition to such a battery, a protection circuit for preventing overcharge, overdischarge, and the like of the battery may be provided in the battery module 675.

In the case of indoor use or the like, an alternating-current (AC) power supply may be used as an external power supply. Particularly in the case of using the electronic device 10 separately from the external power supply, it is favorable that the battery module 675 have a large charge/discharge capacity which allows the electronic device 10 to be used for a long time. The battery module 675 may be charged using a battery charger capable of supplying power to the electronic device 10. At this time, charging may be performed through wires using a universal serial bus (USB) connector, an AC adaptor, or the like; alternatively, charging may be performed by a wireless power feeding method such as an electric field coupling method, an electromagnetic induction method, or an electromagnetic resonance (electromagnetic resonant coupling) method.

The battery controller 673 may include a battery management unit (BMU), for example. The BMU collects data on cell voltage or cell temperatures of the battery, monitors overcharge and overdischarge, controls a cell balancer, handles a deterioration state of the battery, calculates the remaining battery power level (state of charge: SOC), and controls detection of a failure, for example.

The battery controller 673 controls power transmission from the battery module 675 to the components through a power supply line (not shown). The battery controller 673 can include a power converter with a plurality of channels, an inverter, a protection circuit, and the like.

The battery module 675 preferably overlaps with the touch panel 651 or the touch panel 652. When the housing 11 incorporating the battery module 675 is flexible and can be used in a bent state, it is preferable that at least part of the battery module 675 be also flexible. Examples of the secondary battery which can be used for the battery module 675 include a lithium ion secondary battery and a lithium ion polymer secondary battery. It is preferable that a laminate pouch be used as an external package of the battery so that the battery has flexibility.

A film used for the laminate pouch is a single-layer film selected from a metal film (e.g., an aluminum film, a stainless steel film, and a nickel steel film), a plastic film made of an organic material, a hybrid material film containing an organic material (e.g., an organic resin or fiber) and an inorganic material (e.g., ceramic), and a carbon-containing inorganic film (e.g., a carbon film or a graphite film), or a stacked-layer film including two or more of the above films. A metal film can be easily embossed. Forming depressions or projections by embossing increases the surface area of the film exposed to outside air, achieving efficient heat dissipation.

It is particularly preferable that a laminate pouch including a metal film having depressions and projections by embossing be used, in which case a strain caused by stress applied to the laminate pouch can be relieved, leading to an effective decrease of defects such as a break of the laminate pouch due to bending of a secondary battery.

In addition, the battery controller 673 preferably has a function of reducing power consumption. For example, after detection of no input to the electronic device 10 for a given period, the battery controller 673 lowers clock frequency or stops input of clocks of the arithmetic portion 661, stops operation of the arithmetic portion 661 itself, stops operation of the auxiliary memory, or reduces power supplied to the components in order to reduce power consumption. Such a function is performed with the battery controller 673 alone or the battery controller 673 interlocking with the arithmetic portion 661.

The audio input portion 677 includes a microphone, an audio input connector, or the like. The audio output portion 678 includes a speaker, an audio output connector, or the like. The audio input portion 677 and the audio output portion 678 are connected to the sound controller 676, and are connected to the arithmetic portion 661 via the bus line 662. Audio data input to the audio input portion 677 is converted into a digital signal in the sound controller 676 and then processed in the sound controller 676 and the arithmetic portion 661. The sound controller 676 generates an analog audio signal audible to a user according to instructions from the arithmetic portion 661 and outputs the analog audio signal to the audio output portion 678. To the audio output connector of the audio output portion 678, an audio output device such as earphones, headphones, or a headset can be connected and a sound generated in the sound controller 676 is output to the device.

The communication module 681 can communicate via the antenna 682. For example, the communication module 681 controls a control signal for connecting the electronic device 10 to a computer network according to instructions from the arithmetic portion 661 and transmits the signal to the computer network. Accordingly, communication can be performed by connecting the electronic device 10 to a computer network such as the Internet, which is an infrastructure of the World Wide Web (WWW), an intranet, an extranet, a personal area network (PAN), a local area network (LAN), a campus area network (CAN), a metropolitan area network (MAN), a wide area network (WAN), or a global area network (GAN). When a plurality of communication methods are used, the electronic device 10 may have a plurality of antennas 682 for the communication methods.

For example, a high frequency circuit (RF circuit) is included in the communication module 681 for receiving and transmitting an RF signal. The RF circuit performs conversion between an electromagnetic signal and an electric signal in a frequency band which is set by a national law, and performs communication with another communication device wirelessly with the use of the electromagnetic signal. Several tens of kilohertz to several tens of gigahertz are a practical frequency band which is generally used. The RF circuit connected to the antenna 682 includes an RF circuit portion compatible with a plurality of frequency bands. The RF circuit portion can include an amplifier, a mixer, a filter, a DSP, an RF transceiver, or the like. The following communication protocol or communication technology for wireless communication can be used: a communications standard such as Long Term Evolution (LTE), Global System for Mobile Communication (GSM) (registered trademark), Enhanced Data Rates for GSM Evolution (EDGE), Code Division Multiple Access 2000 (CDMA2000), or Wideband Code Division Multiple Access (W-CDMA) (registered trademark), or a communications standard developed by IEEE such as Wi-Fi (registered trademark), Bluetooth (registered trademark), or ZigBee (registered trademark).

The communication module 681 may have a function of connecting the electronic device 10 to a telephone line. In the case of a telephone call through the telephone line, the communication module 681 controls a connection signal for connecting the electronic device 10 to the telephone line according to instructions from the arithmetic portion 661 and transmits the signal to the telephone line.

The communication module 681 may include a tuner generating an image signal from airwaves received by the antenna 682. The image signal is output to the touch panel 651 and the touch panel 652. The tuner can include a demodulation circuit, an analog-digital (AD) converter circuit, a decoder circuit, and the like. The demodulation circuit has a function of demodulating a signal received by the antenna 682. The AD converter circuit has a function of converting the demodulated analog signal into a digital signal. The decoder circuit has a function of decoding image data contained in the digital signal and generating a signal to be transmitted to the display controller 671.

Alternatively, a decoder may include a dividing circuit and a plurality of processors. The dividing circuit has a function of dividing the input image data spatiotemporally and outputting it to the processors. The plurality of processors decode the input image data and generate signals to be transmitted to the display controller 671. Since the decoder includes the plurality of processors which perform parallel data processing, image data containing enormous amounts of information can be decoded. Particularly in the case of displaying an image with resolution higher than the full high definition, a decoder circuit capable of decoding compressed data preferably includes a processor having extremely high-speed processing capability. The decoder circuit preferably includes a plurality of processors capable of performing 4 or more, preferably 8 or more, further preferably 16 or more parallel operations. The decoder may include a circuit for classifying an image signal contained in the input signal from other signals (e.g., text information, broadcast program information, and certification information).

The antenna 682 can receive airwaves such as a ground wave and a satellite wave. The antenna 682 can receive airwaves for analog broadcasting, digital broadcasting, and the like, and image-sound-only broadcasting, sound-only broadcasting, and the like. For example, the antenna 682 can receive airwaves transmitted in a certain frequency band, such as a UHF band (about 300 MHz to 3 GHz) or a VHF band (30 MHz to 300 MHz). When a plurality of pieces of data received in a plurality of frequency bands is used, the transfer rate can be increased, and thus, more information can be obtained. Accordingly, the touch panel 651 and the touch panel 652 can display an image with resolution higher than the full high definition, such as 4K2K, 8K4K, 16K8K, or higher.

Alternatively, the tuner may generate a signal using the broadcasting data transmitted with data transmission technology through a computer network. The signal is transmitted to the display controller 671. In the case where the tuner receives a digital signal, the tuner does not necessarily include the demodulation circuit and the AD converter circuit.

The attitude measurement portion 683 has a function of measuring a tilt, an attitude, and the like of the electronic device 10. For example, an acceleration sensor, an angular velocity sensor, a vibration sensor, a pressure sensor, a gyroscope sensor, or the like can be used for the attitude measurement portion 683. Alternatively, these sensors may be used in combination.

Examples of the external interface 685 include one or more buttons or switches (also referred to as housing switches) and an external port to which another input component can be connected which are provided on the housing 11. The external interface 685 is connected to the arithmetic portion 661 via the bus line 662. Examples of the housing switches include a switch associated with powering on/off, a button for adjusting volume, and a camera button.

The external port of the external interface 685 can be connected to an external device such as a computer or a printer through a cable. A USB terminal is a typical example. As the external port, a local area network (LAN) connection terminal, a digital broadcasting reception terminal, an AC adaptor connection terminal, or the like may be provided. A transceiver for optical communication, without limitation to wire communication, using infrared rays, visible light, ultraviolet rays, or the like, may be provided.

The camera module 686 is connected to the arithmetic portion 661 via the bus line 662. The camera module 686 can take a still image or a moving image in synchronization with pushing a switch provided on the housing or touching the touch panel 651 and the touch panel 652. The camera module 686 may include a light source for taking images. For example, a lamp such as a xenon lamp, and a light-emitting element such as an LED or an organic EL element can be used. Alternatively, the touch panel 651 and the touch panel 652 may be used as the light sources for taking images, in which case light of a variety of colors in addition to white may be used for taking images.

The vibration module 687 includes a vibrating element for vibrating the electronic device 10 and a vibration controller for controlling the vibrating element. As the vibrating element, an element capable of converting an electric signal or a magnetic signal into vibration, such as a vibration motor (eccentric motor), a resonant actuator, a magnetostrictive element, or a piezoelectric element can be used.

The vibration module 687 can vibrate the electronic device 10 with a variety of vibration patterns by controlling the number of vibrations, the amplitude, vibration time, and the like of the vibrating element according to instructions from the arithmetic portion 661. The vibration module 687 can generate vibration with a variety of vibration patterns based on operation executed by a variety of applications. Examples of such vibration include vibration linked with operation of the housing switch or the like, vibration linked with startup of the electronic device 10, vibration linked with a moving image or audio reproduced by an application for reproducing a moving image, vibration linked with reception of an e-mail, and vibration linked with input operation to the touch panels 651 and 652.

The sensor module 688 includes a sensor and a sensor controller. The sensor controller supplies electric power from the battery module 675 or the like to a sensor unit. Moreover, the sensor controller converts the input from the sensor unit into a control signal and outputs it to the arithmetic portion 661 via the bus line 662. The sensor controller may handle errors made by the sensor unit or may calibrate the sensor unit. Note that the sensor controller may include a plurality of controllers which control the sensor unit.

The sensor module 688 may include any of a variety of sensors which measure force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, and infrared rays.

The above is the description of the hardware structure examples of the electronic device 10.

At least part of this embodiment can be implemented in combination with any of the other embodiments described in this specification as appropriate.

Embodiment 3

An example of a display panel which can be used for a display portion or the like in the electronic device of one embodiment of the present invention is described below. The display panel described below as an example includes both a reflective liquid crystal element and a light-emitting element and can display an image in both the transmissive mode and the reflective mode.

Figure 9:
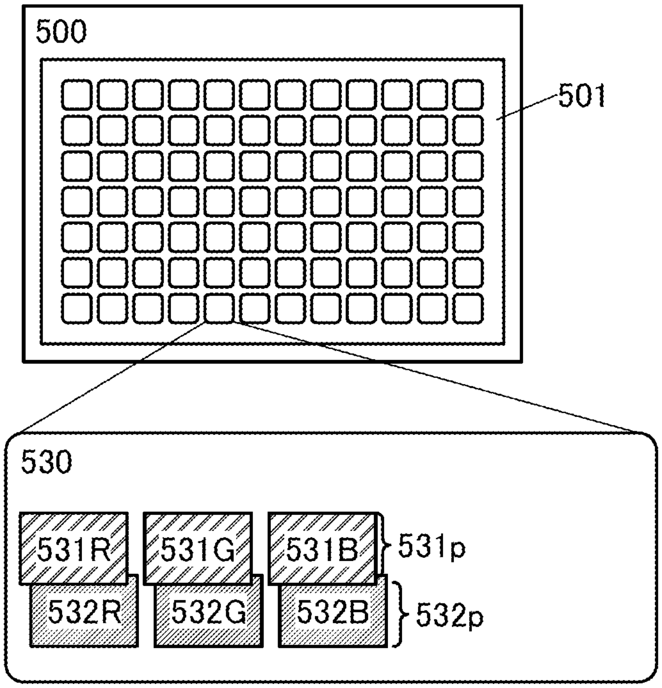
FIG. 9 is a block diagram illustrating an example of a display device.

FIG. 9 is a block diagram of a display device 500. The display device 500 includes a display portion 501.

The display portion 501 includes a plurality of pixel units 530 arranged in a matrix. The pixel units 530 each include a first pixel 531*p* and a second pixel 532*p*.

FIG. 9 shows an example where the first pixel 531*p* and the second pixel 532*p* each include display elements corresponding to three colors of red (R), green (G), and blue (B).

The display elements included in the first pixel 531*p* are each a display element that utilizes reflection of external light. The first pixel 531*p* includes a first display element 531R corresponding to red (R), a first display element 531G corresponding to green (G), and a first display element 531B corresponding to blue (B).

The display elements included in the second pixel 532*p* are each a light-emitting element. The second pixel 532*p* includes a second display element 532R corresponding to red (R), a second display element 532G corresponding to green (G), and a second display element 532B corresponding to blue (B).

Figure 10A:
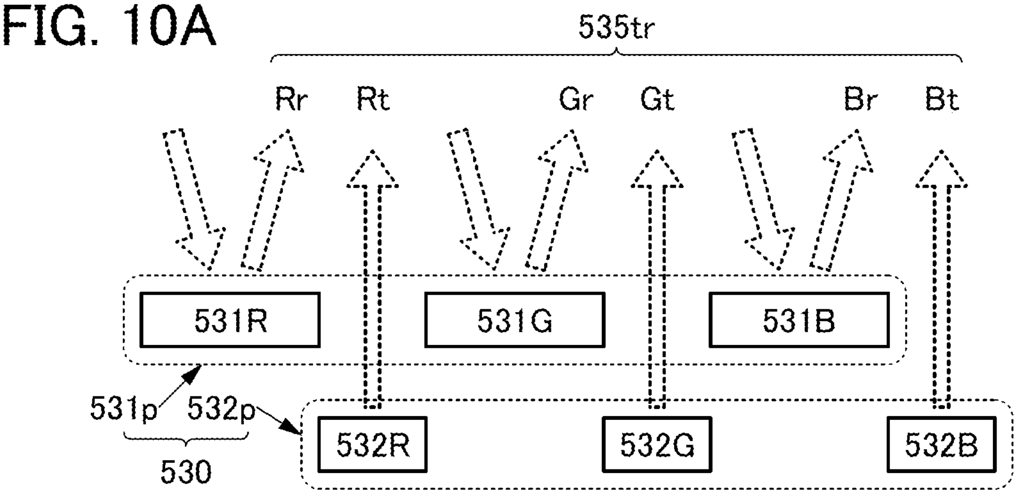
FIGS. 10A to 10C illustrate an example of a pixel unit.
Figure 10B:
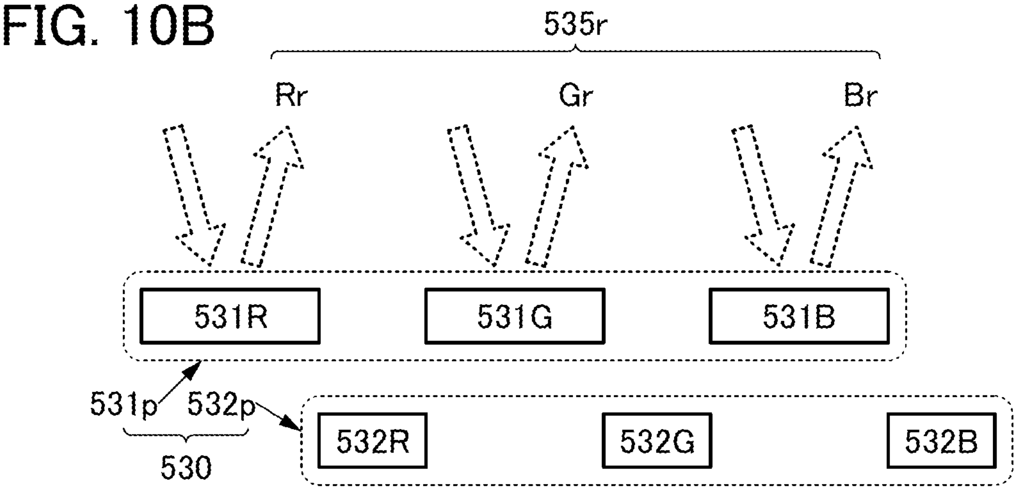
Figure 10C:
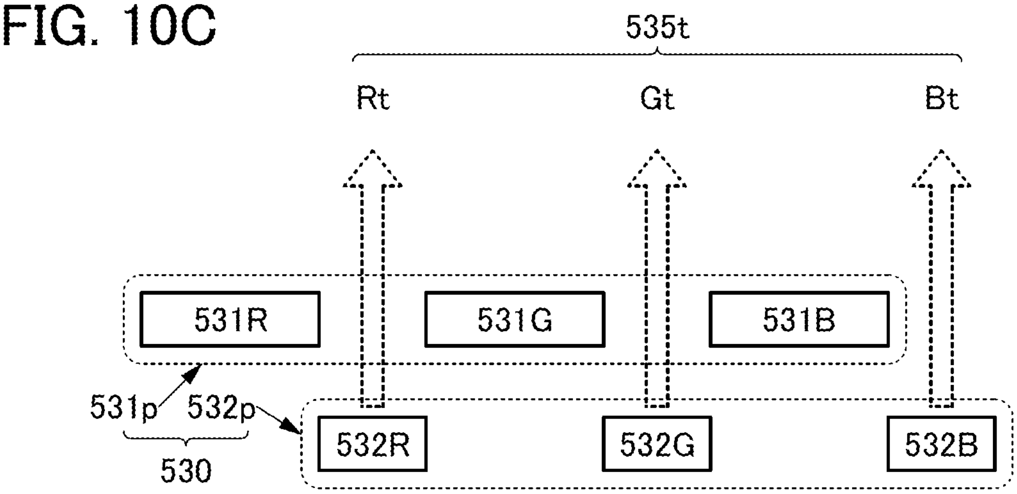

FIGS. 10A to 10C are schematic views illustrating a structure example of the pixel unit 530.

The first pixel 531*p* includes the first display element 531R, the first display element 531G, and the first display element 531B. The first display element 531R reflects external light and emits red light Rr to the display surface side. Similarly, the first display element 531G and the first display element 531B emit green light Gr and blue light Br, respectively, to the display surface side.

The second pixel 532*p* includes the second display element 532R, the second display element 532G, and the second display element 532B. The second display element 532R emits red light Rt to the display surface side. Similarly, the second display element 532G and the second display element 532B emit green light Gt and blue light Bt, respectively, to the display surface side.

FIG. 10A corresponds to a display mode (third mode) in which both the first pixel 531*p* and the second pixel 532*p* are driven. The pixel unit 530 can emit light 535*tr* of a predetermined color to the display surface side using the reflected light (the light Rr, the light Gr, and the light Br) and the transmitted light (the light Rt, the light Gt, and the light Bt).

FIG. 10B corresponds to a display mode (first mode) using reflected light in which only the first pixel 531*p* is driven. For example, when the intensity of external light is high enough, the pixel unit 530 can emit light 535*r* to the display surface side using only the light from the first pixel 531*p* (the light Rr, the light Gr, and the light Br), without driving the second pixel 532*p*. Thus, driving with extremely low power consumption can be performed.

FIG. 10C corresponds to a display mode (second mode) using generated light (transmitted light) in which only the second pixel 532*p* is driven. For example, when the intensity of external light is extremely low, the pixel unit 530 can emit light 535*t* to the display surface side using only the light from the second pixel 532*p* (the light Rt, the light Gt, and the light Bt), without driving the first pixel 531*p*. Thus, a vivid image can be displayed. Furthermore, by lowering the luminance in a dark environment, a user can be prevented from feeling glare and power consumption can be reduced.

The color and number of display elements included in the first pixel 531*p* and the second pixel 532*p* are not limited.

FIGS. 11A to 11C and FIGS. 12A to 12C each illustrate a structure example of the pixel unit 530. Although FIGS. 11A to 11C and FIGS. 12A to 12C are schematic views corresponding to the display mode (third mode) in which both the first pixel 531*p* and the second pixel 532*p* are driven, display can also be performed in the mode (first mode or second mode) in which only the first pixel 531*p* or the second pixel 532*p* is driven, like the above-described structure example.

Figure 11A:
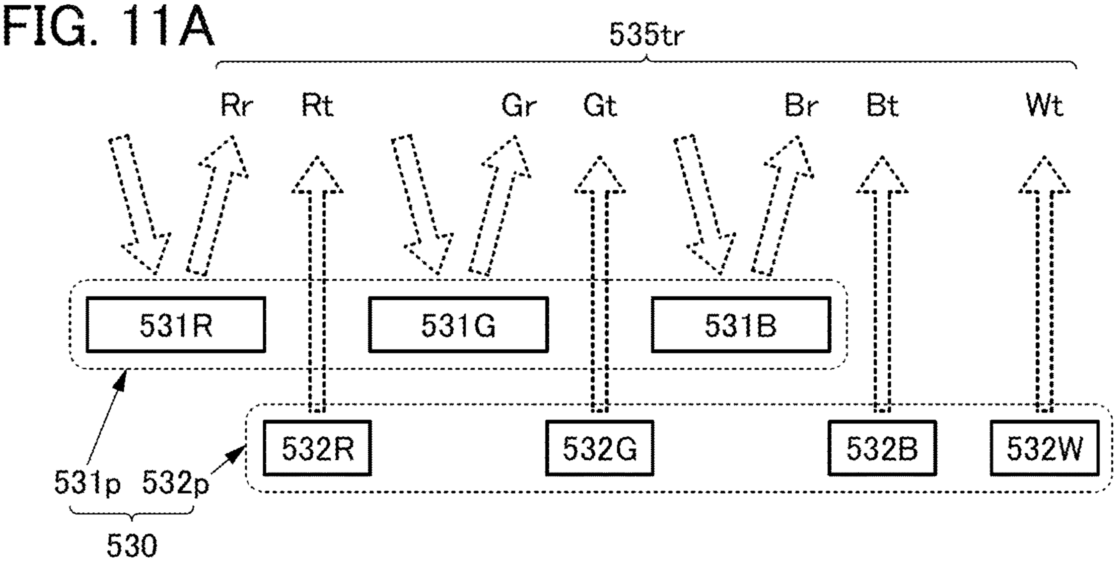
FIGS. 11A to 11C illustrate examples of a pixel unit.
Figure 11B:
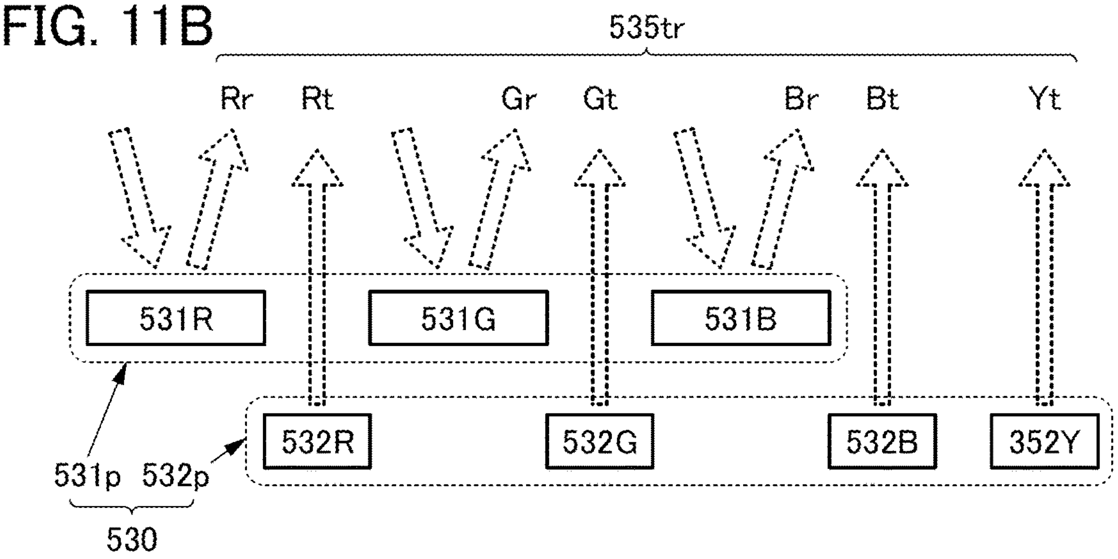
Figure 11C:
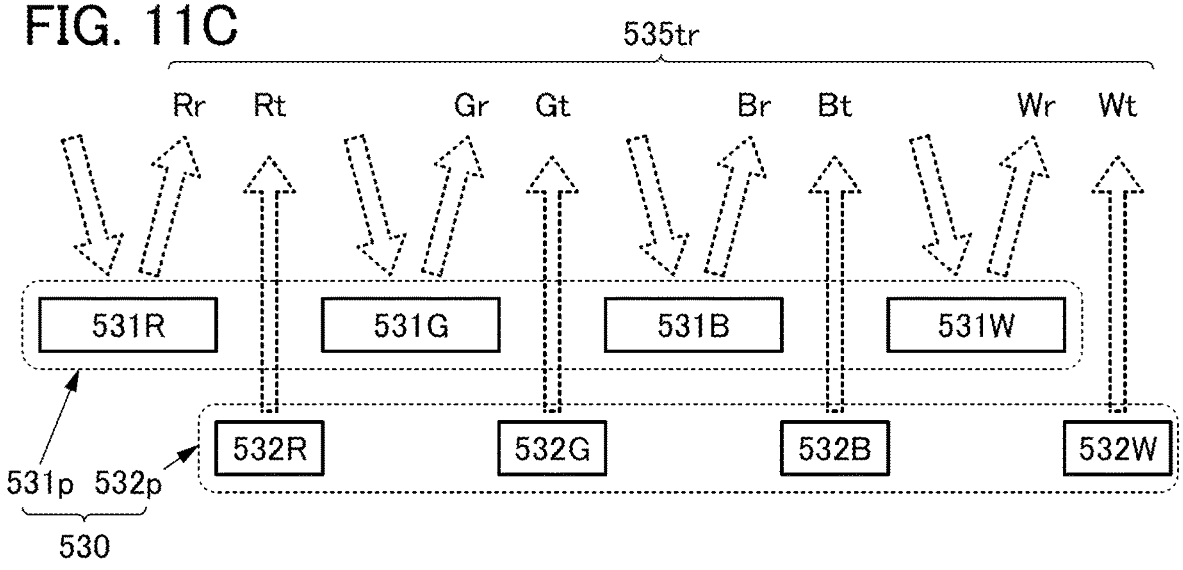
Figure 12A:
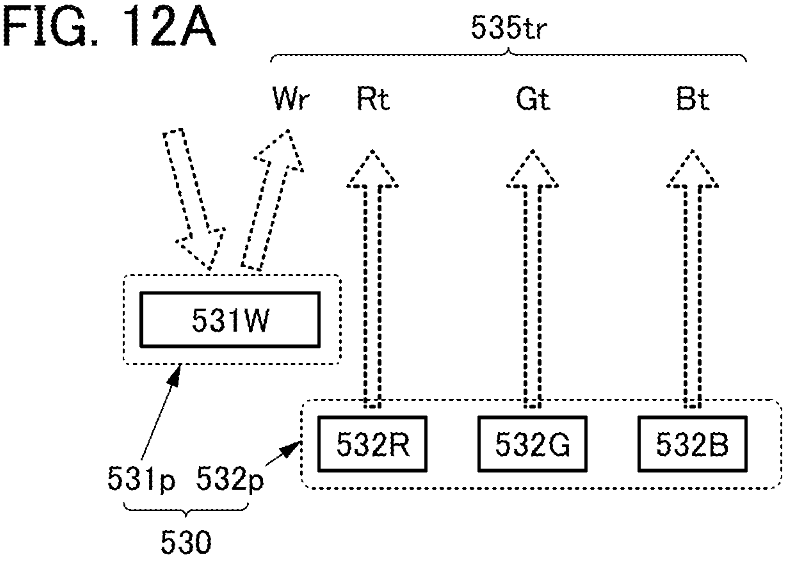
FIGS. 12A to 12C illustrate examples of a pixel unit.
Figure 12B:
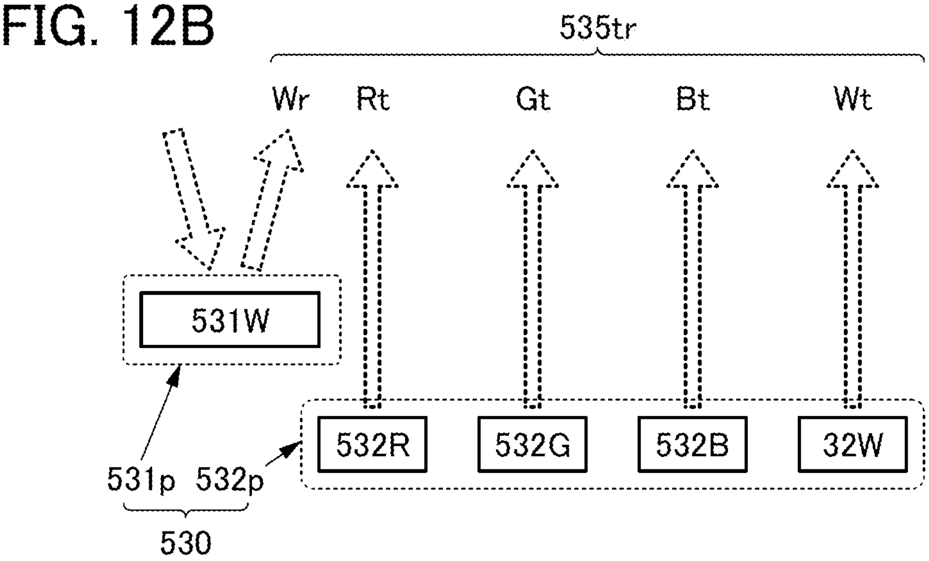

The second pixel 532*p* illustrated in FIGS. 11A and 11C and FIG. 12B includes a second display element 532W emitting white (W) light in addition to the second display element 532R, the second display element 532G, and the second display element 532B.

Figure 12C:
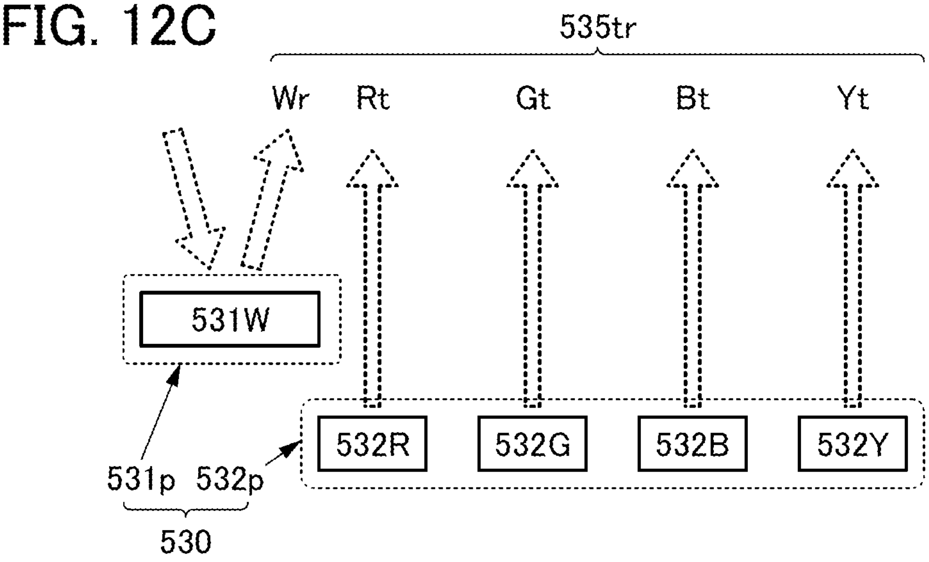

The second pixel 532*p* illustrated in FIG. 11B and FIG. 12C includes a second display element 532Y emitting yellow (Y) light in addition to the second display element 532R, the second display element 532G, and the second display element 532B.

Power consumption in the display mode using the second pixel 532*p* (second mode and third mode) can be lower in the structures illustrated in FIGS. 11A to 11C and FIGS. 12B and 12C than in the structure not including the second display element 532W or the second display element 532Y.

The first pixel 531*p* illustrated in FIG. 11C includes a first display element 531W emitting white (W) light in addition to the first display element 531R, the first display element 531G, and the first display element 531B.

Power consumption in the display mode using the first pixel 531*p* (first mode and third mode) can be lower in the structure illustrated in FIG. 11C than in the structure illustrated in FIG. 10A.

The first pixel 531*p* illustrated in FIGS. 12A to 12C includes only the first display element 531W emitting white (W) light. In this structure, a black and white image or a grayscale image can be displayed in the display mode (first mode) using only the first pixel 531*p*, and a color image can be displayed in the display mode (second mode and third mode) using the second pixel 532*p*.

This structure can increase the aperture ratio of the first pixel 531*p* and thus increase the reflectivity of the first pixel 531*p*; accordingly, a brighter image can be displayed.

The first mode is suitable for displaying data that need not be displayed in color such as text data.

At least part of this embodiment can be implemented in combination with any of the other embodiments described in this specification as appropriate.

Embodiment 4

In this embodiment, more specific examples of the display device described in Embodiment 2 will be described with reference to drawings.

Figure 13A:
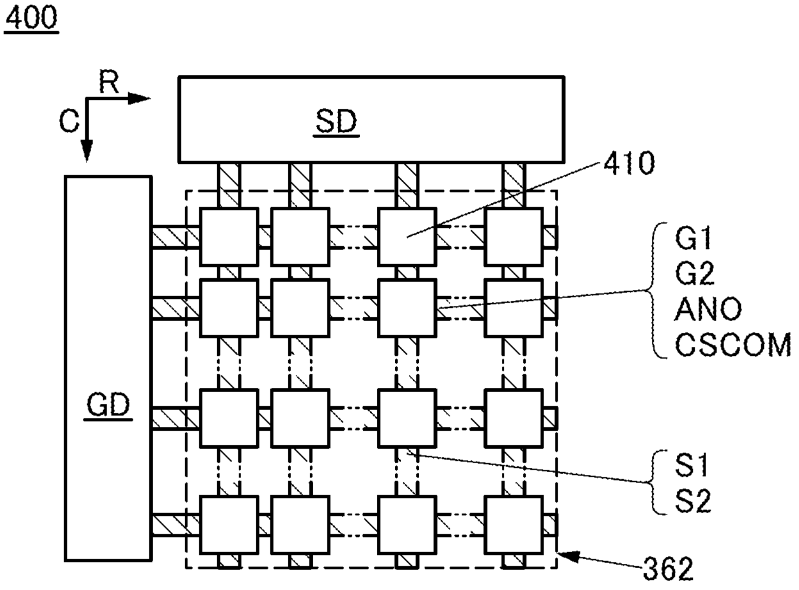
Figure 13A:
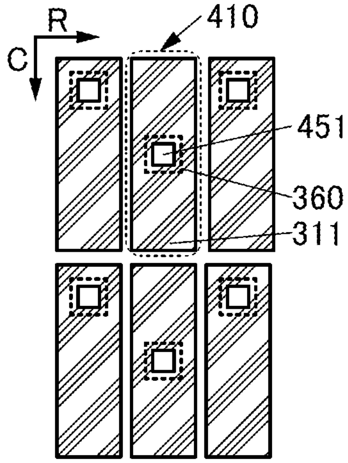
Figure 13A:
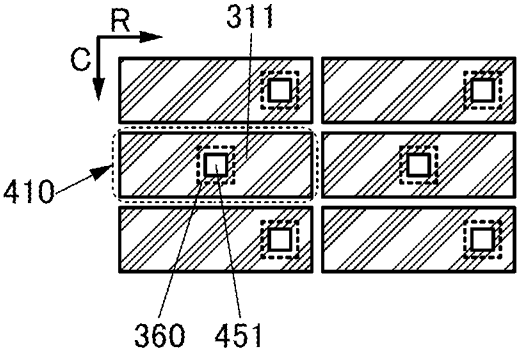
Figure 13A:
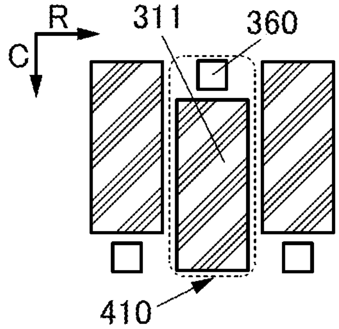
Figure 13A:
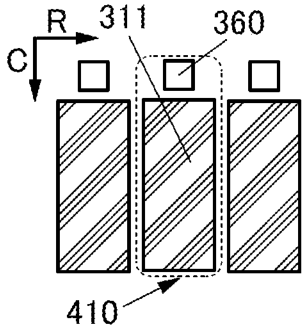

FIG. 13A is a block diagram of a display device 400. The display device 400 includes a display portion 362, a circuit GD, and a circuit SD. The display portion 362 includes a plurality of pixels 410 arranged in a matrix.

The display device 400 includes a plurality of wirings G1, a plurality of wirings G2, a plurality of wirings ANO, a plurality of wirings CSCOM, a plurality of wirings S1, and a plurality of wirings S2. The plurality of wirings G1, the plurality of wirings G2, the plurality of wirings ANO, and the plurality of wirings CSCOM are each electrically connected to the circuit GD and the plurality of pixels 410 arranged in a direction indicated by an arrow R. The plurality of wirings S1 and the plurality of wirings S2 are each electrically connected to the circuit SD and the plurality of pixels 410 arranged in a direction indicated by an arrow C.

Although the structure including one circuit GD and one circuit SD is illustrated here for simplicity, the circuit GD and the circuit SD for driving liquid crystal elements and the circuit GD and the circuit SD for driving light-emitting elements may be provided separately.

The pixels 410 each include a reflective liquid crystal element and a light-emitting element.

FIGS. 13B1, 13B2, 13B3, and 13B4 illustrate structure examples of an electrode 311 included in the pixel 410. The electrode 311 serves as a reflective electrode of the liquid crystal element. An opening 451 is provided in the electrode 311 in FIGS. 13B1 and 13B2.

In FIGS. 13B1 and 13B2, a light-emitting element 360 positioned in a region overlapping with the electrode 311 is indicated by a broken line. The light-emitting element 360 overlaps with the opening 451 included in the electrode 311. Thus, light from the light-emitting element 360 is emitted to the display surface side through the opening 451.

In FIG. 13B1, the pixels 410 which are adjacent in the direction indicated by the arrow R are pixels emitting light of different colors. As illustrated in FIG. 13B1, the openings 451 are preferably provided in different positions in the electrodes 311 so as not to be aligned in two adjacent pixels provided in the direction indicated by the arrow R. This allows two light-emitting elements 360 to be apart from each other, thereby preventing light emitted from the light-emitting element 360 from entering a coloring layer in the adjacent pixel 410 (such a phenomenon is referred to as crosstalk). Furthermore, since two adjacent light-emitting elements 360 can be arranged apart from each other, a high-resolution display device is achieved even when EL layers of the light-emitting elements 360 are separately formed with a shadow mask or the like.

In FIG. 13B2, the pixels 410 which are adjacent in a direction indicated by the arrow C are pixels emitting light of different colors. Also in FIG. 13B2, the openings 451 are preferably provided in different positions in the electrodes 311 so as not to be aligned in two adjacent pixels provided in the direction indicated by the arrow C.

As the ratio of the total area of the opening 451 to the total area except for the opening is smaller, display performed using the liquid crystal element can be brighter. Furthermore, as the ratio of the total area of the opening 451 to the total area except for the opening is larger, display performed using the light-emitting element 360 can be brighter.

The opening 451 may have a polygonal shape, a quadrangular shape, an elliptical shape, a circular shape, a cross-like shape, a stripe shape, a slit-like shape, or a checkered pattern, for example. The opening 451 may be provided close to the adjacent pixel. Preferably, the opening 451 is provided close to another pixel emitting light of the same color, in which case crosstalk can be suppressed.

As illustrated in FIGS. 13B3 and 13B4, a light-emitting region of the light-emitting element 360 may be positioned in a region where the electrode 311 is not provided, in which case light emitted from the light-emitting element 360 is emitted to the display surface side.

In FIG. 13B3, the light-emitting elements 360 are not aligned in two adjacent pixels 410 provided in the direction indicated by the arrow R. In FIG. 13B4, the light-emitting elements 360 are aligned in two adjacent pixels 410 provided in the direction indicated by the arrow R.

The structure illustrated in FIG. 13B3 can, as mentioned above, prevent crosstalk and increase the resolution because the light-emitting elements 360 included in two adjacent pixels 410 can be apart from each other. The structure illustrated in FIG. 13B4 can prevent light emitted from the light-emitting element 360 from being blocked by the electrode 311 because the electrode 311 is not positioned along a side of the light-emitting element 360 which is parallel to the direction indicated by the arrow C. Thus, high viewing angle characteristics can be achieved.

As the circuit GD, any of a variety of sequential circuits such as a shift register can be used. In the circuit GD, a transistor, a capacitor, and the like can be used. A transistor included in the circuit GD can be formed in the same steps as the transistors included in the pixels 410.

The circuit SD is electrically connected to the wirings S1. For example, an integrated circuit can be used as the circuit SD. Specifically, an integrated circuit formed on a silicon substrate can be used as the circuit SD.

For example, a chip on glass (COG) method, a COF method, or the like can be used to mount the circuit SD on a pad electrically connected to the pixels 410. Specifically, an anisotropic conductive film can be used to mount an integrated circuit on the pad.

Figure 14:
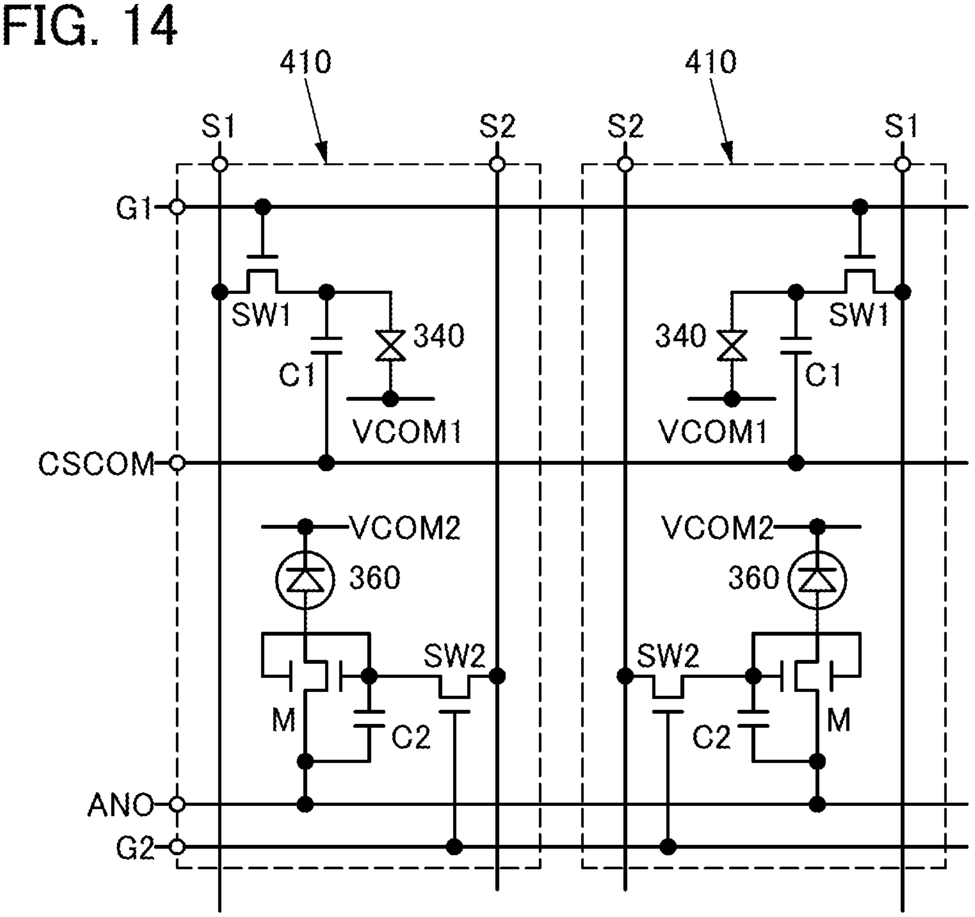
FIG. 14 is a circuit diagram illustrating an example of a pixel circuit of a display device.

FIG. 14 is an example of a circuit diagram of the pixels 410. FIG. 14 shows two adjacent pixels 410.

The pixels 410 each include a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 14 illustrates a wiring VCOM1 electrically connected to the liquid crystal element 340 and a wiring VCOM2 electrically connected to the light-emitting element 360.

FIG. 14 illustrates an example in which a transistor is used as each of the switches SW1 and SW2.

A gate of the switch SW1 is connected to the wiring G1. One of a source and a drain of the switch SW1 is connected to the wiring S1, and the other is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other is connected to one electrode of the capacitor C2 and gates of the transistor M. The other electrode of the capacitor C2 is connected to one of a source and a drain of the transistor M and the wiring ANO. The other of the source and the drain of the transistor M is connected to one electrode of the light-emitting element 360. Furthermore, the other electrode of the light-emitting element 360 is connected to the wiring VCOM2.

FIG. 14 illustrates an example where the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of liquid crystals of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 14, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 15A:
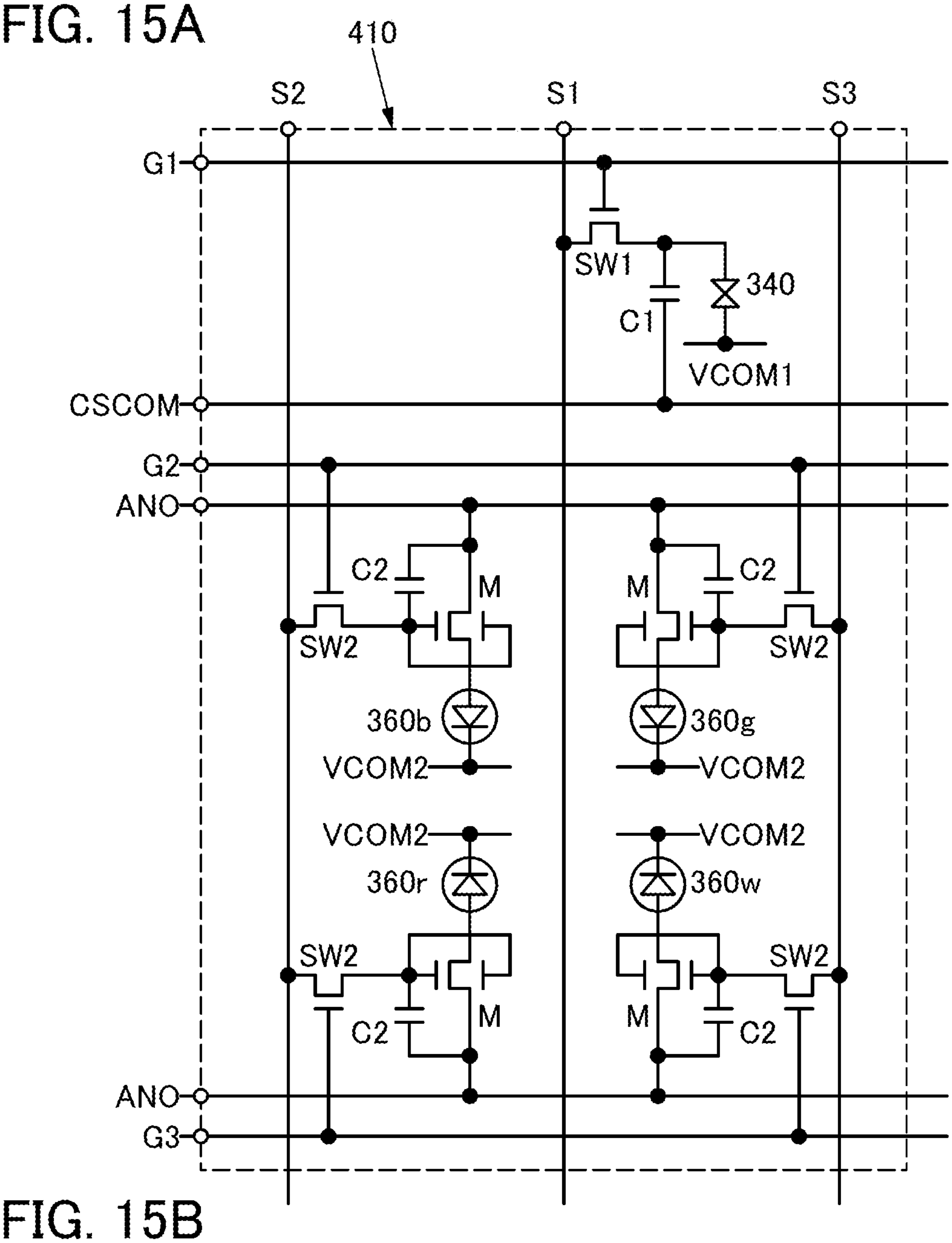
FIG. 15A is a circuit diagram illustrating an example of a pixel circuit of a display device.

Although FIG. 14 illustrates an example in which one liquid crystal element 340 and one light-emitting element 360 are provided in one pixel 410, one embodiment of the present invention is not limited thereto. FIG. 15A illustrates an example in which one liquid crystal element 340 and four light-emitting elements 360 (light-emitting elements 360*r*, 360*g*, 360*b*, and 360*w*) are provided in one pixel 410. The pixel 410 illustrated in FIG. 15A differs from that in FIG. 14 in being capable of performing full-color display with the use of the light-emitting elements by one pixel.

In FIG. 15A, in addition to the wirings in FIG. 14, a wiring G3 and a wiring S3 are connected to the pixel 410.

In the example in FIG. 15A, light-emitting elements emitting red light (R), green light (G), blue light (B), and white light (W) can be used as the four light-emitting elements 360, for example. Furthermore, as the liquid crystal element 340, a reflective liquid crystal element emitting white light can be used. Thus, in the case of performing display in the reflective mode, white display with high reflectivity can be performed. In the case of performing display in the transmissive mode, images can be displayed with a higher color rendering property at low power consumption.

Figure 15B:
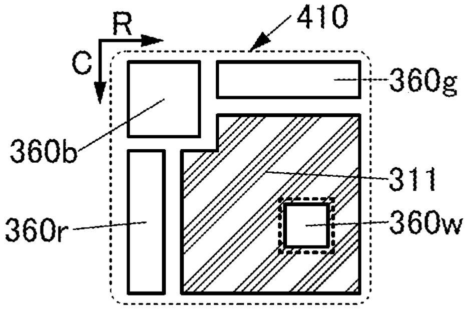
FIG. 15B illustrates an example of a pixel.

FIG. 15B illustrates a structure example of the pixel 410 corresponding to FIG. 15A. The pixel 410 includes the light-emitting element 360*w* overlapping with the opening included in the electrode 311 and the light-emitting element 360*r*, the light-emitting element 360*g*, and the light-emitting element 360*b* which are arranged in the periphery of the electrode 311. It is preferable that the light-emitting elements 360*r*, 360*g*, and 360*b* have almost the same light-emitting area.

At least part of this embodiment can be implemented in combination with any of the other embodiments described in this specification as appropriate.

Embodiment 5

In this embodiment, specific structure examples of the display device described in Embodiments 2 and 3 will be described with reference to drawings.

Structure Example 1

Figure 16:
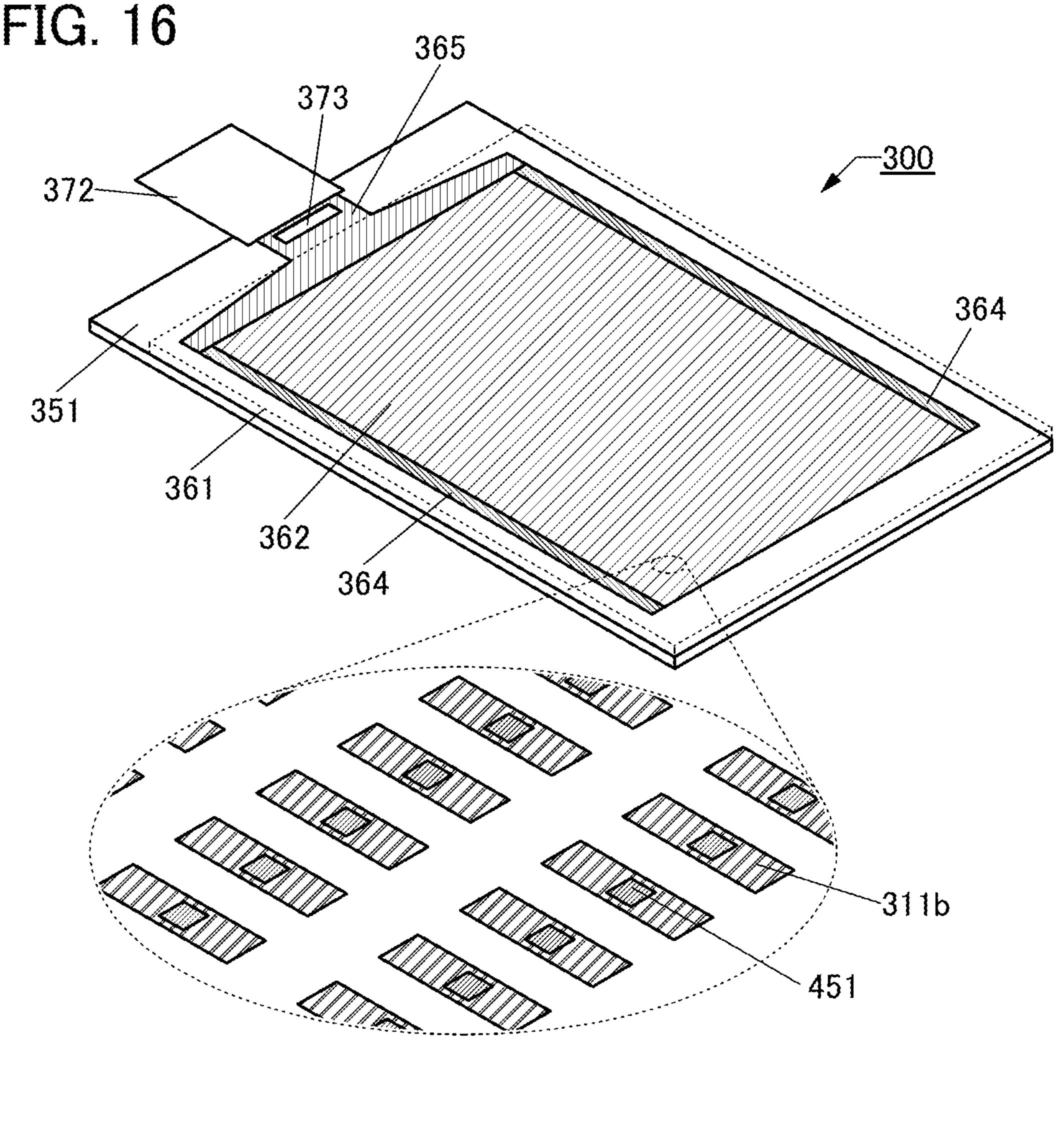
FIG. 16 is a perspective view illustrating an example of a display device.

FIG. 16 is a schematic perspective view of a display device 300. In the display device 300, the substrate 351 and the substrate 361 are bonded to each other. In FIG. 16, the substrate 361 is denoted by a dashed line.

The display device 300 includes a display portion 362, a circuit 364, a wiring 365, and the like. FIG. 16 illustrates an example in which the display device 300 is provided with an integrated circuit (IC) 373 and an FPC 372. Thus, the structure illustrated in FIG. 16 can be regarded as a display module including the display device 300, the IC, and the FPC.

As the circuit 364, for example, a scan line driver circuit can be used.

The wiring 365 has a function of supplying a signal and power to the display portion 362 and the circuit 364. The signal and power are input to the wiring 365 from the outside through the FPC 372 or from the IC 373.

FIG. 16 illustrates an example in which the IC 373 is provided over the substrate 351 by a chip on glass (COG) method, a chip on film (COF) method, or the like. An IC including a scan line driver circuit, a signal line driver circuit, or the like can be used as the IC 373, for example. Note that the display device 300 and the display module are not necessarily provided with an IC. The IC may be provided over the FPC by a COF method or the like.

FIG. 16 illustrates an enlarged view of part of the display portion 362. Electrodes 311*b* included in a plurality of display elements are arranged in a matrix in the display portion 362. The electrode 311*b* has a function of reflecting visible light, and serves as a reflective electrode of the liquid crystal element 180.

As illustrated in FIG. 16, the electrode 311*b* includes an opening 451. In addition, the display portion 362 includes the light-emitting element 170 that is positioned closer to the substrate 351 than the electrode 311*b*. Light from the light-emitting element 170 is emitted to the substrate 361 side through the opening 451 in the electrode 311*b*. The area of the light-emitting region of the light-emitting element 170 may be equal to the area of the opening 451. One of the area of the light-emitting region of the light-emitting element 170 and the area of the opening 451 is preferably larger than the other because a margin for misalignment can be increased. It is particularly preferable that the area of the opening 451 be larger than the area of the light-emitting region of the light-emitting element 170. When the area of the opening 451 is small, part of light from the light-emitting element 170 is blocked by the electrode 311*b* and cannot be extracted to the outside, in some cases. The opening 451 with a sufficiently large area can reduce waste of light emitted from the light-emitting element 170.

Figure 17:
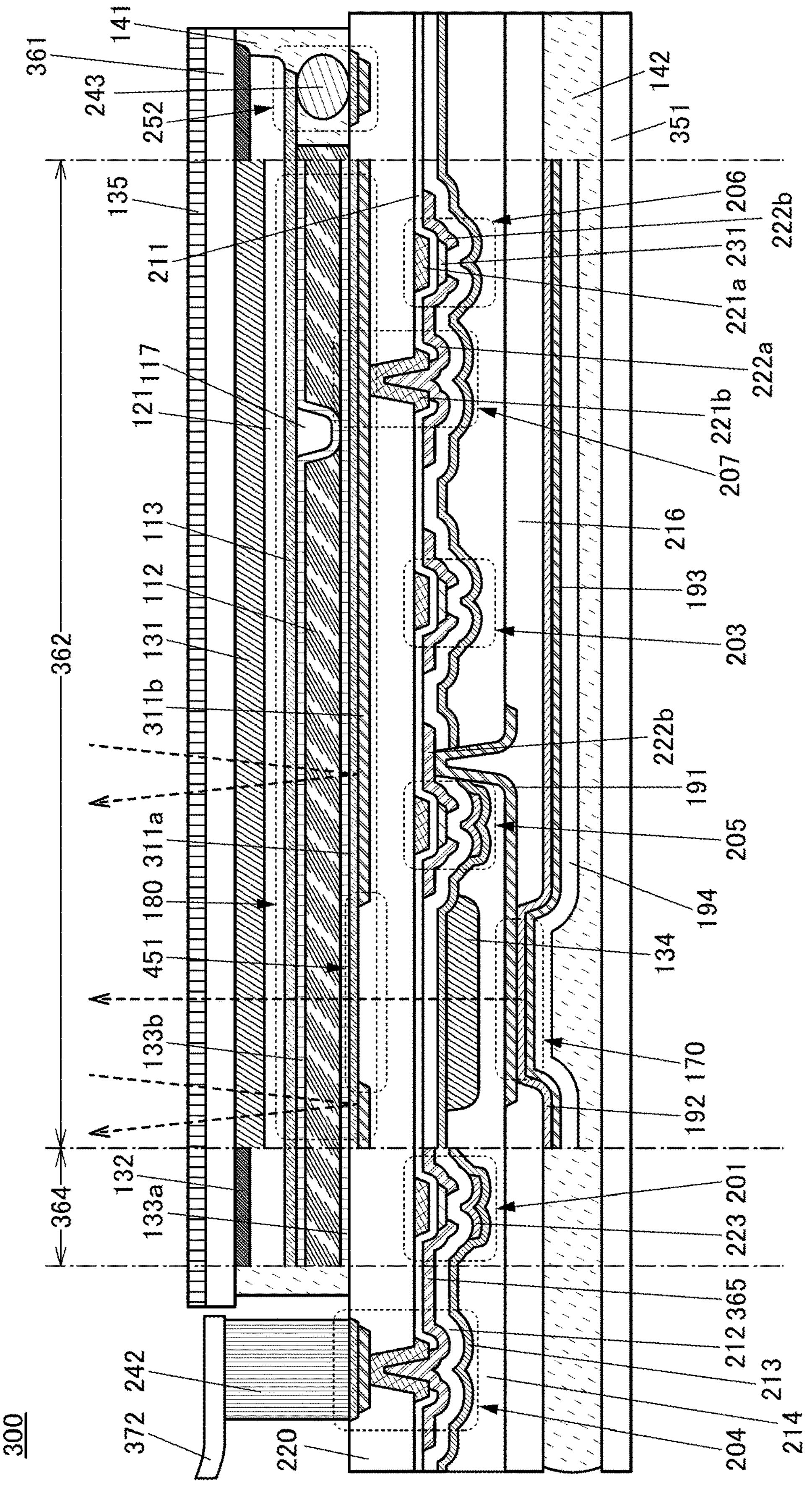
FIG. 17 is a cross-sectional view illustrating an example of a display device.

FIG. 17 illustrates an example of cross-sections of part of a region including the FPC 372, part of a region including the circuit 364, and part of a region including the display portion 362 of the display device 300 illustrated in FIG. 16.

The display device 300 illustrated in FIG. 17 includes a transistor 201, a transistor 203, a transistor 205, a transistor 206, the liquid crystal element 180, the light-emitting element 170, the insulating layer 220, a coloring layer 131, a coloring layer 134, and the like, between the substrate 351 and the substrate 361. The substrate 361 and the insulating layer 220 are bonded to each other with an adhesive layer 141. The substrate 351 and the insulating layer 220 are bonded to each other with the adhesive layer 142.

The substrate 361 is provided with the coloring layer 131, a light-blocking layer 132, an insulating layer 121, the electrode 113 functioning as a common electrode of the liquid crystal element 180, the alignment film 133*b*, an insulating layer 117, and the like. A polarizing plate 135 is provided on an outer surface of the substrate 361. The insulating layer 121 may have a function of a planarization layer. The insulating layer 121 enables the electrode 113 to have an almost flat surface, resulting in a uniform alignment state of a liquid crystal layer 112. The insulating layer 117 serves as a spacer for holding a cell gap of the liquid crystal element 180. In the case where the insulating layer 117 transmits visible light, the insulating layer 117 may be positioned to overlap with a display region of the liquid crystal element 180.

The liquid crystal element 180 is a reflective liquid crystal element. The liquid crystal element 180 has a stacked-layer structure of an electrode 311*a*, the liquid crystal layer 112, and the electrode 113. The electrode 311*b* that reflects visible light is provided in contact with a surface of the electrode 311*a* on the substrate 351 side. The electrode 311*b* includes the opening 451. The electrode 311*a* and the electrode 113 transmit visible light. The alignment film 133*a* is provided between the liquid crystal layer 112 and the electrode 311*a*. The alignment film 133*b* is provided between the liquid crystal layer 112 and the electrode 113.

In the liquid crystal element 180, the electrode 311*b* has a function of reflecting visible light, and the electrode 113 has a function of transmitting visible light. Light entering from the substrate 361 side is polarized by the polarizing plate 135, transmitted through the electrode 113 and the liquid crystal layer 112, and reflected by the electrode 311*b*. Then, the light is transmitted through the liquid crystal layer 112 and the electrode 113 again to reach the polarizing plate 135. In this case, alignment of a liquid crystal can be controlled with a voltage that is applied between the electrode 311*b* and the electrode 113, and thus optical modulation of light can be controlled. In other words, the intensity of light emitted through the polarizing plate 135 can be controlled. Light excluding light in a particular wavelength region is absorbed by the coloring layer 131, and thus, emitted light is red light, for example.

As illustrated in FIG. 17, the electrode 311*a* that transmits visible light is preferably provided across the opening 451. Accordingly, liquid crystals in the liquid crystal layer 112 are aligned in a region overlapping with the opening 451 as in the other regions, in which case an alignment defect of the liquid crystals is prevented from being generated in a boundary portion of these regions and undesired light leakage can be suppressed.

At a connection portion 207, the electrode 311*b* is electrically connected to a conductive layer 222*a* included in the transistor 206 via a conductive layer 221*b*. The transistor 206 has a function of controlling the driving of the liquid crystal element 180.

A connection portion 252 is provided in part of a region where the adhesive layer 141 is provided. In the connection portion 252, a conductive layer obtained by processing the same conductive film as the electrode 311*a* is electrically connected to part of the electrode 113 with the connector 243. Accordingly, a signal or a potential input from the FPC

372 connected to the substrate 351 side can be supplied to the electrode 113 formed on the substrate 361 side through the connection portion 252.

As the connector 243, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. A material capable of elastic deformation or plastic deformation is preferably used for the connector 243. As illustrated in FIG. 17, the connector 243, which is the conductive particle, has a shape that is vertically crushed in some cases. With the crushed shape, the contact area between the connector 243 and a conductive layer electrically connected to the connector 243 can be increased, thereby reducing contact resistance and suppressing the generation of problems such as disconnection.

The connector 243 is preferably provided so as to be covered with the adhesive layer 141. For example, the connectors 243 are dispersed in the adhesive layer 141 before curing of the adhesive layer 141.

The light-emitting element 170 is a bottom-emission light-emitting element. The light-emitting element 170 has a stacked-layer structure in which the electrode 191, the EL layer 192, and the electrode 193 are stacked in this order from the insulating layer 220 side. The electrode 191 is connected to a conductive layer 222*b* included in the transistor 205 through an opening provided in the insulating layer 214. The transistor 205 has a function of controlling the driving of the light-emitting element 170. The insulating layer 216 covers an end portion of the electrode 191. The electrode 193 includes a material that reflects visible light, and the electrode 191 includes a material that transmits visible light. The insulating layer 194 is provided to cover the electrode 193. Light is emitted from the light-emitting element 170 to the substrate 361 side through the coloring layer 134, the insulating layer 220, the opening 451, the electrode 311*a*, and the like.

The liquid crystal element 180 and the light-emitting element 170 can exhibit various colors when the color of the coloring layer varies among pixels. The display device 300 can display a color image using the liquid crystal element 180. The display device 300 can display a color image using the light-emitting element 170.

The transistor 201, the transistor 203, the transistor 205, and the transistor 206 are formed on a plane of the insulating layer 220 on the substrate 351 side. These transistors can be fabricated through the same process.

The transistor 203 is used for controlling whether the pixel is selected or not (such a transistor is also referred to as a switching transistor or a selection transistor). The transistor 205 is used for controlling a current flowing to the light-emitting element 170 (such a transistor is also referred to as a driving transistor).

Insulating layers such as an insulating layer 211, an insulating layer 212, an insulating layer 213, and the insulating layer 214 are provided on the substrate 351 side of the insulating layer 220. Part of the insulating layer 211 functions as a gate insulating layer of each transistor. The insulating layer 212 is provided to cover the transistor 206 and the like. The insulating layer 213 is provided to cover the transistor 205 and the like. The insulating layer 214 functions as a planarization layer. Note that the number of insulating layers covering the transistor is not limited and may be one or two or more.

A material through which impurities such as water or hydrogen do not easily diffuse is preferably used for at least one of the insulating layers that cover the transistors. This is because such an insulating layer can serve as a barrier film. Such a structure can effectively suppress diffusion of the impurities into the transistors from the outside, and a highly reliable display device can be provided.

Each of the transistors 201, 203, 205, and 206 includes a conductive layer 221*a* functioning as a gate, the insulating layer 211 functioning as the gate insulating layer, the conductive layer 222*a* and the conductive layer 222*b* functioning as a source and a drain, and a semiconductor layer 231. Here, a plurality of layers obtained by processing the same conductive film are shown with the same hatching pattern.

The transistor 201 and the transistor 205 each include a conductive layer 223 functioning as a gate, in addition to the components of the transistor 203 or the transistor 206.

The structure in which the semiconductor layer where a channel is formed is provided between two gates is used as an example of the transistors 201 and 205. Such a structure enables the control of the threshold voltages of transistors. The two gates may be connected to each other and supplied with the same signal to operate the transistors. Such transistors can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of increase in size or definition.

Alternatively, by supplying a potential for controlling the threshold voltage to one of the two gates and a potential for driving to the other, the threshold voltage of the transistors can be controlled.

There is no limitation on the structure of the transistors included in the display device. The transistor included in the circuit 364 and the transistor included in the display portion 362 may have the same structure or different structures. A plurality of transistors included in the circuit 364 may have the same structure or a combination of two or more kinds of structures. Similarly, a plurality of transistors included in the display portion 362 may have the same structure or a combination of two or more kinds of structures.

It is preferable to use a conductive material containing an oxide for the conductive layer 223. A conductive film used for the conductive layer 223 is formed under an atmosphere containing oxygen, whereby oxygen can be supplied to the insulating layer 212. The proportion of an oxygen gas in a deposition gas is preferably higher than or equal to 90% and lower than or equal to 100%. Oxygen supplied to the insulating layer 212 is then supplied to the semiconductor layer 231 by later heat treatment; as a result, oxygen vacancies in the semiconductor layer 231 can be reduced.

It is particularly preferable to use a low-resistance oxide semiconductor for the conductive layer 223. In that case, an insulating film that releases hydrogen, such as a silicon nitride film, is preferably used for the insulating layer 213, for example, because hydrogen can be supplied to the conductive layer 223 during the formation of the insulating layer 213 or by heat treatment performed after the formation of the insulating layer 213, which leads to an effective reduction in the electric resistance of the conductive layer 223.

The coloring layer 134 is provided in contact with the insulating layer 213. The coloring layer 134 is covered with the insulating layer 214.

A connection portion 204 is provided in a region where the substrate 351 does not overlap with the substrate 361. In the connection portion 204, the wiring 365 is electrically connected to the FPC 372 via a connection layer 242. The connection portion 204 has a similar structure to the connection portion 207. On the top surface of the connection portion 204, a conductive layer obtained by processing the same conductive film as the electrode 311*a* is exposed. Thus, the connection portion 204 and the FPC 372 can be electrically connected to each other via the connection layer 242.

As the polarizing plate 135 provided on the outer surface of the substrate 361, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 180 are controlled depending on the kind of the polarizing plate so that desirable contrast is obtained.

Note that a variety of optical members can be arranged on the outer surface of the substrate 361. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, or the like may be arranged on the outer surface of the substrate 361.

For each of the substrates 351 and 361, glass, quartz, ceramic, sapphire, an organic resin, or the like can be used. When the substrates 351 and 361 are formed using a flexible material, the flexibility of the display device can be increased.

A liquid crystal element having, for example, a vertical alignment (VA) mode can be used as the liquid crystal element 180. Examples of the vertical alignment mode include a multi-domain vertical alignment (MVA) mode, a patterned vertical alignment (PVA) mode, and an advanced super view (ASV) mode.

A liquid crystal element having a variety of modes can be used as the liquid crystal element 180. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The liquid crystal element is an element that controls transmission or non-transmission of light utilizing an optical modulation action of the liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode or design to be used.

To control the alignment of the liquid crystal, the alignment films can be provided. In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which several weight percent or more of a chiral material is mixed is used for the liquid crystal in order to improve the temperature range. The liquid crystal composition that includes a liquid crystal exhibiting a blue phase and a chiral material has a short response time and has optical isotropy. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where the reflective liquid crystal element is used, the polarizing plate 135 is provided on the display surface side. In addition, a light diffusion plate is preferably provided on the display surface side to improve visibility.

A front light may be provided on the outer side of the polarizing plate 135. As the front light, an edge-light front light is preferably used. A front light including a light-emitting diode (LED) is preferably used to reduce power consumption.

As the adhesive layer, any of a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

As the connection layer 242, an anisotropic conductive film (ACF), an anisotropic conductive paste (ACP), or the like can be used.

The light-emitting element 170 may be a top emission, bottom emission, or dual emission light-emitting element, or the like. A conductive film that transmits visible light is used as the electrode through which light is extracted. A conductive film that reflects visible light is preferably used as the electrode through which light is not extracted.

The EL layer 192 includes at least a light-emitting layer. In addition to the light-emitting layer, the EL layer 192 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer 192, and an inorganic compound may also be included. The layers included in the EL layer 192 can be formed by any of the following methods: an evaporation method (including a vacuum evaporation method), a transfer method, a printing method, an inkjet method, a coating method, and the like.

The EL layer 192 may contain an inorganic compound such as quantum dots. When quantum dots are used for the light-emitting layer, quantum dots can function as light-emitting materials, for example.

With the use of the combination of a color filter (coloring layer) and a microcavity structure (optical adjustment layer), light with high color purity can be extracted from the display device. The thickness of the optical adjustment layer varies depending on the color of the pixel.

As materials of a gate, a source, and a drain of a transistor, and a conductive layer such as a wiring or an electrode included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stacked film of any of the above materials can be used for the conductive layers. For example, a stacked film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

Examples of an insulating material that can be used for the insulating layers include a resin such as acrylic or epoxy resin, and an inorganic insulating material such as silicon oxide, silicon oxynitride, silicon nitride oxide, silicon nitride, or aluminum oxide.

Examples of a material that can be used for the coloring layers include a metal material, a resin material, and a resin material containing a pigment or dye.

Structure Example 2

Figure 18:
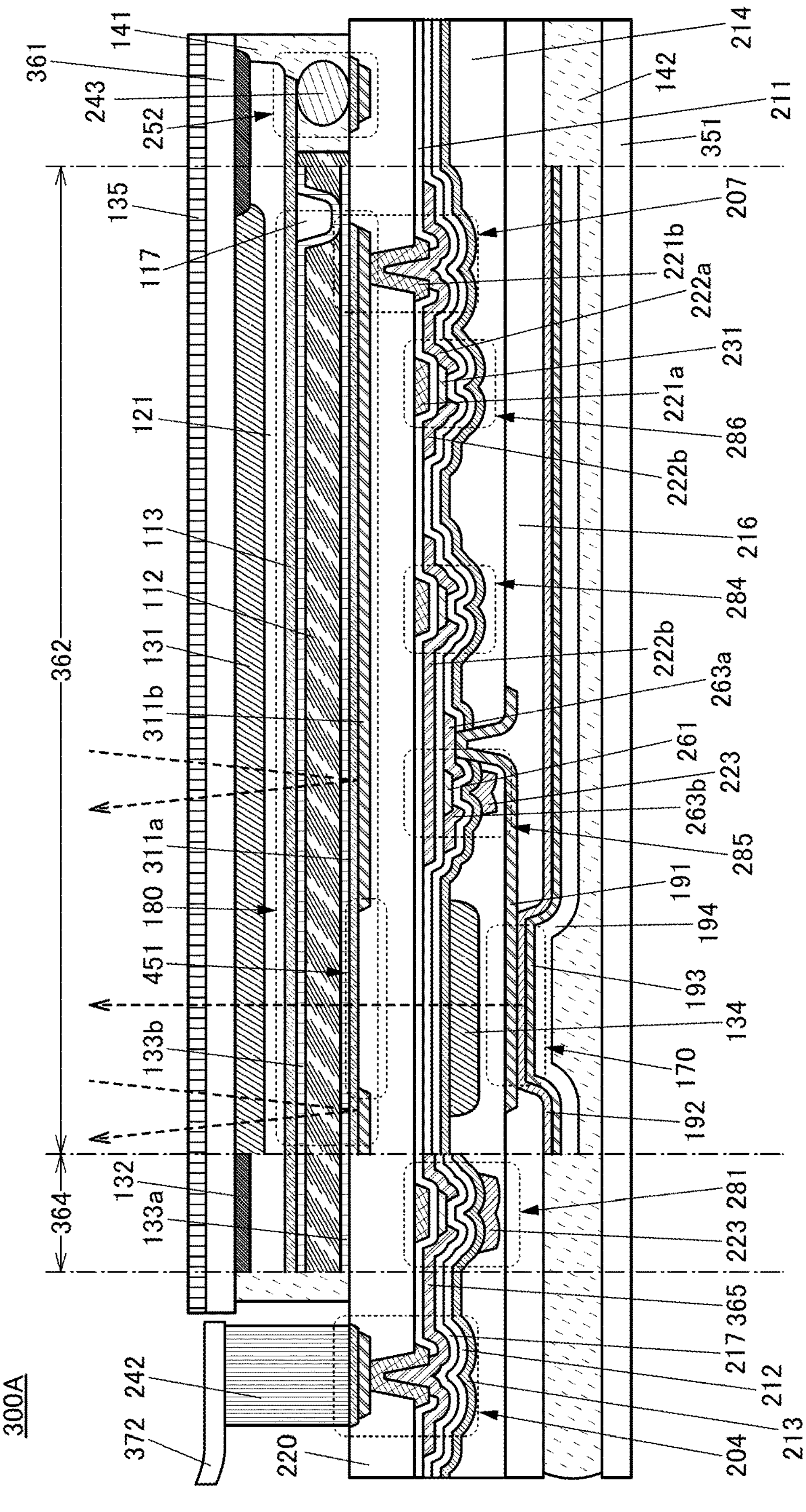
FIG. 18 is a cross-sectional view illustrating an example of a display device.

A display device 300A illustrated in FIG. 18 is different from the display device 300 mainly in that a transistor 281, a transistor 284, a transistor 285, and a transistor 286 are included instead of the transistor 201, the transistor 203, the transistor 205, and the transistor 206.

Note that the positions of the insulating layer 117, the connection portion 207, and the like in FIG. 18 are different from those in FIG. 17. FIG. 18 illustrates an end portion of a pixel. The insulating layer 117 is provided so as to overlap with an end portion of the coloring layer 131 and an end portion of the light-blocking layer 132. As in this structure, the insulating layer 117 may be provided in a region not overlapping with a display region (or in a region overlapping with the light-blocking layer 132).

Two transistors included in the display device may partly overlap with each other like the transistor 284 and the transistor 285. In that case, the area occupied by a pixel circuit can be reduced, leading to an increase in resolution. Furthermore, the light-emitting area of the light-emitting element 170 can be increased, leading to an improvement in aperture ratio. The light-emitting element 170 with a high aperture ratio requires low current density to obtain necessary luminance; thus, the reliability is improved.

Each of the transistors 281, 284, and 286 includes the conductive layer 221*a*, the insulating layer 211, the semiconductor layer 231, the conductive layer 222*a*, and the conductive layer 222*b*. The conductive layer 221*a* overlaps with the semiconductor layer 231 with the insulating layer 211 positioned therebetween. The conductive layer 222*a* and the conductive layer 222*b* are electrically connected to the semiconductor layer 231. The transistor 281 includes the conductive layer 223.

The transistor 285 includes the conductive layer 222*b*, an insulating layer 217, a semiconductor layer 261, the conductive layer 223, the insulating layer 212, the insulating layer 213, a conductive layer 263*a*, and a conductive layer 263*b*. The conductive layer 222*b* overlaps with the semiconductor layer 261 with the insulating layer 217 positioned therebetween. The conductive layer 223 overlaps with the semiconductor layer 261 with the insulating layers 212 and 213 positioned therebetween. The conductive layer 263*a* and the conductive layer 263*b* are electrically connected to the semiconductor layer 261.

The conductive layer 221*a* functions as a gate. The insulating layer 211 functions as a gate insulating layer. The conductive layer 222*a* functions as one of a source and a drain. The conductive layer 222*b* included in the transistor 286 functions as the other of the source and the drain.

The conductive layer 222*b* shared by the transistor 284 and the transistor 285 has a portion functioning as the other of a source and a drain of the transistor 284 and a portion functioning as a gate of the transistor 285. The insulating layer 217, the insulating layer 212, and the insulating layer 213 function as gate insulating layers. One of the conductive layer 263*a* and the conductive layer 263*b* functions as a source and the other functions as a drain. The conductive layer 223 functions as a gate.

Structure Example 3

Figure 19A:
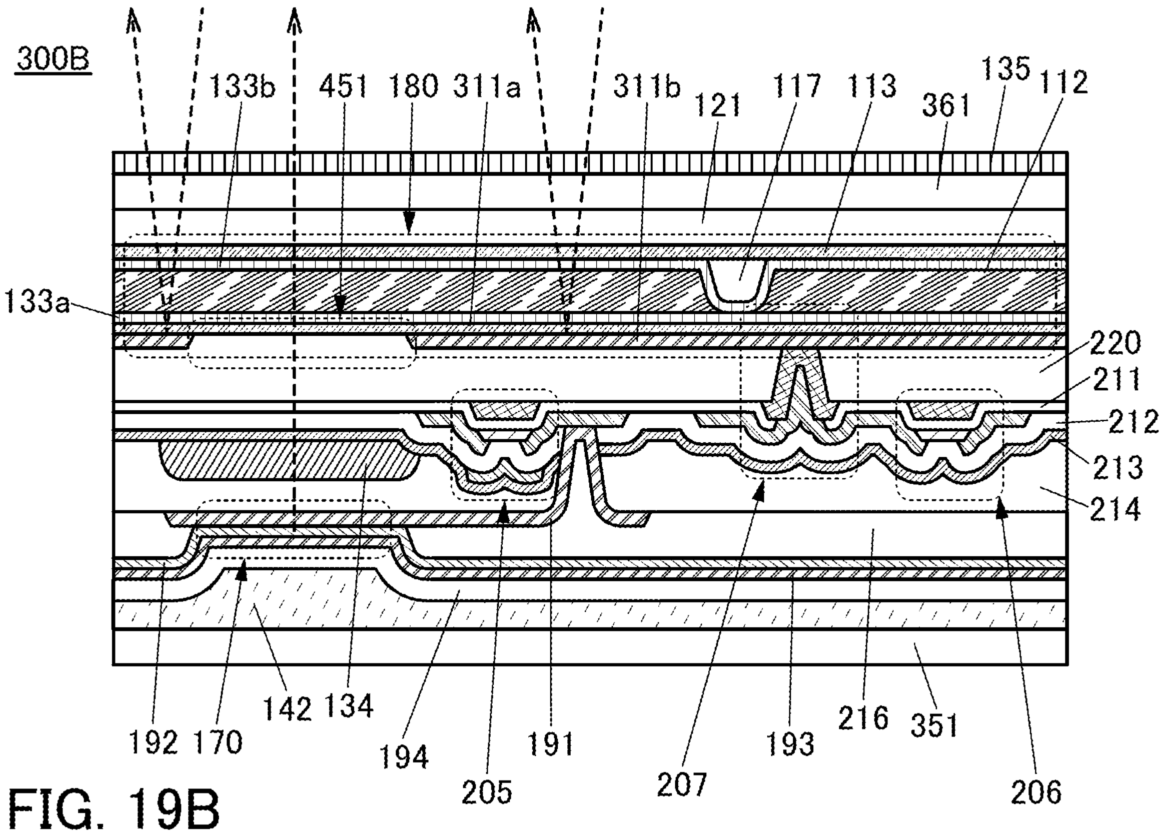
FIGS. 19A and 19B are cross-sectional views each illustrating an example of a display device.

FIG. 19A is a cross-sectional view illustrating a display portion of a display device 300B.

The display device 300B is different from the display device 300 in that the coloring layer 131 is not provided. Other components are similar to those of the display device 300 and thus are not described in detail.

The liquid crystal element 180 emits white light. Since the coloring layer 131 is not provided, the display device 300B can display a black and white image or a grayscale image using the liquid crystal element 180.

Structure Example 4

Figure 19B:
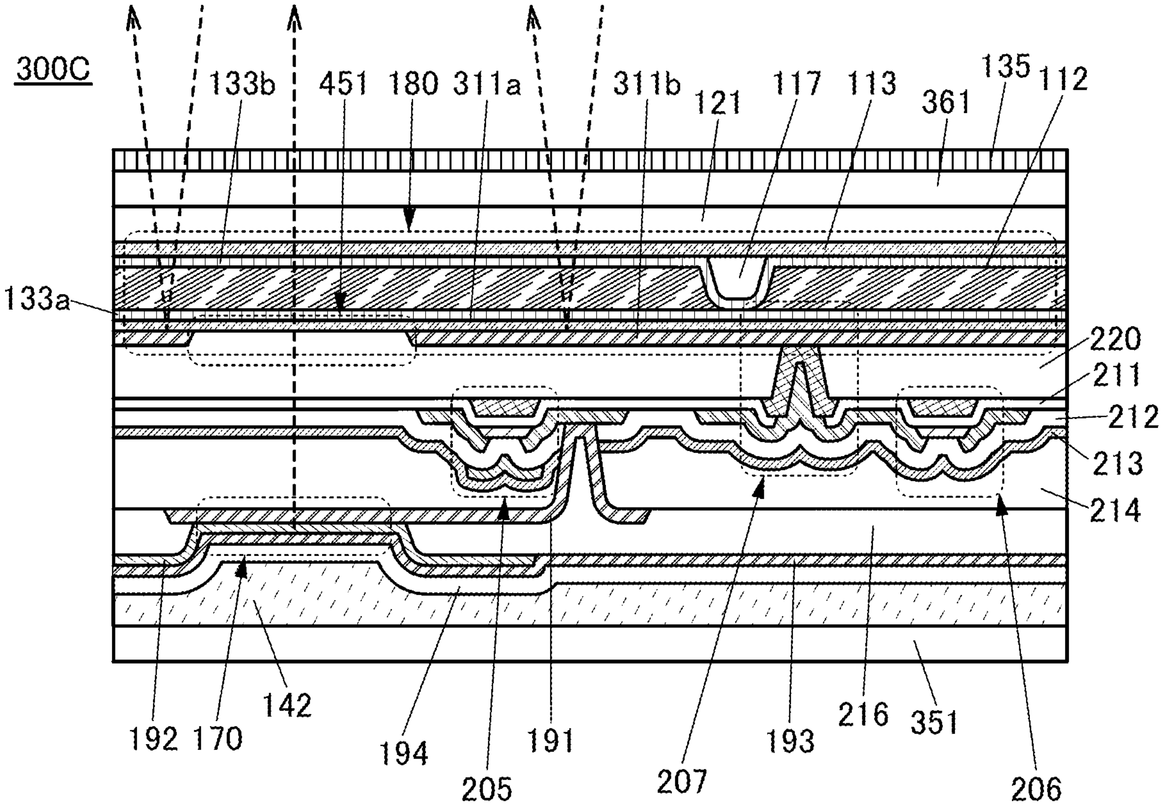

A display device 300C illustrated in FIG. 19B is different from the display device 300B in that the EL layer 192 is separately provided for each color (the EL layer 192 is provided for each light-emitting element 170) and the coloring layer 134 is not provided. Other components are similar to those of the display device 300B and thus are not described in detail.

In the light-emitting element 170 employing a separate coloring method, at least one layer (typified by the light-emitting layer) included in the EL layer 192 is separately provided for each color. All layers included in the EL layer may be separately provided for each color.

There is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

FIGS. 20A to 20E illustrate structure examples of transistors.

Figure 20A:
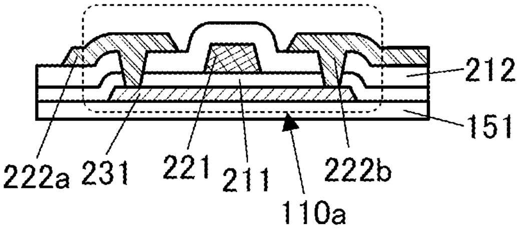
FIGS. 20A to 20E are cross-sectional views illustrating examples of a transistor.

A transistor 110*a* illustrated in FIG. 20A is a top-gate transistor.

The transistor 110*a* includes a conductive layer 221, the insulating layer 211, the semiconductor layer 231, the insulating layer 212, the conductive layer 222*a*, and the conductive layer 222*b*. The semiconductor layer 231 is provided over an insulating layer 151. The conductive layer 221 overlaps with the semiconductor layer 231 with the insulating layer 211 positioned therebetween. The conductive layer 222*a* and the conductive layer 222*b* are electrically connected to the semiconductor layer 231 through openings provided in the insulating layer 211 and the insulating layer 212.

The conductive layer 221 functions as a gate. The insulating layer 211 functions as a gate insulating layer. One of the conductive layer 222*a* and the conductive layer 222*b* functions as a source and the other functions as a drain.

In the transistor 110*a*, the conductive layer 221 can be physically distanced from the conductive layer 222*a* or 222*b* easily; thus, the parasitic capacitance between the conductive layer 221 and the conductive layer 222*a* or 222*b* can be reduced.

Figure 20B:
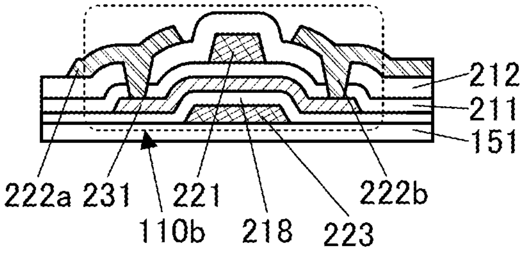

A transistor 110*b* illustrated in FIG. 20B includes, in addition to the components of the transistor 110*a*, the conductive layer 223 and an insulating layer 218. The conductive layer 223 is provided over the insulating layer 151. The conductive layer 223 overlaps with the semiconductor layer 231. The insulating layer 218 covers the conductive layer 223 and the insulating layer 151.

The conductive layer 223 functions as one of a pair of gates. Thus, the on-state current of the transistor can be increased and the threshold voltage can be controlled.

Figure 20C:
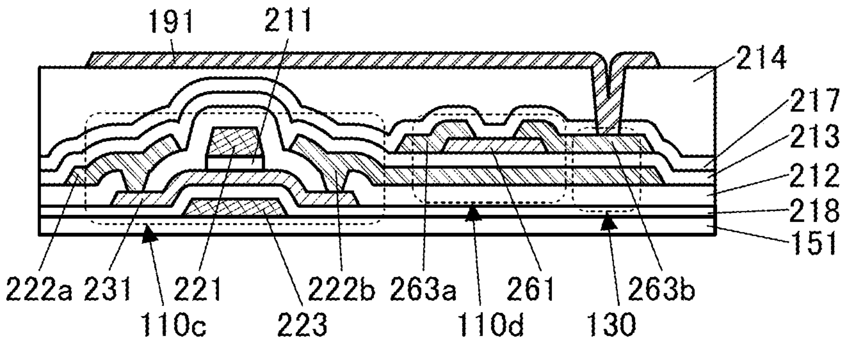
Figure 20D:
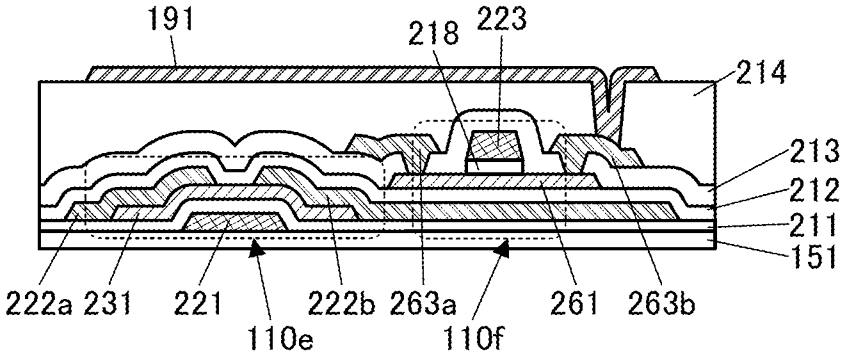
Figure 20E:
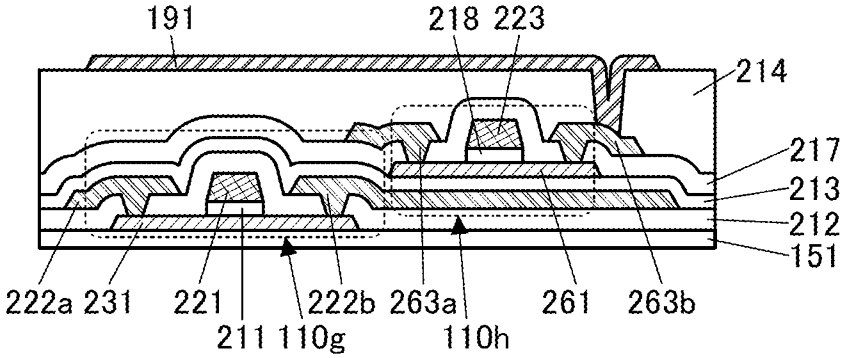

FIGS. 20C to 20E each illustrate an example of a stacked-layer structure of two transistors. The structures of the two stacked transistors can be independently determined, and the combination of the structures is not limited to those illustrated in FIGS. 20C to 20E.

FIG. 20C illustrates a stacked-layer structure of a transistor 110*c* and a transistor 110*d*. The transistor 110*c* includes two gates. The transistor 110*d* has a bottom-gate structure. Note that the transistor 110*c* may have a structure including one gate (top-gate structure). The transistor 110*d* may include two gates.

The transistor 110*c* includes the conductive layer 223, the insulating layer 218, the semiconductor layer 231, the conductive layer 221, the insulating layer 211, the conductive layer 222*a*, and the conductive layer 222*b*. The conductive layer 223 is provided over the insulating layer 151. The conductive layer 223 overlaps with the semiconductor layer 231 with the insulating layer 218 positioned therebetween. The insulating layer 218 covers the conductive layer 223 and the insulating layer 151. The conductive layer 221 overlaps with the semiconductor layer 231 with the insulating layer 211 positioned therebetween. Although FIG. 20C illustrates an example where the insulating layer 211 is provided only in a region overlapping with the conductive layer 221, the insulating layer 211 may be provided so as to cover an end portion of the semiconductor layer 231, as illustrated in FIG. 20B and other drawings. The conductive layer 222*a* and the conductive layer 222*b* are electrically connected to the semiconductor layer 231 through openings provided in the insulating layer 212.

The transistor 110*d* includes the conductive layer 222*b*, the insulating layer 213, the semiconductor layer 261, the conductive layer 263*a*, and the conductive layer 263*b*. The conductive layer 222*b* includes a region overlapping with the semiconductor layer 261 with the insulating layer 213 positioned therebetween. The insulating layer 213 covers the conductive layer 222*b*. The conductive layer 263*a* and the conductive layer 263*b* are electrically connected to the semiconductor layer 261.

The conductive layer 221 and the conductive layer 223 each function as a gate of the transistor 110*c*. The insulating layer 218 and the insulating layer 211 each function as a gate insulating layer of the transistor 110*c*. The conductive layer 222*a* functions as one of a source and a drain of the transistor 110*c*.

The conductive layer 222*b* has a portion functioning as the other of the source and the drain of the transistor 110*c* and a portion functioning as a gate of the transistor 110*d*. The insulating layer 213 functions as a gate insulating layer of the transistor 110*d*. One of the conductive layer 263*a* and the conductive layer 263*b* functions as a source of the transistor 110*d* and the other functions as a drain of the transistor 110*d*.

The transistor 110*c* and the transistor 110*d* are preferably applied to a pixel circuit of the light-emitting element 170. For example, the transistor 110*c* can be used as a selection transistor and the transistor 110*d* can be used as a driving transistor.

The conductive layer 263*b* is electrically connected to the electrode 191 that functions as a pixel electrode of the light-emitting element through an opening provided in the insulating layer 217 and the insulating layer 214.

FIG. 20D illustrates a stacked-layer structure of a transistor 110*e* and a transistor 110*f*. The transistor 110*e* has a bottom-gate structure. The transistor 110*f* includes two gates. The transistor 110*e* may include two gates.

The transistor 110*e* includes the conductive layer 221, the insulating layer 211, the semiconductor layer 231, the conductive layer 222*a*, and the conductive layer 222*b*. The conductive layer 221 is provided over the insulating layer 151. The conductive layer 221 overlaps with the semiconductor layer 231 with the insulating layer 211 positioned therebetween. The insulating layer 211 covers the conductive layer 221 and the insulating layer 151. The conductive layer 222*a* and the conductive layer 222*b* are electrically connected to the semiconductor layer 231.

The transistor 110*f* includes the conductive layer 222*b*, the insulating layer 212, the semiconductor layer 261, the conductive layer 223, the insulating layer 218, the insulating layer 213, the conductive layer 263*a*, and the conductive layer 263*b*. The conductive layer 222*b* includes a region overlapping with the semiconductor layer 261 with the insulating layer 212 positioned therebetween. The insulating layer 212 covers the conductive layer 222*b*. The conductive layer 263*a* and the conductive layer 263*b* are electrically connected to the semiconductor layer 261 through openings provided in the insulating layer 213. The conductive layer 223 overlaps with the semiconductor layer 261 with the insulating layer 218 positioned therebetween. The insulating layer 218 is provided in a region overlapping with the conductive layer 223.

The conductive layer 221 functions as a gate of the transistor 110*e*. The insulating layer 211 functions as a gate insulating layer of the transistor 110*e*. The conductive layer 222*a* functions as one of a source and a drain of the transistor 110*e*.

The conductive layer 222*b* has a portion functioning as the other of the source and the drain of the transistor 110*e* and a portion functioning as a gate of the transistor 110*f*. The conductive layer 223 functions as another gate of the transistor 110*f*. The insulating layer 212 and the insulating layer 218 each function as a gate insulating layer of the transistor 110*f*. One of the conductive layer 263*a* and the conductive layer 263*b* functions as a source of the transistor 110*f* and the other functions as a drain of the transistor 110*f*.

The conductive layer 263*b* is electrically connected to the electrode 191 that functions as a pixel electrode of a light-emitting element through an opening provided in the insulating layer 214.

FIG. 20E illustrates a stacked-layer structure of a transistor 110*g* and a transistor 110*h*. The transistor 110*g* has a top-gate structure. The transistor 110*h* includes two gates. The transistor 110*g* may include two gates.

The transistor 110*g* includes the semiconductor layer 231, the conductive layer 221, the insulating layer 211, the conductive layer 222*a*, and the conductive layer 222*b*. The semiconductor layer 231 is provided over the insulating layer 151. The conductive layer 221 overlaps with the semiconductor layer 231 with the insulating layer 211 positioned therebetween. The insulating layer 211 overlaps with the conductive layer 221. The conductive layer 222*a* and the conductive layer 222*b* are electrically connected to the semiconductor layer 231 through openings provided in the insulating layer 212.

The transistor 110*h* includes the conductive layer 222*b*, the insulating layer 213, the semiconductor layer 261, the conductive layer 223, the insulating layer 218, the insulating layer 217, the conductive layer 263*a*, and the conductive layer 263*b*. The conductive layer 222*b* includes a region overlapping with the semiconductor layer 261 with the insulating layer 213 positioned therebetween. The insulating layer 213 covers the conductive layer 222*b*. The conductive layer 263*a* and the conductive layer 263*b* are electrically connected to the semiconductor layer 261 through openings provided in the insulating layer 217. The conductive layer 223 overlaps with the semiconductor layer 261 with the insulating layer 218 positioned therebetween. The insulating layer 218 is provided in a region overlapping with the conductive layer 223.

The conductive layer 221 functions as a gate of the transistor 110*g*. The insulating layer 211 functions as a gate insulating layer of the transistor 110*g*. The conductive layer 222*a* functions as one of a source and a drain of the transistor 110*g*.

The conductive layer 222*b* has a portion functioning as the other of the source and the drain of the transistor 110*g* and a portion functioning as a gate of the transistor 110*h*. The conductive layer 223 functions as another gate of the transistor 110*h*. The insulating layer 212 and the insulating layer 218 each function as a gate insulating layer of the transistor 110*h*. One of the conductive layer 263*a* and the conductive layer 263*b* functions as a source of the transistor 110*h* and the other functions as a drain of the transistor 110*h*.

The conductive layer 263*b* is electrically connected to the electrode 191 that functions as a pixel electrode of a light-emitting element through an opening provided in the insulating layer 214.

Manufacturing Method Example

Hereinafter, the method for manufacturing the display device of this embodiment will be specifically described with reference to FIGS. 21A to 21D, FIGS. 22A to 22C, FIGS. 23A and 23B, and FIGS. 24A and 24B.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a lithography method or the like can be used for the processing. Alternatively, island-shaped thin films may be formed by a film formation method using a blocking mask. A nanoimprinting method, a sandblasting method, a lift-off method, or the like may be used for the processing of thin films. Examples of a photolithography method include a method in which a resist mask is formed over a thin film to be processed, the thin film is processed by etching or the like, and the resist mask is removed, and a method in which a photosensitive thin film is formed and exposed to light and developed to be processed into a desired shape.

In the case of using light in the lithography method, any of an i-line (light with a wavelength of 365 nm), a g-line (light with a wavelength of 436 nm), and an h-line (light with a wavelength of 405 nm), or combined light of any of them can be used for exposure. Alternatively, ultraviolet light, KrF laser light, ArF laser light, or the like can be used. Exposure may be performed by liquid immersion exposure technique. As the light for the exposure, extreme ultra-violet (EUV) light or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

An example of a manufacturing method of the display device 300 illustrated in FIG. 17 will be described below. The manufacturing method will be described with reference to FIGS. 21A to 21D, FIGS. 22A to 22C, FIGS. 23A and 23B, and FIGS. 24A and 24B, focusing on the display portion 362 of the display device 300.

Figure 21A:
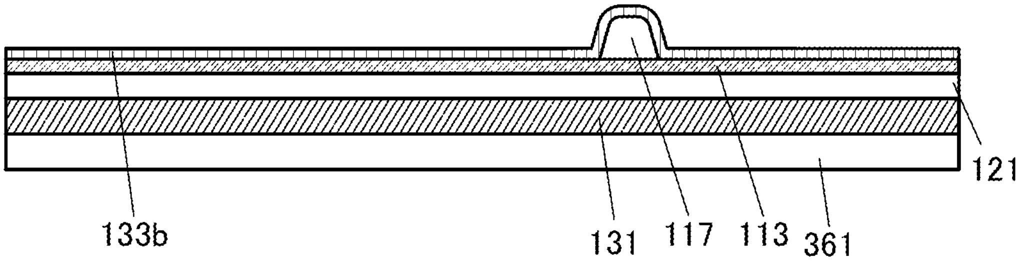
FIGS. 21A to 21D are cross-sectional views illustrating an example of a manufacturing method of a display device.

First, the coloring layer 131 is formed over the substrate 361 (FIG. 21A). The coloring layer 131 is formed using a photosensitive material, in which case the processing into an island shape can be performed by a photolithography method or the like. Note that in the circuit 364 and the like illustrated in FIG. 17, the light-blocking layer 132 is provided over the substrate 361.

Then, the insulating layer 121 is formed over the coloring layer 131 and the light-blocking layer 132.

The insulating layer 121 preferably functions as a planarization layer. A resin such as acrylic or epoxy is suitably used for the insulating layer 121.

An inorganic insulating film may be used for the insulating layer 121. For example, an inorganic insulating film such as a silicon nitride film, a silicon oxynitride film, a silicon oxide film, a silicon nitride oxide film, an aluminum oxide film, or an aluminum nitride film can be used for the insulating layer 121. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Further alternatively, a stack including two or more of the above insulating films may be used.

Next, the electrode 113 is formed. The electrode 113 can be formed in the following manner: a conductive film is formed, a resist mask is formed, the conductive film is etched, and the resist mask is removed. The electrode 113 is formed using a conductive material that transmits visible light.

After that, the insulating layer 117 is formed over the electrode 113. An organic insulating film is preferably used for the insulating layer 117.

Subsequently, the alignment film 133*b* is formed over the electrode 113 and the insulating layer 117 (FIG. 21A). The alignment film 133*b* can be formed in the following manner: a thin film is formed using a resin or the like, and then, rubbing treatment is performed.

Note that steps illustrated in FIGS. 21B to 21D, FIGS. 22A to 22C, FIGS. 23A and 23B, and FIG. 24A are performed independently of the steps described with reference to FIG. 21A.

Figure 21B:
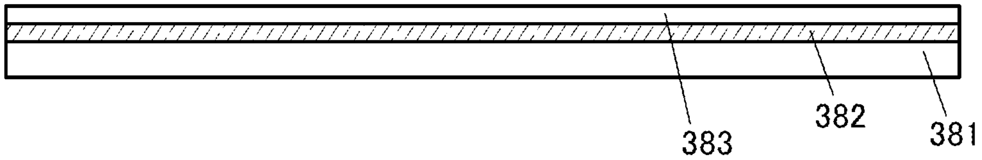

First, a separation layer 382 is formed over a formation substrate 381, and an insulating layer 383 is formed over the separation layer 382 (FIG. 21B).

In this step, a material is selected that would cause separation at the interface between the formation substrate 381 and the separation layer 382, the interface between the separation layer 382 and the insulating layer 383, or in the separation layer 382 when the formation substrate 381 is peeled. In this embodiment, an example in which separation occurs at the interface between the insulating layer 383 and the separation layer 382 is described; however, one embodiment of the present invention is not limited to such an example and depends on a material used for the separation layer 382 or the insulating layer 383.

The formation substrate 381 has stiffness high enough for easy transfer and has resistance to heat applied in the manufacturing process. Examples of a material that can be used for the formation substrate 381 include glass, quartz, ceramics, sapphire, a resin, a semiconductor, a metal, and an alloy. Examples of the glass include alkali-free glass, barium borosilicate glass, and aluminoborosilicate glass.

The separation layer 382 can be formed using an organic material or an inorganic material.

Examples of an inorganic material that can be used for the separation layer 382 include a metal containing an element selected from tungsten, molybdenum, titanium, tantalum, niobium, nickel, cobalt, zirconium, zinc, ruthenium, rhodium, palladium, osmium, iridium, and silicon; an alloy containing any of the above elements; and a compound containing any of the above elements. A crystal structure of a layer containing silicon may be amorphous, microcrystal, or polycrystal.

In the case of using an inorganic material, the thickness of the separation layer 382 is greater than or equal to 1 nm and less than or equal to 1000 nm, preferably greater than or equal to 10 nm and less than or equal to 200 nm, and further preferably greater than or equal to 10 nm and less than or equal to 100 nm.

In the case of using an inorganic material, the separation layer 382 can be formed by a sputtering method, a CVD method, an ALD method, or an evaporation method, for example.

Examples of an organic material that can be used for the separation layer 382 include an acrylic resin, an epoxy resin, a polyamide resin, a polyimide-amide resin, a siloxane resin, a benzocyclobutene-based resin, and a phenol resin.

In the case of using an organic material, the thickness of the separation layer 382 is preferably greater than or equal to 0.01 μm and less than 10 μm, further preferably greater than or equal to 0.1 μm and less than or equal to 3 μm, and still further preferably greater than or equal to 0.5 μm and less than or equal to 1 μm. The separation layer 382 whose thickness is within the above range can lead to a reduction in manufacturing cost. The thickness of the separation layer 382 is not necessarily within the above range and may be greater than or equal to 10 μm: for example, greater than or equal to 10 μm and less than or equal to 200 μm.

In the case of using an organic material, the separation layer 382 can be formed by a method such as spin coating, dipping, spray coating, ink-jetting, dispensing, screen printing, or offset printing, or with a doctor knife, a slit coater, a roll coater, a curtain coater, or a knife coater, for example.

An inorganic insulating film is preferably formed using the insulating layer 383. For example, an inorganic insulating film such as a silicon nitride film, a silicon oxynitride film, a silicon oxide film, a silicon nitride oxide film, an aluminum oxide film, or an aluminum nitride film can be used for the insulating layer 383. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Further alternatively, a stack including two or more of the above insulating films may be used.

For example, a stacked-layer structure of a layer containing a high-melting-point metal material such as tungsten and a layer containing an oxide of the metal material may be used for the separation layer 382, and a stacked-layer structure of a plurality of inorganic insulating films containing silicon nitride, silicon oxynitride, silicon nitride oxide, or the like may be used for the insulating layer 383. When a high-melting-point metal material is used for the separation layer 382, layers formed after the separation layer 382 can be formed at higher temperatures; thus, impurity concentration can be reduced and a highly reliable display device can be fabricated. A step for removing a layer unnecessary for the display device (e.g., the separation layer 382 or the insulating layer 383) may be performed after the peeling. The separation layer 382 or the insulating layer 383 is not necessarily removed and may be used as a component of the display device.

Figure 21C:
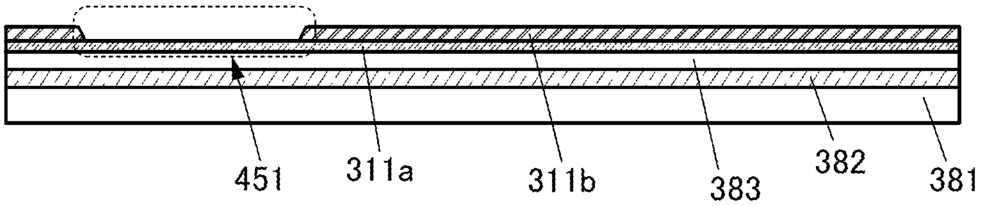

Next, the electrode 311*a* is formed over the insulating layer 383, and the electrode 311*b* is formed over the electrode 311*a* (FIG. 21C). The electrode 311*b* includes the opening 451 over the electrode 311*a*. Each of the electrodes

311*a* and 311*b* can be formed in the following manner: a conductive film is formed, a resist mask is formed, the conductive film is etched, and the resist mask is removed. The electrode 311*a* is formed using a conductive material that transmits visible light. The electrode 311*b* is formed using a conductive material that reflects visible light.

Figure 21D:
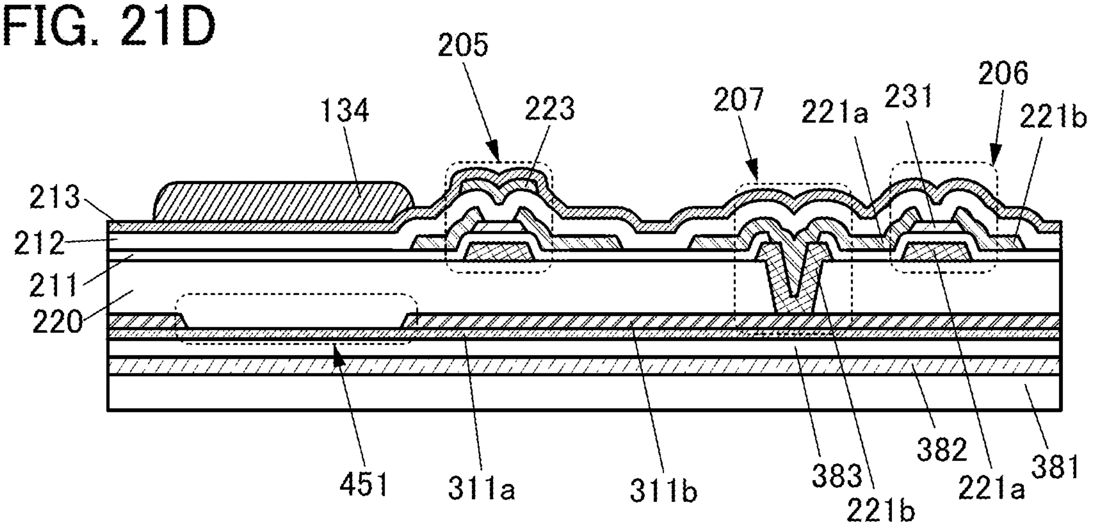

After that, the insulating layer 220 is formed (FIG. 21D). Then, an opening that reaches the electrode 311*b* is formed in the insulating layer 220.

The insulating layer 220 can be used as a barrier layer that prevents diffusion of impurities contained in the separation layer 382 into the transistor and the display element formed later. In the case of using an organic material for the separation layer 382, the insulating layer 220 preferably prevents diffusion of moisture or the like contained in the separation layer 382 into the transistor and the display element when the separation layer 382 is heated. Thus, the insulating layer 220 preferably has a high barrier property.

The insulating layer 220 can be formed using the inorganic insulating film, the resin, or the like that can be used for the insulating layer 121.

Next, the transistor 205 and the transistor 206 are formed over the insulating layer 220.

There is no particular limitation on a semiconductor material used for the semiconductor layer of the transistor, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

Described here is the case where a bottom-gate transistor including an oxide semiconductor layer as the semiconductor layer 231 is fabricated as the transistor 206. The transistor 205 includes the conductive layer 223 and the insulating layer 212 in addition to the components of the transistor 206, and has two gates.

An oxide semiconductor is preferably used for the semiconductor layer of the transistor. The use of a semiconductor material having a wider band gap and a lower carrier density than silicon can reduce the off-state current of the transistor.

Specifically, first, the conductive layer 221*a* and the conductive layer 221*b* are formed over the insulating layer 220. The conductive layer 221*a* and the conductive layer 221*b* can be formed in the following manner: a conductive film is formed, a resist mask is formed, the conductive film is etched, and the resist mask is removed. At this time, the conductive layer 221*b* and the electrode 311*b* are connected to each other through an opening in the insulating layer 220.

Next, the insulating layer 211 is formed.

For the insulating layer 211, for example, an inorganic insulating film such as a silicon nitride film, a silicon oxynitride film, a silicon oxide film, a silicon nitride oxide film, an aluminum oxide film, or an aluminum nitride film can be used. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Further alternatively, a stack including two or more of the above insulating films may be used.

An inorganic insulating film is preferably formed at high temperatures because the film can have higher density and a higher barrier property as the deposition temperature becomes higher. The substrate temperature during the deposition of the inorganic insulating film is preferably higher than or equal to room temperature (25° C.) and lower than or equal to 350° C., and further preferably higher than or equal to 100° C. and lower than or equal to 300° C.

Then, the semiconductor layer 231 is formed. In this embodiment, an oxide semiconductor layer is formed as the semiconductor layer 231. The oxide semiconductor layer can be formed in the following manner: an oxide semiconductor film is formed, a resist mask is formed, the oxide semiconductor film is etched, and the resist mask is removed.

The substrate temperature during the deposition of the oxide semiconductor film is preferably lower than or equal to 350° C., further preferably higher than or equal to room temperature and lower than or equal to 200° C., and still further preferably higher than or equal to room temperature and lower than or equal to 130° C.

The oxide semiconductor film can be formed using one or both of an inert gas and an oxygen gas. Note that there is no particular limitation on the percentage of oxygen flow rate (partial pressure of oxygen) at the time of forming the oxide semiconductor film. To fabricate a transistor having high field-effect mobility, however, the percentage of oxygen flow rate (partial pressure of oxygen) at the time of forming the oxide semiconductor film is preferably higher than or equal to 0% and lower than or equal to 30%, further preferably higher than or equal to 5% and lower than or equal to 30%, and still further preferably higher than or equal to 7% and lower than or equal to 15%.

The oxide semiconductor film preferably contains at least indium or zinc. It is particularly preferable to contain indium and zinc.

The energy gap of the oxide semiconductor is preferably 2 eV or more, further preferably 2.5 eV or more, and still further preferably 3 eV or more. The use of such an oxide semiconductor having a wide energy gap leads to a reduction in off-state current of a transistor.

The oxide semiconductor film can be formed by a sputtering method. Alternatively, a PLD method, a PECVD method, a thermal CVD method, an ALD method, a vacuum evaporation method, or the like may be used.

Note that an example of an oxide semiconductor is described in Embodiment 4.

Next, the conductive layer 222*a* and the conductive layer 222*b* are formed. The conductive layer 222*a* and the conductive layer 222*b* can be formed in the following manner: a conductive film is formed, a resist mask is formed, the conductive film is etched, and the resist mask is removed. Each of the conductive layers 222*a* and 222*b* is connected to the semiconductor layer 231. Here, the conductive layer 222*a* included in the transistor 206 is electrically connected to the conductive layer 221*b*. As a result, the electrode 311*b* and the conductive layer 222*a* can be electrically connected to each other at the connection portion 207.

Note that during the processing of the conductive layer 222*a* and the conductive layer 222*b*, the semiconductor layer 231 might be partly etched to be thin in a region not covered by the resist mask.

In the above manner, the transistor 206 can be fabricated (FIG. 21D). In the transistor 206, part of the conductive layer 221*a* functions as a gate, part of the insulating layer 211 functions as a gate insulating layer, and the conductive layer 222*a* and the conductive layer 222*b* function as a source and a drain.

Next, the insulating layer 212 that covers the transistor 206 is formed, and the conductive layer 223 is formed over the insulating layer 212.

The insulating layer 212 can be formed in a manner similar to that of the insulating layer 211.

The conductive layer 223 included in the transistor 205 can be formed in the following manner: a conductive film is formed, a resist mask is formed, the conductive film is etched, and the resist mask is removed.

In the above manner, the transistor 205 can be fabricated (FIG. 21D). In the transistor 205, part of the conductive layer 221*a* and part of the conductive layer 223 function as gates, part of the insulating layer 211 and part of the insulating layer 212 function as gate insulating layers, and the conductive layer 222*a* and the conductive layer 222*b* function as a source and a drain.

Next, the insulating layer 213 is formed (FIG. 21D). The insulating layer 213 can be formed in a manner similar to that of the insulating layer 211.

It is preferable to use an oxide insulating film formed in an atmosphere containing oxygen, such as a silicon oxide film or a silicon oxynitride film, for the insulating layer 212. An insulating film with low oxygen diffusibility and oxygen permeability, such as a silicon nitride film, is preferably stacked as the insulating layer 213 over the silicon oxide film or the silicon oxynitride film. The oxide insulating film formed in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the oxide semiconductor layer. As a result, oxygen vacancies in the oxide semiconductor layer can be filled and defects at the interface between the oxide semiconductor layer and the insulating layer 212 can be repaired, leading to a reduction in defect levels. Accordingly, an extremely highly reliable display device can be fabricated.

Figure 22A:
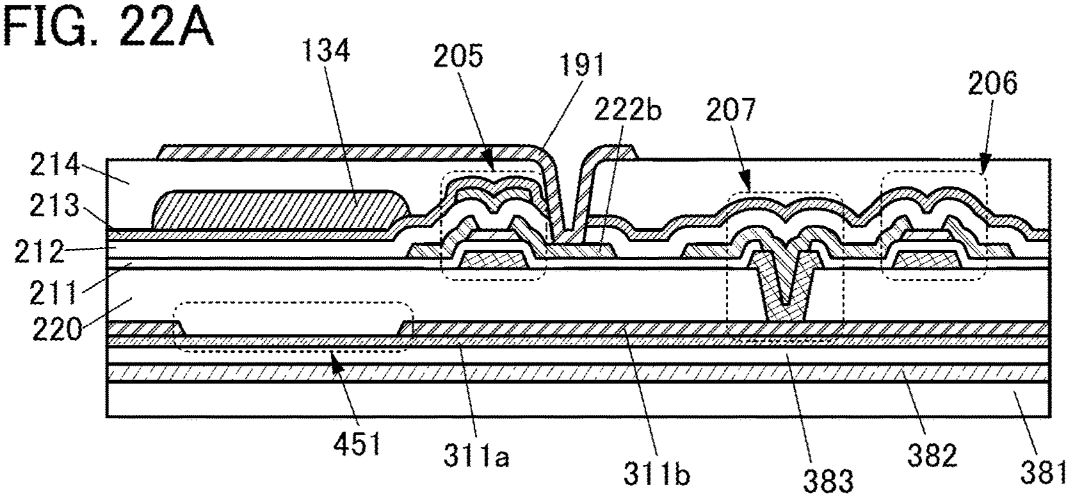
FIGS. 22A to 22C are cross-sectional views illustrating an example of a manufacturing method of a display device.

Next, the coloring layer 134 is formed over the insulating layer 213 (FIG. 21D), and then, the insulating layer 214 is formed (FIG. 22A). The coloring layer 134 is positioned so as to overlap with the opening 451 in the electrode 311*b*.

The coloring layer 134 can be formed in a manner similar to that of the coloring layer 131. The display element is formed on the insulating layer 214 in a later step; thus, the insulating layer 214 preferably functions as a planarization layer. For the insulating layer 214, the description of the resin or the inorganic insulating film that can be used for the insulating layer 121 can be referred to.

After that, an opening that reaches the conductive layer 222*b* included in the transistor 205 is formed in the insulating layer 212, the insulating layer 213, and the insulating layer 214.

Subsequently, the electrode 191 is formed (FIG. 22A). The electrode 191 can be formed in the following manner: a conductive film is formed, a resist mask is formed, the conductive film is etched, and the resist mask is removed. Here, the conductive layer 222*b* included in the transistor 205 and the electrode 191 are connected to each other. The electrode 191 is formed using a conductive material that transmits visible light.

Figure 22B:
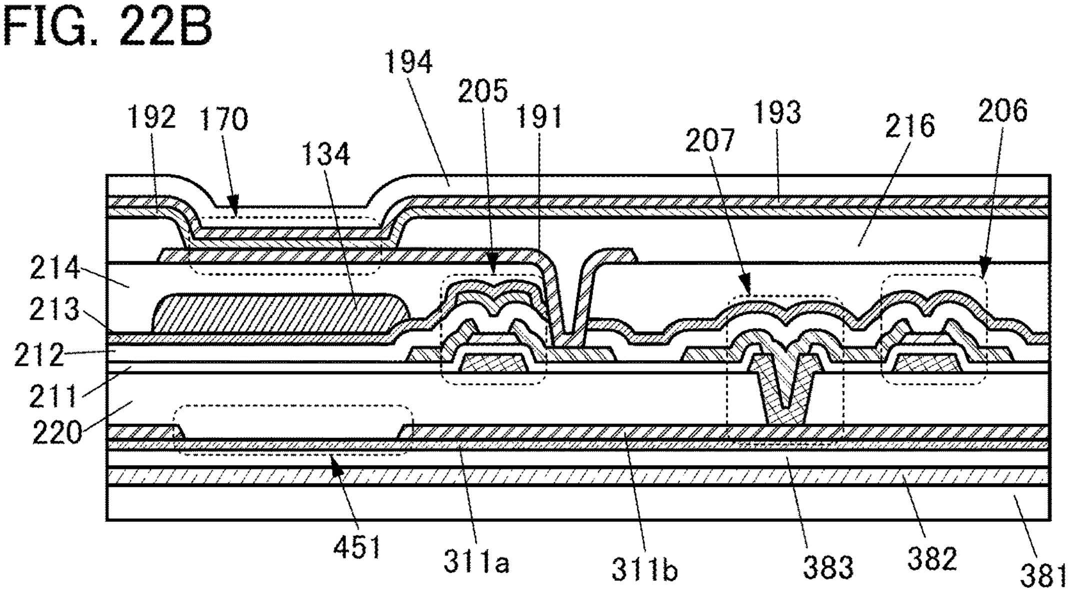

Then, the insulating layer 216 that covers the end portion of the electrode 191 is formed (FIG. 22B). For the insulating layer 216, the description of the resin or the inorganic insulating film that can be used for the insulating layer 121 can be referred to. The insulating layer 216 includes an opening in a region overlapping with the electrode 191.

Next, the EL layer 192 and the electrode 193 are formed (FIG. 22B). Part of the electrode 193 functions as the common electrode of the light-emitting element 170. The electrode 193 is formed using a conductive material that reflects visible light.

The EL layer 192 can be formed by an evaporation method, a coating method, a printing method, a discharge method, or the like. In the case where the EL layer 192 is formed for each individual pixel, an evaporation method using a shadow mask such as a metal mask, an ink-jet method, or the like can be used. In the case of sharing the EL layer 192 by some pixels, an evaporation method not using a metal mask can be used.

Either a low molecular compound or a high molecular compound can be used for the EL layer 192, and an inorganic compound may also be included.

Steps after the formation of the EL layer 192 are performed such that temperatures higher than the heat resistant temperature of the EL layer 192 are not applied to the EL layer 192. The electrode 193 can be formed by an evaporation method, a sputtering method, or the like.

In the above manner, the light-emitting element 170 can be formed (FIG. 22B). In the light-emitting element 170, the electrode 191 part of which functions as the pixel electrode, the EL layer 192, and the electrode 193 part of which functions as the common electrode are stacked. The light-emitting element 170 is formed such that the light-emitting region overlaps with the coloring layer 134 and the opening 451 in the electrode 311*b*.

Although an example where a bottom-emission light-emitting element is formed as the light-emitting element 170 is described here, one embodiment of the present invention is not limited thereto.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

Next, the insulating layer 194 is formed so as to cover the electrode 193 (FIG. 22B). The insulating layer 194 functions as a protective layer that prevents diffusion of impurities such as water into the light-emitting element 170. The light-emitting element 170 is sealed with the insulating layer 194. After the electrode 193 is formed, the insulating layer 194 is preferably formed without exposure to the air.

The inorganic insulating film that can be used for the insulating layer 121 can be used for the insulating layer 194, for example. It is particularly preferable that the insulating layer 194 include an inorganic insulating film with a high barrier property. A stack including an inorganic insulating film and an organic insulating film can also be used.

The insulating layer 194 is preferably formed at substrate temperature lower than or equal to the heat resistant temperature of the EL layer 192. The insulating layer 194 can be formed by an ALD method, a sputtering method, or the like. An ALD method and a sputtering method are preferable because a film can be formed at low temperatures. An ALD method is preferable because the coverage of the insulating layer 194 is improved.

Figure 22C:
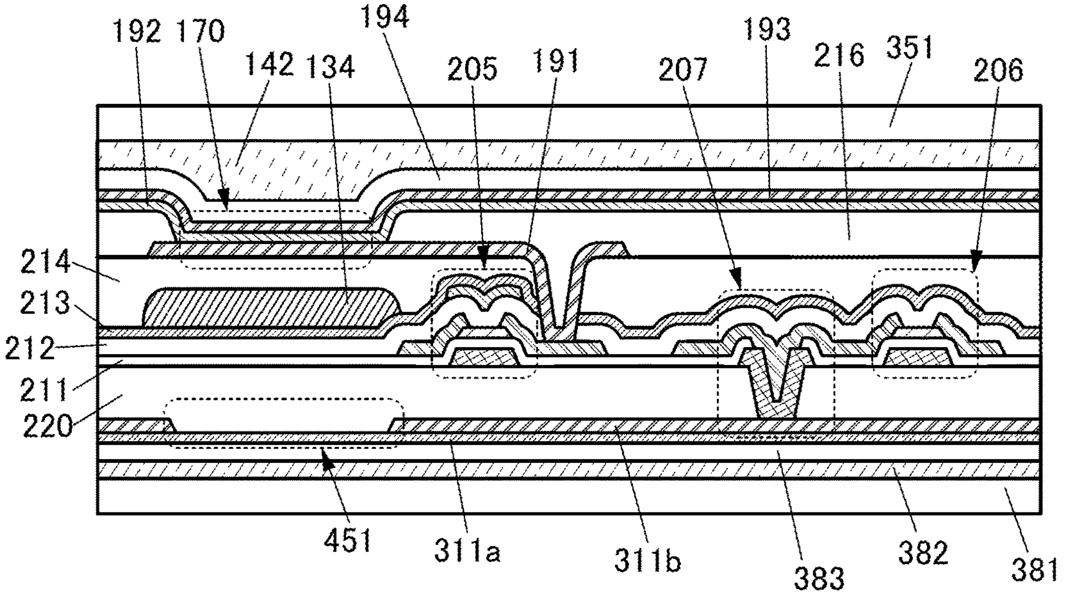

Then, the substrate 351 is bonded to a surface of the insulating layer 194 with the adhesive layer 142 (FIG. 22C).

As the adhesive layer 142, any of a variety of curable adhesives such as a reactive curable adhesive, a thermosetting adhesive, an anaerobic adhesive, and a photocurable adhesive such as an ultraviolet curable adhesive can be used. Alternatively, an adhesive sheet or the like may be used.

For the substrate 351, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Any of a variety of materials such as glass, quartz, a resin, a metal, an alloy, and a semiconductor can be used for the substrate 351. The substrate 351 formed using any of a variety of materials such as glass, quartz, a resin, a metal, an alloy, and a semiconductor may be thin enough to be flexible.

Figure 23A:
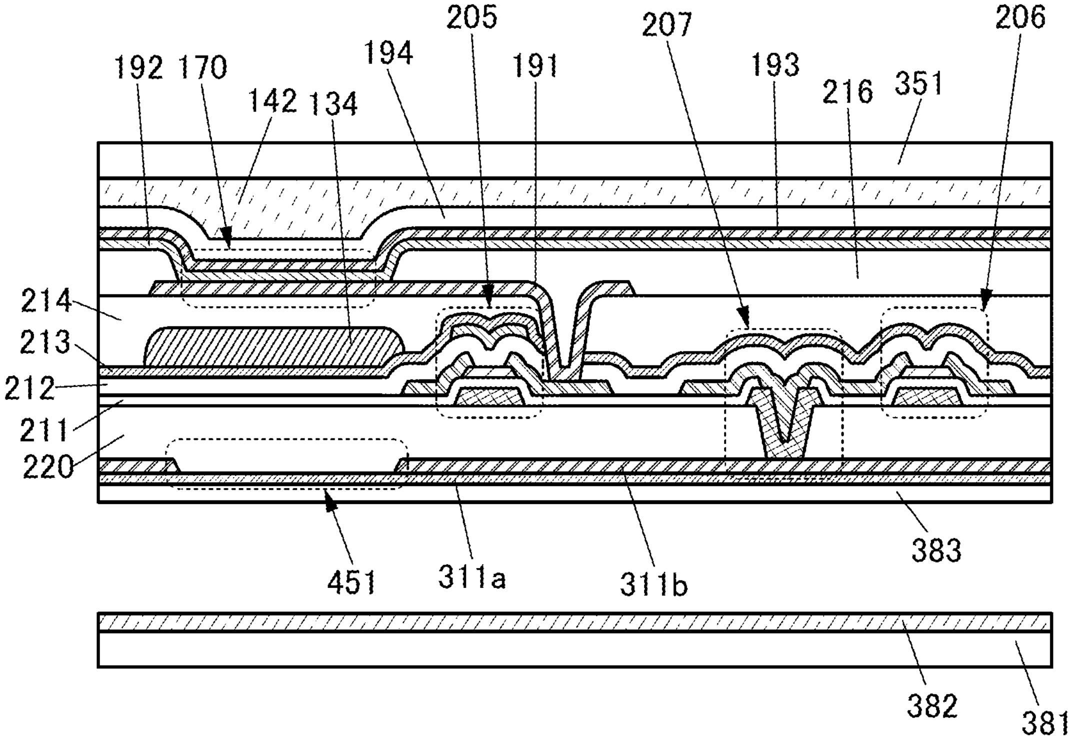
FIGS. 23A and 23B are cross-sectional views illustrating an example of a manufacturing method of a display device.

After that, the formation substrate 381 is peeled (FIG. 23A).

The position of the separation surface depends on the materials, the formation methods, and the like of the insulating layer 383, the separation layer 382, the formation substrate 381, and the like.

FIG. 23A illustrates an example where the separation occurs at the interface between the separation layer 382 and the insulating layer 383. By the separation, the insulating layer 383 is exposed.

Before the separation, a separation trigger may be formed in the separation layer 382. For example, part of or the entire separation layer 382 may be irradiated with laser light, in which case the separation layer 382 can be embrittled or the adhesion between the separation layer 382 and the insulating layer 383 (or the formation substrate 381) can be reduced.

The formation substrate 381 can be peeled by applying a perpendicular tensile force to the separation layer 382, for example. Specifically, the formation substrate 381 can be peeled by pulling up the substrate 351 by part of its suction-attached top surface.

The separation trigger may be formed by inserting a sharp instrument such as a knife between the separation layer 382 and the insulating layer 383 (or the formation substrate 381). Alternatively, the separation trigger may be formed by cutting the separation layer 382 from the substrate 351 side with a sharp instrument.

Figure 23B:
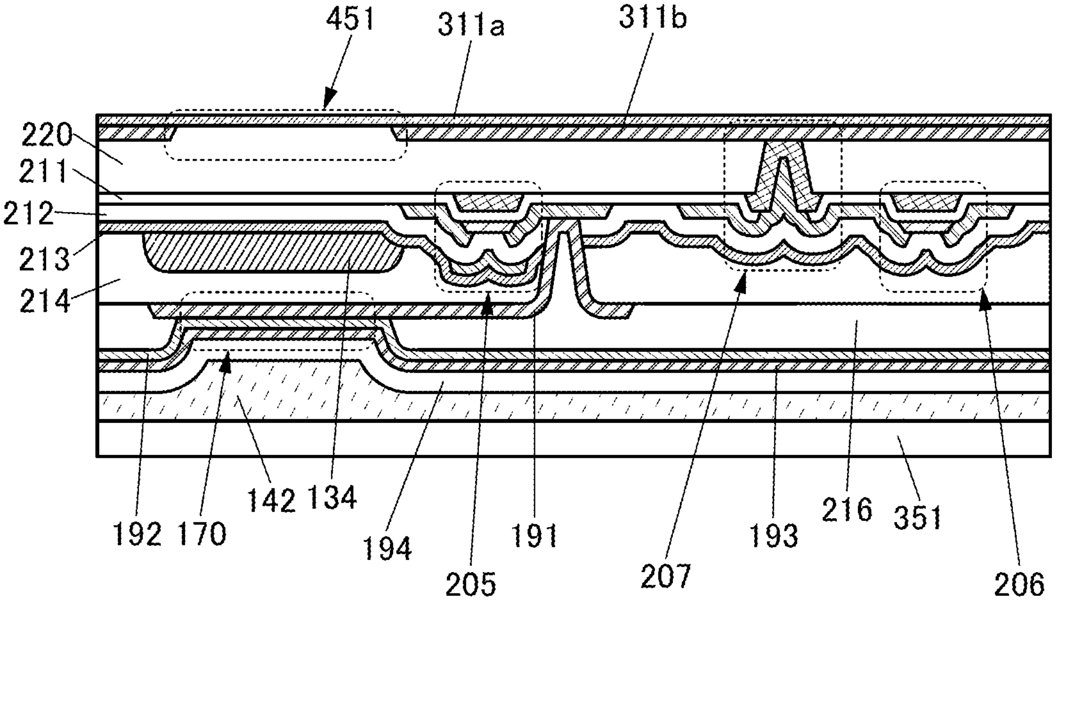

Next, the insulating layer 383 is removed. The insulating layer 383 can be removed by a dry etching method, for example. Accordingly, the electrode 311*a* is exposed (FIG. 23B).

Figure 24A:
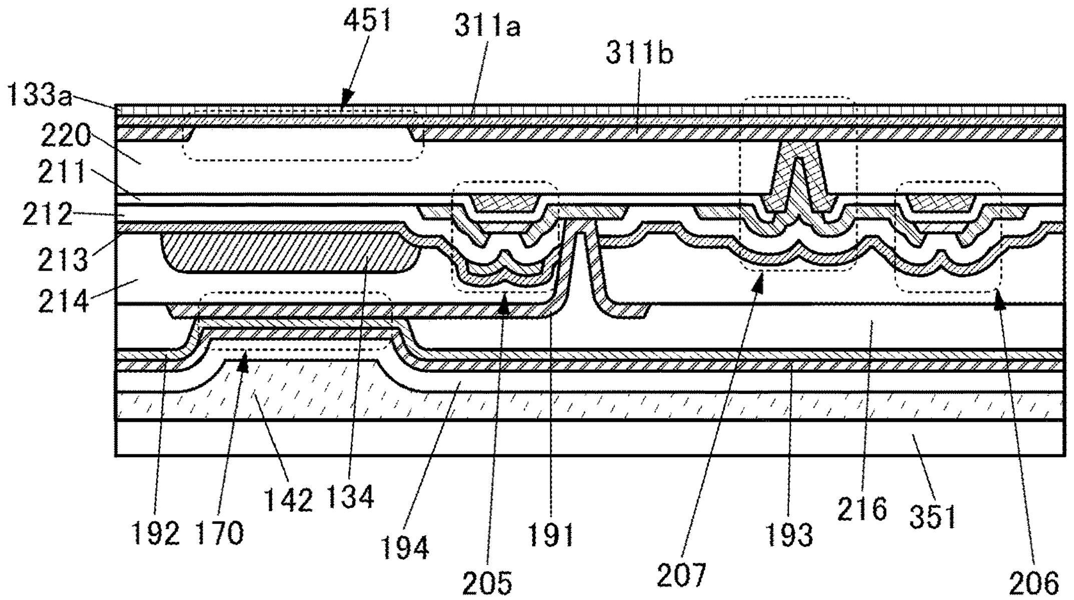
FIGS. 24A and 24B are cross-sectional views illustrating an example of a manufacturing method of a display device.

Subsequently, the alignment film 133*a* is formed on the exposed surface of the electrode 311*a* (FIG. 24A). The alignment film 133*a* can be formed in the following manner: a thin film is formed using a resin or the like, and then, rubbing treatment is performed.

Figure 24B:
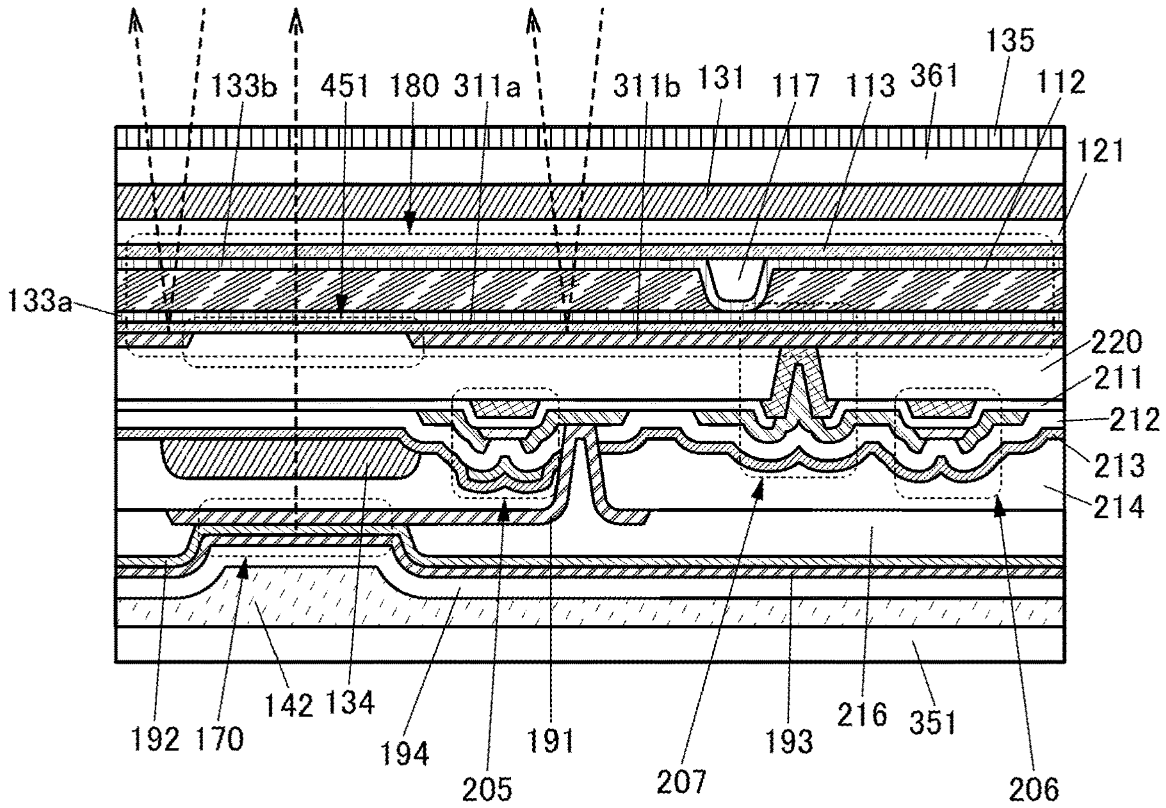

Then, the substrate 361 obtained from the steps described using FIG. 21A and the substrate 351 obtained from the steps up to the step illustrated in FIG. 24A are bonded to each other with the liquid crystal layer 112 provided therebetween (FIG. 24B). Although not illustrated in FIG. 24B, the substrate 351 and the substrate 361 are bonded to each other with the adhesive layer 141 as illustrated in FIG. 17 and other drawings. For materials of the adhesive layer 141, the description of the materials that can be used for the adhesive layer 142 can be referred to.

In the liquid crystal element 180 illustrated in FIG. 24B, the electrode 311*a* (and the electrode 311*b*) part of which functions as the pixel electrode, the liquid crystal layer 112, and the electrode 113 part of which functions as the common electrode are stacked. The liquid crystal element 180 is formed so as to overlap with the coloring layer 131.

Through the above steps, the display device 300 can be fabricated.

The display device of this embodiment includes two types of display elements as described above; thus, switching between a plurality of display modes is possible. Accordingly, the display device can have high visibility regardless of the ambient brightness, leading to high convenience.

In the case where a plurality of structure examples are described in one embodiment in this specification, some of the structure examples can be combined as appropriate.

At least part of this embodiment can be implemented in combination with any of the other embodiments described in this specification as appropriate.

Embodiment 6

In this embodiment, described below is the composition of a cloud-aligned composite oxide semiconductor (CAC-OS) applicable to a transistor disclosed in one embodiment of the present invention.

The CAC-OS refers to, for example, a composition of a material in which elements included in an oxide semiconductor are unevenly distributed. The material including unevenly distributed elements has a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which indium oxide ($InO_{X1}$, where X1 is a real number greater than 0) or indium zinc oxide ($In_{X2}Zn_{Y2}O_{Z2}$, where X2, Y2, and Z2 are real numbers greater than 0) forming a mosaic pattern is evenly distributed in the film (this composition is also referred to as a cloud-like composition). The mosaic pattern is formed by separating the materials into $InO_{X1}$ or $In_{X2}Zn_{Y2}O_{Z2}$ and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), for example.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region is described as having higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally. In the case where the CAC-OS is formed by a sputtering method, one or more of an inert gas (typically, argon), an oxygen gas, and a nitrogen gas are used as a deposition gas. Furthermore, the flow rate of the oxygen gas to the total flow rate of the deposition gas in deposition is preferably as low as possible, for example, the flow rate of the oxygen gas is higher than equal to 0% and lower than 30%, preferably higher than equal to 0% and lower than or equal to 10%.

The CAC-OS is characterized in that a clear peak is not observed when measurement is conducted using a θ/2θ scan by an out-of-plane method with an X-ray diffraction (XRD). That is, it is found by the XRD that there are no alignment in the a-b plane direction and no alignment in the c-axis direction in the measured areas.

In the CAC-OS, an electron diffraction pattern that is obtained by irradiation with an electron beam with a probe diameter of 1 nm (also referred to as nanobeam electron beam) has regions with high luminance in a ring pattern and a plurality of bright spots appear in the ring-like pattern. Thus, it is found from the electron diffraction pattern that the crystal structure of the CAC-OS includes a nanocrystalline (nc) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the regions including $GaO_{X3}$ as a main component and the regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is generated. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments described in this specification as appropriate.

This application is based on Japanese Patent Application serial no. 2016-135870 filed with Japan Patent Office on Jul. 8, 2016, the entire contents of which are hereby incorporated by reference.

What is claimed is:

1. A display device comprising:

a first semiconductor layer;

a first insulating layer over the first semiconductor layer;

a first conductive layer over the first insulating layer;

a second insulating layer over the first conductive layer;

a second conductive layer over the second insulating layer;

a third insulating layer over the second conductive layer;

a second semiconductor layer over the third insulating layer;

a fourth insulating layer over the second semiconductor layer;

a third conductive layer over the fourth insulating layer;

a fifth insulating layer over the third conductive layer;

a fourth conductive layer over the fifth insulating layer;

a sixth insulating layer over the fourth conductive layer; and a fifth conductive layer over the sixth insulating layer, wherein the first semiconductor layer comprises a channel formation region of a first transistor, wherein the first insulating layer comprises a region as a gate insulating layer of the first transistor, wherein the first conductive layer comprises a region as a gate electrode of the first transistor, wherein the second insulating layer comprises a region as a first interlayer insulating layer, wherein the second conductive layer comprises a region as a first gate electrode of a second transistor, the first gate electrode being electrically connected to a source or a drain of the first transistor, wherein the third insulating layer comprises a region as a first gate insulating layer of the second transistor, wherein the second semiconductor layer comprises a channel formation region of the second transistor, wherein the fourth insulating layer comprises a region as a second gate insulating layer of the second transistor, wherein the third conductive layer comprises a region as a second gate electrode of the second transistor, wherein the fifth insulating layer comprises a region as a second interlayer insulating layer, wherein a source or a drain of the second transistor is electrically connected to the fifth conductive layer through the fourth conductive layer, wherein the sixth insulating layer comprises a resin, wherein the fifth conductive layer comprises a region as a pixel electrode of a light-emitting element, and wherein the third conductive layer is electrically connected to the second conductive layer.

2. The display device according to claim 1, wherein the fifth conductive layer comprises a conductive oxide.

3. The display device according to claim 1, wherein the third insulating layer comprises a silicon nitride.

4. The display device according to claim 1, wherein the second semiconductor layer comprises an oxide semiconductor.

5. A display device comprising:

a first semiconductor layer;

a first insulating layer over the first semiconductor layer;

a first conductive layer over the first insulating layer;

a second insulating layer over the first conductive layer;

a second conductive layer over the second insulating layer;

a third insulating layer over the second conductive layer;

a second semiconductor layer over the third insulating layer;

a fourth insulating layer over the second semiconductor layer;

a third conductive layer over the fourth insulating layer;

a fifth insulating layer over the third conductive layer;

a fourth conductive layer over the fifth insulating layer;

a sixth insulating layer over the fourth conductive layer; and a fifth conductive layer over the sixth insulating layer, wherein the first semiconductor layer comprises a channel formation region of a first transistor, wherein the first insulating layer comprises a region as a gate insulating layer of the first transistor, wherein the first conductive layer comprises a region as a gate electrode of the first transistor, wherein the second insulating layer comprises a region as a first interlayer insulating layer, wherein the second conductive layer comprises a region as a first gate electrode of a second transistor, the first gate electrode being electrically connected to a source or a drain of the first transistor, wherein the third insulating layer comprises a region as a first gate insulating layer of the second transistor, wherein the second semiconductor layer comprises a channel formation region of the second transistor, wherein the fourth insulating layer comprises a region as a second gate insulating layer of the second transistor, wherein the third conductive layer comprises a region as a second gate electrode of the second transistor, wherein the fifth insulating layer comprises a region as a second interlayer insulating layer, wherein a source or a drain of the second transistor is electrically connected to the fifth conductive layer through the fourth conductive layer, wherein the fifth conductive layer comprises a region as a pixel electrode of a light-emitting element, wherein the fifth conductive layer comprises a light-transmitting conductive material, and wherein the third conductive layer is electrically connected to the second conductive layer.

6. The display device according to claim 5, wherein the sixth insulating layer comprises a resin.

7. The display device according to claim 5, wherein the fifth conductive layer comprises a conductive oxide.

8. The display device according to claim 5, wherein the third insulating layer comprises a silicon nitride.

9. The display device according to claim 5, wherein the second semiconductor layer comprises an oxide semiconductor.

10. A display device comprising:

a first semiconductor layer;

a first insulating layer over the first semiconductor layer;

a first conductive layer over the first insulating layer;

a second insulating layer over the first conductive layer;

a second conductive layer over the second insulating layer;

a third insulating layer over the second conductive layer;

a second semiconductor layer over the third insulating layer;

a fourth insulating layer over the second semiconductor layer;

a third conductive layer over the fourth insulating layer;

a fifth insulating layer over the third conductive layer;

a fourth conductive layer over the fifth insulating layer;

a sixth insulating layer over the fourth conductive layer; and a fifth conductive layer over the sixth insulating layer, wherein the first semiconductor layer comprises a channel formation region of a first transistor, wherein the first insulating layer comprises a region as a gate insulating layer of the first transistor, wherein the first conductive layer comprises a region as a gate electrode of the first transistor, wherein the second insulating layer comprises a region as a first interlayer insulating layer, wherein the second conductive layer comprises a region as a first gate electrode of a second transistor, the first gate electrode being electrically connected to a source or a drain of the first transistor, wherein the third insulating layer comprises a region as a first gate insulating layer of the second transistor, wherein the second semiconductor layer comprises a channel formation region of the second transistor, wherein the fourth insulating layer comprises a region as a second gate insulating layer of the second transistor, wherein the third conductive layer comprises a region as a second gate electrode of the second transistor, wherein the third conductive layer is electrically connected to the second conductive layer, wherein the fifth insulating layer comprises a region as a second interlayer insulating layer, wherein the fourth conductive layer is electrically connected to a source or a drain of the second transistor through a contact hole in the fifth insulating layer, wherein the fifth conductive layer comprises a region as a pixel electrode of a light-emitting element, and wherein the fifth conductive layer is electrically connected to the fourth conductive layer through a contact hole in the sixth insulating layer.

11. The display device according to claim 10, wherein the sixth insulating layer comprises a resin.

12. The display device according to claim 10, wherein the fifth conductive layer comprises a conductive oxide.

13. The display device according to claim 10, wherein the third insulating layer comprises a silicon nitride.

14. The display device according to claim 10, wherein the second semiconductor layer comprises an oxide semiconductor.

* * * * *